United States Patent [19]
Komatsu et al.

[11] Patent Number: 6,025,115
[45] Date of Patent: *Feb. 15, 2000

[54] PROCESSING METHOD FOR ETCHING A SUBSTRATE

[75] Inventors: Toshiyuki Komatsu, Hiratsuka; Yasue Sato, Kawasaki; Shin-Ichi Kawate, Machida, all of Japan

[73] Assignee: Canon Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/429,288

[22] Filed: Apr. 25, 1995

Related U.S. Application Data

[62] Division of application No. 08/251,666, May 31, 1994, which is a continuation of application No. 07/764,939, Sep. 24, 1991, abandoned.

[30] Foreign Application Priority Data

| Sep. 26, 1990 | [JP] | Japan | 2-254196 |
| Sep. 27, 1990 | [JP] | Japan | 2-255148 |
| Sep. 29, 1990 | [JP] | Japan | 2-261670 |
| Oct. 5, 1990 | [JP] | Japan | 2-266461 |
| Nov. 19, 1990 | [JP] | Japan | 2-313589 |
| Nov. 19, 1990 | [JP] | Japan | 2-314951 |
| Nov. 19, 1990 | [JP] | Japan | 2-314953 |
| Nov. 19, 1990 | [JP] | Japan | 2-314954 |

[51] Int. Cl.$^7$ ........................................ G03F 7/00
[52] U.S. Cl. ........................ 430/313; 430/330; 430/396
[58] Field of Search .................... 430/311, 313, 430/317, 318, 323, 327, 329, 330, 396; 156/625.1, 628.1, 646.1; 216/41, 51, 58, 74

[56] References Cited

U.S. PATENT DOCUMENTS

| 3,326,717 | 6/1967 | Gregor et al. | 117/212 |
| 4,324,854 | 4/1982 | Beauchamp et al. | 430/296 |
| 4,612,085 | 9/1986 | Jelks et al. | 156/643 |
| 4,619,894 | 10/1986 | Bozler | 430/311 |
| 4,810,601 | 3/1989 | Allen | 430/313 |
| 4,845,529 | 7/1989 | Pearson | 369/125 |
| 5,344,522 | 9/1994 | Yagi et al. | 156/628 |
| 5,413,664 | 5/1995 | Yagi et al. | |

FOREIGN PATENT DOCUMENTS

| 0 204 538 | 12/1986 | European Pat. Off. . |
| 0 400 791 | 12/1990 | European Pat. Off. . |
| 0 429 070 | 5/1991 | European Pat. Off. . |
| 0 456 479 | 11/1991 | European Pat. Off. . |
| 1389506 | 1/1965 | France . |
| 2 548 218 | 1/1985 | France . |
| 56-164523 | 12/1980 | Japan . |
| 57-208142 | 12/1982 | Japan . |
| 58-039779 | 3/1983 | Japan . |
| 59-161038 | 9/1984 | Japan . |
| 59-194440 | 11/1984 | Japan . |
| 60-211074 | 10/1985 | Japan . |
| 61-029129 | 2/1986 | Japan . |
| 61-067228 | 4/1986 | Japan . |
| 61-258433 | 11/1986 | Japan . |
| 63-33569 | 2/1988 | Japan . |
| 63-165845 | 7/1988 | Japan . |
| 2-265240 | 10/1990 | Japan . |
| 2094720 | 9/1982 | United Kingdom . |
| WO 89/11553 | 11/1989 | WIPO . |

OTHER PUBLICATIONS

Sekine et al., Draft Collection of Lecturs in the 5th Dry Processing Symposium, 97 (1983).

R.A. Levy et al., "Characterization of LPCVD Aluminum for VLSI Processing" I. Electrochem. Soc., 131, 2175 (1984).

Electrchem. Soc., Draft Collections for 2d Symp. Jap. Branch, 75 (Jul. 7, 1989).

Research Reports XII on New Electronic Materials, Photoexcitation Processing Techniques Research Report 1, Jap. Electron. Indus. Symp. (Mar.1986).

M. Taneya et al., "Photo–oxidation of GaAs for in situ patterned–mask formation prior to chlorine gas etching", Applied Physics Letters, vol. 56, No. 1, pp. 98–100 (Jan. 1, 1990).

"Registerable Multilayer Mask Fabrication Technique," *IBM Technical Disclosure Bulletin*, vol. 27, No. 1B, pp. 686–688 (1984).

G. Auvert, et al. "Evidence of a photon effect during the visible laser–assisted deposition of polycrystalline silicon from silane," *Applied Physics Letters*, vol. 52, No. 13, pp. 1062–1064 (1988).

T. Jervis, et al., "Low Temperature Deposition by Laser Induced Breakdown in the Vapor Phase," *Extended Abstracts/Electrochemical Society*, vol. 87–2, Abst. No. 1144, pp. 1588 (1987).

K. Masu, et al., "Aluminum Deposition from Weekly–Excited Metalorganic Source by Hybrid–Excitation CVD," *Abst. of 20th Conf. on Solid State Devices and Materials*, pp. 573–576 (1988).

M. Taneya, et al. "Photo–oxidation of GaAs for in situ patterned–mask formation prior to chlorine gas etching," *Applied Physics Letters*, vol. 56, No. 1, pp. 98–100 (1990).

(List continued on next page.)

*Primary Examiner*—Kathleen Duda
*Attorney, Agent, or Firm*—Fitzpatrick, Cella, Harper & Scinto

[57] ABSTRACT

A processing method for etching a substrate is described. This method includes subjecting a surface of a substrate to be processed to selective irradiation with a light in a gas atmosphere to form a surface-modified layer. The substrate surface with the surface-modified layer is then annealed to stabilize and make the surface-modified layer more etch resistant. Both the stabilized surface-modified layer and a non-modified portion of the substrate are then subjected to dry etching, thereby utilizing the higher resistance to dry etching of the stabilized surface-modified layer compared to the non-modified portion to selectively etch the non-modified portion to a desired depth.

27 Claims, 33 Drawing Sheets

OTHER PUBLICATIONS

T. Urisu, et al., "Synchrotron radiation stimulated semiconductor processes: Chemical vapor deposition and etching," *Review of Scientific Instruments*, vol. 60, No. 7, pp. 2157–2159 (1989).
Patent Abstracts of Japan, JP 56–164523 (1981).
Patent Abstracts of Japan, JP 58–039779 (1983).
Patent Abstracts of Japan, JP 59–161038 (1984).
Patent Abstracts of Japan, JP 59–194440 (1984).
Patent Abstracts of Japan, JP 60–211074 (1985).
Patent Abstracts of Japan, JP 61–029129 (1986).
Patent Abstracts of Japan, JP 61–067228 (1986).
Patent Abstracts of Japan, JP 61–258433 (1986).
Patent Abstracts of Japan, JP 63–165845 (1988).
Patent Abstracts of Japan, JP 02–265240 (1990).
Van Ommen "Etch Rate Modification of $Si_3N_4$ Layers by Ion Bombardment and Annealing", J. Electrochem. Soc., 133(10), Oct. 1986, pp. 2140–2147.

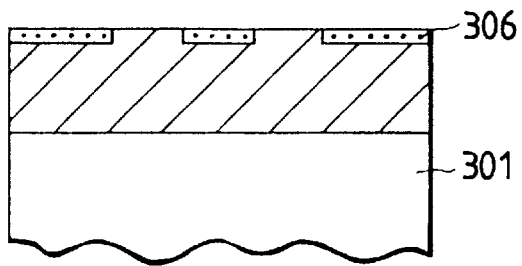
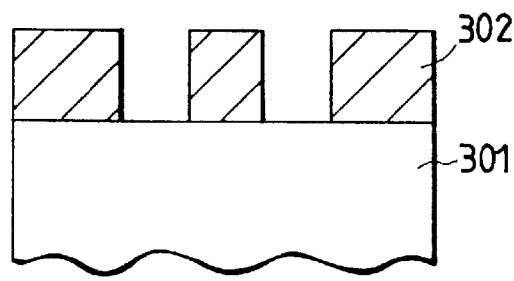
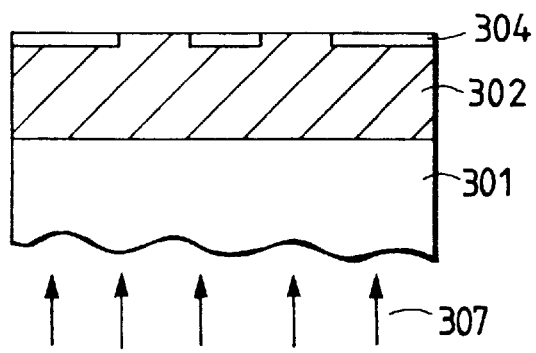

PROCESSING METHOD FOR ETCHING A SUBSTRATE

This application is a division of application Ser. No. 08/251,666 filed May 31, 1994, pending, which is a continuation of Ser. No. 07/764,939 filed Sep. 24, 1991, now abandoned.

BACKGROUND OF THE INVENTION

1. Field of the Invention

The present invention relates to a processing method and an apparatus usable for the method. More particularly it relates to a processing method that can apply the desired patterning to semiconductors, metals, insulators, etc., and an apparatus that can be used for such patterning.

2. Related Background Art

One of the important techniques in the fabrication of semiconductor devices is photolithography. In the photolithography, a complicated and cumbersome process comprising the steps of resist coating, pattern exposure, development, etching, resist removing, etc. has been in wide use.

In recent years, as typified by semiconductor memory devices, there is rapid progress in providing devices with a larger capacity and their functions with a higher performance. With such progress, circuit patterns are being made finer and the structure of circuits is becoming more complicated. As for display devices such as liquid-crystal display devices and plasma-display devices, they are being made larger in size and device functions thereof are being made more complicated. Fabrication of these devices by the use of the above processes may result in an increase in cost because of the processes that may be more complicated, and may bring about a decrease in yield because of an increase in generation of dust, thinly causing an increase in cost as a whole.

Thin-film devices are mainly fabricated by a process comprising the steps of forming on a substrate a thin film of a metal, a semiconductor, an insulator or the like, and finely processing the thin film to have the desired pattern. In recent years, as typified by semiconductor memory devices, there is rapid progress in providing devices with larger capacity and their functions with a higher performance. With such progress, circuit patterns are being made finer and the structure of circuits is becoming more complicated. As for display devices such as liquid-crystal display devices and plasma-display devices, they are being made larger in size and device functions thereof are being made more complicated. For this reason, film formation and also etching for applying fine processing, which had been carried out by a process making use of a solution, are now mainly carried out by what is called a dry process making use of plasma or excited gas in vacuum or in pressure-reduced gas. The photolithography commonly used for applying the desired fine processing, however, requires a complicated and cumbersome process comprising the steps of resist coating, pattern exposure, development, etching, resist removing, etc. Of these steps, the steps of resist coating, development and resist removing make use of solutions, and hence it is impossible for all the steps to be carried through a dry process. Accompanying these steps, the photolithography also requires a cleaning step or a drying step after the step of solution treatment, resulting in an increase in steps and making the process more complicated. The resist used in the above photolithography, when stripped, may become a source of dust, thus causing a decrease in yield and an increase in cost.

As a method of carrying out fine processing without use of such a resist, there is a method of carrying out fine processing by a process comprising the steps of selectively irradiating the surface of a film to be processed, with light in a modifying gas to form a surface-modified layer having thereon a pattern structure, and dry-etching a surface-unmodified layer, using the surface-modified layer as a protective film. This process makes it possible to carry out fine processing wherein all the steps are carried out through a dry process, without use of photolithography, and hence to promise a low cost and a high yield.

On the other hand, in place of the above photolithography making use of a resist, a photoetching technique is proposed which can form a pattern by a process wherein the complicated process has been greatly simplified, as disclosed in Sekine, Okano and Horiike, Draft Collections of Lectures in the 5th Dry Processing Symposium, page 97 (1983). This paper reports a process in which a substrate comprising a polysilicon (poly-Si) deposited thereon is placed in a reaction chamber into which chlorine gas has been introduced and the Si substrate is selectively irradiated with ultraviolet light through a mask, whereupon only the part irradiated with the ultraviolet light is etched and a pattern is formed on the poly-Si film. Use of this process makes it possible to omit the steps of resist coating, development and resist removing, to simplify the process, to improve the yield and to greatly reduce the cost. Use thereof also may cause no damage due to ion irradiation, which has been questioned in conventional reactive ion etching, and hence enables damage-free etching.

In this photoetching process, however, it is very difficult to perform fine processing faithful to a pattern because of the scattering or diffraction of light at the inside of processed grooves. In addition, in order to carry out perfect anisotropic etching, a side-wall protective film must be formed, and as a result this film may remain as a residue to have an ill influence on the device. In instances in which large-area display devices as exemplified by 14 inch liquid-crystal display devices are manufactured, the poly-Si is etched at a very low rate, which is 40 Å/min at most, as reported in the above Sekine et al.'s report. This is lower by the factor of about 2 figures than those in other etching processes. Moreover, under existing circumstances, the process can not reach the level of practical use at all even if an excimer laser having an output which is highest at present (about 100 W) is used as a light source, since the irradiation area is larger by the factor of $\sim 2 \times 10^4$ times than the conventional one. In addition, there has been the problem that a substance produced as a result of etching reaction may be deposited on the window through which the ultraviolet light is shed and hence the window must be cleaned often.

As stated above, a process has been proposed which is a method of carrying out fine processing by a process comprising the steps of selectively irradiating the surface of a film to be processed, with light in a modified gas to form a surface-modified layer having thereon a pattern structure, and dry-etching a surface-unmodified layer, using the surface-modified layer as a protective film (an etching mask). This process makes it possible to carry out fine processing without use of photolithography, and hence achieve an improvement in yield at a low cost. The process, however, often requires a long period of time or a strong light power at the time of the surface modification. If the processing is carried out for a short time or at a weak light power, the protective film formed by the surface modification can not be chemically strongly bonded or may be formed in an insufficient thickness, often bringing about an insufficient resistance of the protective film to give no desired etching depth.

Also when a film is selectively deposited on the surface-modified layer or the surface-unmodified layer by utilizing a difference in properties such as electron donative properties between the surface-modified layer formed by surface modification by the above selective light irradiation and the surface-unmodified layer, the difference in properties such as electron donative properties can not be sufficient if the protective layer formed by the surface modification is not chemically strongly bonded or formed in an insufficient thickness, so that no satisfactory selectivity may be obtained in the subsequent deposition.

In the method described above, aluminum is mainly used as a material for the electrodes or wiring of devices, where these electrodes and wiring have been conventionally formed by a method in which an aluminum film is deposited on the whole surface of a substrate and then etching is carried out to form the desired pattern. As a method of depositing the aluminum film, sputtering such as magnetron sputtering has been used. Since, however, the sputtering is commonly a physical deposition process which is based on the flying in vacuum, of particles sputtered from a target, the film may be formed having extremely small thickness at step portions or on insulating film side walls, resulting in a disconnection in an extreme instance. Non-uniformity in layer thickness or disconnection may cause the problem that the reliability of LSI is seriously lowered.

In order to solve the problems as discussed above, various types of CVD (chemical vapor deposition) processes are proposed. In such processes, a chemical reaction of a starting material gas is utilized in any form in the course of film formation. In the case of plasma CVD or photo-induced CVD, the starting material gas is decomposed in a gaseous phase, and an active species produced there further reacts on the substrate to cause film formation.

Since in these CVD processes the reaction takes place in a gaseous phase, the surface can be well covered irrespective of any surface irregularities on the substrate, but the carbon atoms contained in the starting gas molecules may be undesirably incorporated into the film. In particular, in the case of plasma CVD, there has been the problem that charged particles cause damage, what is called plasma damage, as is the case of sputtering.

In heat CVD, the reaction taking place mainly on the substrate surface causes a film to grow, and hence the surface can be well covered irrespective of any surface irregularities on the substrate. This can prevent disconnection at step portions or the like. This process is also free from the damage caused by charged particles that may be caused in plasma CVD or sputtering. Hence, the heat CVD has been studied from various approaches as a method of forming aluminum films. As a method of forming an aluminum film by commonly available heat CVD, a method is used in which an organic aluminum having been dispersed in a carrier gas is transported onto a heated substrate and gas molecules are thermally decomposed on the substrate to form a film. In an example disclosed, for example, in Journal of Electrochemical Society, Vol. 131, page 2175 (1984), triisobutyl aluminum [(i-$C_4H_9$)$_3$Al] (hereinafter "TIBA") is used as the organic aluminum and film formation is carried out at a temperature of 260° C. under a reaction tube pressure of 0.5 Torr to form a film of 3.4 $\mu\Omega\cdot$cm.

When the TIBA is used, no continuous film can be obtained unless a pretreatment is applied such that $TiCl_4$ is flowed before the film formation to activate the substrate surface so that nuclei can be formed. Including the instance where $TiCl_4$ is used, there is commonly a disadvantage that use of the TIBA may bring about a poor surface flatness. Japanese Patent Application Laid-open No. 63-33569 discloses a method in which no $TiCl_4$ is used and instead an organic aluminum is heated in the vicinity of a substrate to thereby form a film. In this instance, as clearly stated in the publication, it is necessary to provide a step of removing an oxide film naturally formed on the substrate surface. The publication also discloses that since the TIBA can be used alone, it is unnecessary to use a carrier gas other than TIBA but Ar gas may be used as the carrier gas. There, however, is no assumption as to the reaction of TIBA with another gas (e.g., $H_2$) and there is no disclosure as to the use of hydrogen as the carrier gas. The publication also mentions trimethyl aluminum (TMA) besides TIBA, but has no specific disclosure as to the gases other than them. This is due to the fact that any use of any organic metals must be individually studied since, in general, chemical properties of organic metals greatly change depending on slight changes in organic substituents attached to metal elements.

Electrochemical Society, Draft Collections for the 2nd Symposium, Japanese Branch, page 75 (Jul. 7, 1989) discloses a method concerning the formation of aluminum films by double-wall CVD method. In this method, an apparatus is so designed that the gas temperature becomes higher than the substrate temperature by the use of TIBA. This method has the disadvantages not only that it is difficult to control the difference between the gas temperature and the temperature on the substrate surface but also that bombs and conveying pipes must be heated. This method also has the problems such that no uniform continuous film can be obtained unless the film is made thick to a certain extent, the film has a poor flatness and the selectivity can not be maintained for a long period of time.

Etching of aluminum may bring about after-corrosion, i.e., the corrosion of aluminum that may be caused by HCl generated because of the use of a chlorine gas such as $Cl_2$ or $CCl_4$ as a result of reaction of $Cl_2$ or its reaction product such as $AlCl_3$ adhered during etching, with water remaining in the air or etching chamber. This corrosion is a great cause of the disconnection of wiring or electrodes.

Meanwhile, besides these techniques, there is a method making use of photo-induced CVD, in which the surface of a substrate is selectively irradiated with light-to cause photochemical reaction only on the irradiated surface so that a material can be selectively deposited thereon. Since, however, it is impossible to cause no reaction at all in the gaseous phase, the material may necessarily be deposited on the part other than the irradiated part. In addition, the photo-induced CVD commonly brings about slow deposition, where the rate of deposition is smaller by the factor of one figure than that of the heat CVD.

As semiconductor devices are made more highly integrated and made to have a higher performance, attention is also drawn to CVD, etching, surface modification, cleaning, etc. which utilize light irradiation. This is because such a process enables low-temperature processing and causes less damage, as is characteristic of a photo-process, and also because spatially selective processing has become indispensable for the process of fabricating semiconductor devices. Incidentally, a common process making use of photo-processing includes;

1) a process in which the surface of a substrate is irradiated with light in a reactive gas atmosphere to cause excitation and decomposition of the reactive gas to bring several kinds of gases into reaction (i.e., gaseous phase reaction), whereby a deposit is formed on the surface or the surface is etched or cleaned; and 2) a process in which the surface of a substrate is heated by light irradiation to cause the surface to thermochemically react with a reactive gas or irradiated with light to cause the surface to photochemically react with a reactive gas (i.e., interface reaction), whereby a deposit is formed on the surface or the surface is etched or cleaned.

The former process can be exemplified by a process in which the surface of a substrate is irradiated with a KrF excimer laser light in a gas atmosphere comprising $SiH_4$ and $O_2$, to cause $SiH_4$ and $O_2$ to react in the gaseous phase so that $SiO_2$ is deposited on the substrate. In this method, however, the reaction product may scatter at random in the gaseous phase and hence there is basically no spatial selectivity. As for the latter process, it can be exemplified by a process in which the substrate is etched in a $Cl_2$ gas atmosphere. Although no details of the reaction process have been elucidated in this method, it is presumed that the electrons excited on the surface irradiated with light are received by the chlorine atoms and incorporated into the Si substrate, in the state of which the reaction proceeds, and hence it is possible to cause the reaction only on the surface irradiated with light and therefor to effect spatially selective processing.

Of the above conventional thin-film device processing methods described above, the methods making use of photolithography have the problems of a decrease in yield and an increase in cost. The method making use of the photo-etching technique has the problem that it is impossible to perform fine processing faithful to a pattern because of the scattering or diffraction of light at the inside of processed grooves. In addition, in order to carry out perfect anisotropic etching, a side-wall protective film must be formed, and this film may remain as a residue to have a bad influence on the device. Moreover, the poly-Si is etched at a rate as low as about 40 Å/min, which is lower by the factor of 2 figures than those in other etching processes. In instances in which large-area display devices as exemplified by 14 inch liquid crystal display devices are manufactured, the irradiation area becomes larger by the factor of $\sim 2\times 10^4$ times than the experimental data, and hence the process can not reach the level of practical use at all even if an excimer laser with an output which is highest at present (about 100 W) is used as a light source. In addition, there has been the problem that, where the ultraviolet light having passed the mask is shed on the Si substrate through an ultraviolet irradiation window provided in the wall of the reaction chamber, a substance produced as a result of etching reaction may be deposited on this ultraviolet irradiation window and may absorb the ultraviolet light to cause a lowering of etching speed, and hence the ultraviolet irradiation window must be cleaned often with difficulty.

Of the above fine-processing methods used in thin-film devices, the method making use of photolithography requires use of a resist, which is stripped, and hence the method has been involved in the problem that the resist stripped comes out as dust and adheres to the surface of a substrate to cause a deterioration of the performance of devices and also to bring about a decrease in yield.

In the method in which the dry etching is carried out without use of the photolithography, manufacture at a low cost and in a high yield can be achieved, but no sufficiently high etching selectivity can be attained between the protective film serving as a mask in etching and the film to which the fine processing is to be applied. Thus there is the problem that if the protective film formed by surface modification carried out once has a small thickness, the protective film serving as a mask in dry etching may disappear and hence the etching of the film to which the fine processing is to be applied can not be in a sufficient amount (or depth).

As another problem, these photo-excitation processes discussed above leave some room for improvement for their better adaptation to semiconductor devices having been made more highly integrated and made to have a higher performance. One of the room of improvement is that a light-absorptive cross-sectional area or a light-reactive cross-sectional area is so small that the rate of processing is low. For example, in the photo-excitation etching of a silicon substrate, most papers report that the etching rate is approximately 100 to 2,000 Å/min (Research Reports XII on New Electronic Materials, Photo-excitation Processing Technique Research Report 1, Japan Electronic Industry Association, March 1986), which is an etching rate lower by the factor of about one figure than that in the conventional plasma etching. In infrared irradiation using a $CO_2$ laser or the like, the thermochemical reaction caused by the heating of the substrate is mainly utilized, and hence images may be blurred because of the diffusion of heat. This has sometimes caused a problem when the substrate surface must be processed in a good selectivity.

In the above photoetching, it is impossible to perform fine processing faithful to a pattern because of the scattering or diffraction of light at the inside of processed grooves. In addition, in order to carry out perfect anisotropic etching, a side-wall protective film must be formed, and this film may remain as a residue to have an ill influence on the device.

In instances in which large-area display devices as exemplified by 14 inch liquid-crystal display devices are manufactured, the poly-Si is etched at a very low rate, which is 40 Å/min at most, as reported in the Sekine et al.'s report. This is lower by the factor of about 2 figures than those in other etching processes. The process can not reach the level of practical use at all even if an excimer laser having an irradiation area which is larger by the factor of at least $2\times 10^4$ times and having an output which is highest at present (about 100 W) is used as a light source. In addition, there has been the problem that a substance produced as a result of etching reaction may be deposited on the ultraviolet irradiation window through which the ultraviolet light is passed, to cause a lowering of the etching rate, and hence the window must be cleaned often.

SUMMARY OF THE INVENTION

The present invention was made taking account of the above problems involved in the prior art. An object of the present invention is to materialize a processing method that can rapidly apply fine processing faithful to a pattern, and can improve the yield, and an apparatus that can be used for such a method.

Another object of the present invention is to materialize a processing method that can form in a sufficiently large thickness the protective film serving as a mask in dry etching and thereby can give a sufficient amount of etching.

Still another object of the present invention is to provide a method of, and an apparatus for, applying fine processing to semiconductor devices, that can accurately form a circuit pattern by the use of a simple process.

A further object of the present invention is to solve the problems that when the devices are fabricated by photolithography, not only the process is complicated resulting in an increase in cost but also dust is generated or increased to bring about a decrease in yield and to cause an overall increase in cost.

A still further object of the present invention is to propose a method capable of forming a protective film that can give a chemically well strong bond and have particles with a large diameter so as to have a strong etching resistance.

A still further object of the present invention is to provide a photo-processing method that enables high-rate processing, and a processing apparatus to which such a processing method can be applied.

A still further object of the present invention is to provide a photo-processing method that can process in an excellent selectivity the desired region on the substrate, and a processing apparatus to which such a processing method can be applied.

A still further object is to provide a semiconductor fabrication method, and a semiconductor fabrication apparatus, that can form an electrode or wiring in a high selectivity and in a good yield, by the use of aluminum which is a good conductor or a metal mainly composed of aluminum, without use of any resist.

BRIEF DESCRIPTION OF THE DRAWINGS

FIGS. 13A to 13G are diagrammatic cross sections to illustrate a fine-processing method of the present invention.

DESCRIPTION OF THE PREFERRED EMBODIMENTS

Figure 1A:
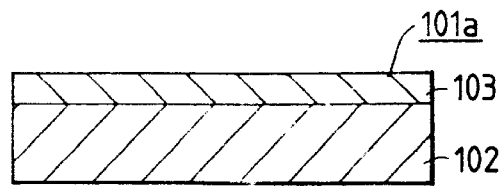
FIGS. 1A to 1D stepwise illustrate a procedure for pattern formation according to Example 1 of the present invention.

A first embodiment of the processing method of the present invention that can achieve the above objects comprises;

a first step of depositing on a substrate which is a specimen a film of any one of a semiconductor, a metal and an insulator;

a second step of subjecting the surface of the film deposited in the first step, to irradiation with a beam having a given energy to produce a physical damage on the surface;

a third step of subjecting the film surface on which the physical damage is produced in the second step, to selective irradiation with light to partially cause a photochemical reaction so that a mask pattern depending on the desired device structure is formed on the film surface; and a fourth step of carrying out photoetching using as a shielding member the mask pattern formed in the third step.

The apparatus used for the above method comprises;

a latent image forming chamber in which a specimen is selectively irradiated with light;

a modified layer forming chamber in which said specimen is irradiated with a beam having a given energy; and a photoetching chamber in which photoetching is carried out;

said modified layer forming the photoetching chamber and said photoetching chamber being connected with said latent image forming chamber through a gate valve.

According to this method, the beam irradiation in the second step produces a physical damage such as disconnection of bonds or generation of traps at the part extending from the surface of the deposited film to a given depth thereof. In the third step subsequently carried out, a mask pattern is formed utilizing photochemical reaction caused by the selective irradiation with light. Since the damage as described above has been formed in the surface of the film, the photochemical reaction is accelerated to give a uniform photochemical reaction. Hence, the device structure formed as the mask pattern can be made dense and the etching inhibitory power can be improved, so that the photoetching carried out in the fourth step can achieve a good fine-processing performance.

In the apparatus in which the modified layer forming chamber and the photoetching chamber are each connected with the latent image forming chamber through a gate valve, the specimen can be moved between the respective chambers without exposure of the specimen surface to the atmosphere, and hence it becomes possible to prevent deterioration of devices and adhesion of dust.

Another embodiment of the processing method of the present invention that can achieve the above objects comprises;

a first step of depositing on a substrate a film to be etched;

a second step of subjecting the film to be etched, to selective irradiation with light to form a protective film having a partially modified surface; and a third step of subjecting said film to be etched, to dry etching using said protective film as an etching mask;

wherein said first step and said second step are continuously carried out plural times to respectively deposit on said substrate said film to be etched and said protective film in plurality, and thereafter said third step is carried out.

According to this method, the protective film serving as an etching mask in dry etching is formed in plurality. The etching depth obtained by the etching corresponds to the total layer thickness of all the protective films, and hence controlling the number of the protective film to be formed enables control of the etching depth when the fine processing is applied.

Still another embodiment of the processing method of the present invention that can achieve the above objects comprises the steps of;

subjecting a surface to be processed, to selective irradiation with light in the desired gas atmosphere to form a surface-modified layer in the desired region; and subjecting said surface to be processed, to dry etching using said surface-modified layer as an etching mask;

wherein said surface-modified layer is annealed before the step of said etching.

According to this method, a substrate surface to be processed is selectively irradiated with light in the desired gas atmosphere to form a surface-modified layer having the desired pattern on the surface to be processed, and then the surface to be processed on which no surface-modified layer is formed is dry-etched using the surface-modified layer as a protective film (a resist). This makes it possible to carry out fine processing without use of photolithography and to promise a high yield at a low cost.

In some instances, the etching selectivity of the surface (film) to which the fine processing should be applied is not sufficiently high with respect to the protective film serving as a mask in etching or a protective film formed by surface modification is not chemically strongly bonded or comprises particles with a small diameter where the fine processing should be applied in a greater depth. In such instances, resistance to etching may become short to make the protective film have an insufficient resistance. The present invention, however, proposes a processing method in which the protective film chemically strongly bonded, having particles with a large diameter, being stable and firm and having a high etching resistance is formed so that the above requirements can be well satisfied.

In other words, the present invention gives a protective film with a high etching resistance, formed by subjecting a surface-modified layer formed in the desired gas atmosphere to irradiation with electromagnetic waves such as laser beams, electron beams and light or by heating a surface-modified layer, or by carrying out both in combination, so that not only the problems hitherto involved can be eliminated but also the above requirements can be satisfied.

As described above, the annealing of the surface-modified layer serving as a protective film (a mask) in etching makes it possible to form a protective film of a high etching resistance chemically strongly bonded because of increased particle diameter accelerated crystallization, or decrease of dangling bonds or bonding with impurities to approach the stoichiometric ratios in the solid phase of the surface-modified layer. As a result, it becomes possible to obtain the desired amount (depth) of etching of the film to which the fine processing should be applied.

As a result of intensive studies made taking account of the problems involved in the prior art as previously discussed, the processing method of the present invention can form a protective film with a chemically well strong bond, with a well large thickness and with a high etching resistance, compared with the prior art. An embodiment of such a processing method of the present invention that can achieve the above objects comprises the steps of;

subjecting a surface to be processed, to selective irradiation with light in the desired gas atmosphere to form a surface-modified layer in the desired region; and applying selective processing to said surface-modified layer or the surface-unmodified layer;

wherein said surface to be processed is heated in the step of forming said surface-modified layer.

The processing apparatus that can achieve the above objects comprises a reaction vessel, gas feeding means for feeding a reactive gas into said reaction vessel, and light guiding means for guiding processing light into said reaction vessel, a substrate placed in said reaction vessel being irradiated with said processing light so that the surface to be processed is processed;

wherein said apparatus is provided with means for selectively heating said surface to be processed.

According to this method, the heating of the film to which surface modification is applied, in the step of forming the surface-modified layer, accelerates photochemical reaction on the surface irradiated with light, and hence the surface-modified layer can have a chemically stronger bond and also have a greater thickness. This can achieve i) an improvement in etching resistance of the surface-modified layer and ii) an increase in difference in electron donative properties between the surface-modified layer and the unmodified layer. The surface-modified layer having been formed may be further heated, whereby the surface-modified layer can be converted to a region with a stable resistance. This enables pattern formation with ease.

The processing method that can achieve the above objects may also comprise the steps of;

introducing into a reaction vessel a reactive gas and a processing light that brings the reactive gas into excitation; and processing with the excited reactive gas the surface of a substrate placed in said reaction vessel;

wherein said surface of the substrate is simultaneously irradiated with light generated by a first light-generation means that causes vibration of the molecules constituting said surface of the substrate and light generated by a second light-generation means that causes photochemical reaction of said reactive gas with said surface of the substrate, to process said substrate.

The processing apparatus that can achieve the above objects may also comprise a reaction vessel, a gas feeding means for feeding a reactive gas into said reaction vessel, and a light guiding means for guiding processing light into said reaction vessel, said reactive gas being brought into excitation with said processing light to process the surface of a substrate placed in said reaction vessel;

wherein said apparatus comprises;

a first light-generating means for generating light that excites vibration of the molecules constituting said surface of the substrate;

a second light-generating means for generating light that causes photochemical reaction of said reactive gas with said surface of the substrate; and an irradiating means that simultaneously irradiates said surface of the substrate with the light generated by said first light-generating means and the light generated by said second light-generating means.

According to the above method, the simultaneous irradiation on the substrate with the light that excites vibration of the molecules constituting said surface of the substrate and the light that causes the photochemical reaction accelerates the reaction of the surface with the reactive gas. This makes it possible to process the substrate at a high rate. Since the photochemical reaction can be made to selectively take place on the surface irradiated with the processing light, it is also possible to carry out the desired processing in a good selectivity.

Still another embodiment of the processing method of the present invention that can achieve the above objects comprises the steps of;

subjecting in a modifying gas atmosphere the surface of a substrate to selective irradiation with light that has an energy greater than a binding energy of a compound constituting said surface of the substrate and is capable of reducing said compound, to form on said surface of the substrate a surface-modified layer having a pattern structure constituted of a reduced product; and etching the surface-unmodified layer using said surface-modified layer as a protective film.

The apparatus that can achieve the above objects may also comprise;

a surface photo-processing zone comprising a first reaction vessel, a light guiding means for guiding processing light into said first reaction vessel and an evacuating means for evacuating the inside of said first reaction vessel, wherein the surface of a substrate placed in said first reaction vessel is irradiated with said processing light to form thereon a surface-modified layer; and an etching zone comprising a second reaction vessel, a reactive gas feeding means for feeding a reactive gas into said second reaction vessel and an energy supplying means for supplying an energy for generating plasma in said second reaction vessel, wherein the surface-unmodified layer is etched using said surface-modified layer as a mask, said processing light having an energy greater than a binding energy of a compound constituting said surface of the substrate and capable of reducing said compound.

According to the above method, the compound constituting the surface of the substrate is selectively reduced to form the surface-modified layer, and the surface-unmodified layer is etched using the surface-modified layer as a protective film. Hence it becomes possible to carry out high-speed anisotropic fine processing without use of any resist.

When the above method is used, the substrate is irradiated with light in a high vacuum, and hence it is possible to prevent contamination of a light irradiation window.

The processing method of the present invention that can achieve the above objects may also comprise the steps of;

subjecting the surface of a semiconductor substrate or the surface of a substrate formed of a semiconductor, a metal or an insulator, to selective irradiation with a synchrotron orbit radiation so that electron donative properties of the surface are changed to give the desired pattern; and selectively depositing a metal film on the surface endowed with said electron donative properties.

The apparatus used for carrying out this method is an apparatus for fabricating a semiconductor device, capable of carrying out all the steps for fabricating a semiconductor device in a series of vacuum vessels that can be evacuated, which comprises;

a load lock chamber in which a specimen is brought under reduced pressure or brought back under atmospheric pressure;

a film forming chamber that can be vacuum-sealed;

an etching chamber that can be vacuum-sealed;

a latent image forming chamber in which surface photo-modification is carried out, that can be vacuum-sealed and has a light incident window;

a metal-film depositing chamber in which a metal film is selectively deposited, that can be vacuum-sealed;

a cleaning chamber in which the surface of the substrate is washed, that can be vacuum-sealed; and a vacuum gate valve through which adjoiningly located chambers of said chambers are connected with each other.

In the above method, as an additional characteristic feature, the step of selectively depositing a metal may be carried out by a chemical gaseous phase growth process making utilization of an alkylaluminum hydride and hydrogen. The alkylaluminum hydride may preferably be dimethylaluminum hydride.

In a more specific embodiment, the surface of a substrate formed of a semiconductor, a metal or an insulator is selectively irradiated with a synchrotron orbit radiation in a reactive gas atmosphere to photochemically change the properties of the irradiated surface (formation of a latent image layer), thereby to change electron donative properties of the surface. Then a gas comprising the alkylaluminum hydride is fed to the surface so that an aluminum film or a metal film mainly composed of aluminum is selectively formed only on the electron-donative surface. An electrode or wiring can be thus formed.

According to the above method, the synchrotron orbit radiation is continuous light having a very broad wavelength region, ranging from X-rays to infrared rays, and hence the wavelength can be selected without changing a light source with changes of films to be irradiated. In addition, since the electrode or wiring can be formed without use of any resist at all, the process can be simplified and the dust that may be otherwise caused by a stripped resist is not produced. Moreover, since no etching step is required, no after-corrosion occurs, bringing about an improvement in the performance and yield of devices. Furthermore, since the aluminum or the metal mainly composed of aluminum is deposited by heat CVD, films with a good quality and good surface covering properties can be formed by deposition at a high rate.

The processing method of the present invention that can achieve the above objects may also comprise the steps of;

subjecting the surface of a substrate to selective irradiation with light after the desired circuit pattern in an atmosphere of a modifying gas capable of modifying the surface, while maintaining the temperature of said surface of the substrate to a given temperature range within which a pressure of said modifying gas reaches a saturated vapor pressure, to form on said surface of the substrate a surface-modified layer having a pattern structure; and etching the surface-unmodified layer using said surface-modified layer as a protective film.

The processing method may also include;

those wherein, in the step of forming the surface-modified layer, the substrate surface is oxidized to form a surface-oxidation-modified layer;

those wherein, in the step of forming the surface-modified layer, the substrate surface is nitrided to form a surface-nitridation-modified layer; and those wherein, in the step of etching, the etching is effected at an etching selection ratio larger than the ratio of the thickness of the surface-unmodified layer to the thickness of the surface-modified layer.

The processing method may also further comprise the step of cleaning the surface of the substrate before the step of forming the surface-modified layer.

The processing apparatus of the present invention that can achieve the above objects may also be a fine-processing apparatus comprising a light source, a latent image forming chamber in which the surface of a substrate is irradiated with light emitted from said light source to form a surface-modified layer on said surface of the substrate, and an etching chamber in which said surface of the substrate is etched, wherein;

said apparatus further comprises an evacuating means capable of evacuating each of said latent image forming chamber and said etching chamber to a given pressure;

said latent image forming chamber comprises a modifying gas feeding means for feeding into said latent image forming chamber a modifying gas capable of modifying the surface of the substrate, a holder that holds said substrate and is provided with a temperature controlling means capable of controlling the temperature of said substrate to a temperature at which a pressure of said modifying gas in said latent image forming chamber reaches a saturated vapor pressure of said modifying gas, and an optical system for selectively irradiating said surface of the substrate with light of said light source after the desired circuit pattern; and said etching chamber comprises a holder that holds the substrate on which said surface-modified layer is formed, and an etching gas feeding means for supplying to said surface of the substrate an etching gas that etches the surface-unmodified layer using said surface-modified layer as a protective film.

This apparatus may also be those wherein;

said latent image forming chamber and said etching chamber are connected with each other through a gate valve through which said substrate can be transported;

said optical system provided in said latent image forming chamber comprises a mask on which a mask pattern has been formed after the circuit pattern so that the surface of the substrate is irradiated with the light of said light source through said mask to form a mask pattern image on said surface of the substrate;

said modifying gas feeding means is provided with a gas excitation means that excites the modifying gas and supplies the resulting active species to the surface of the substrate;

said etching gas feeding means is provided with a plasma generation means that makes the etching gas into plasma and supplies the plasma to the surface of the substrate;

said etching gas feeding means excites the etching gas and supplies the resulting active species to the surface of the substrate; and a cleaning chamber comprising a holder that holds the substrate and a cleaning gas feeding means that excites a cleaning gas for washing the surface of said substrate or makes the gas into plasma and supplies the excited gas or the plasma to the surface of said substrate, is further connected with said latent image forming chamber through a gate valve through which said substrate can be transported.

As a matter of course, these additional modes can be used independently or in appropriate combination.

In the above processing method, the modifying gas is brought into the state that the vaporization and solidification are balanced on the surface of the substrate while maintaining the temperature of the substrate to a temperature at which a pressure of the modifying gas atmosphere reaches a saturated vapor pressure of the modifying gas, so that the molecules of the modifying gas can be adsorbed to the substate surface efficiently. The selective irradiation of the substrate surface adsorbed with the modifying gas molecules with light after the circuit pattern causes photochemical reaction at the part irradiated with light, so that the surface-modified layer after the circuit pattern is formed. The etching is then effected using the surface-modified layer as a protective film, so that the surface-unmodified part except the surface-modified layer is removed on the substrate surface and thus the surface-modified layer remains as a pattern.

In the above apparatus of the present invention, the modifying gas is supplied into the latent image forming chamber, where the modifying gas in the latent image forming chamber is maintained to a given pressure and the temperature of the substrate is so controlled that this pressure reaches a saturated vapor pressure of the modifying gas. Thus the molecules of the modifying gas are adsorbed on the substrate surface. The resulting substrate surface is selectively irradiated with light after the circuit pattern, thereby causing the photochemical reaction to form the surface-modified layer after the circuit pattern. Subsequently, the substrate on which the surface-modified layer has been formed is moved to the etching chamber and the substrate surface is exposed to the etching gas having been excited or made into plasma, so that the surface-unmodified part is removed from the substrate surface and the surface-modified layer remains as a pattern. Since the above latent image forming chamber and etching chamber are connected through the gate valve, the substrate can be transported without its exposure to the atmosphere. In the instance where the apparatus is provided with the cleaning chamber connected with the latent image forming chamber, the substrate on which the pattern is to be formed can be washed. In addition, since the cleaning chamber and the latent image forming chamber are connected through the gate valve, the pattern formation on the substrate can be made to proceed in a clean state without adhesion of dust or the like, after the cleaning has been carried out.

EXAMPLES

Examples of the present invention will be described below with reference to the accompanying drawings.

Example 1

Figure 1B:
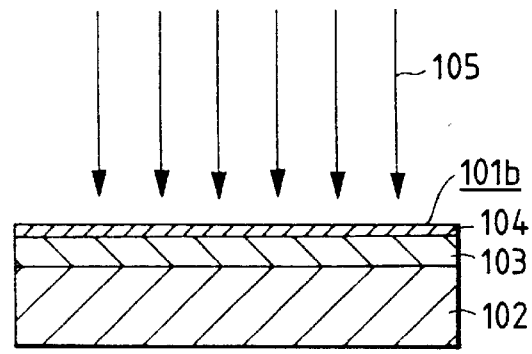
Figure 1C:
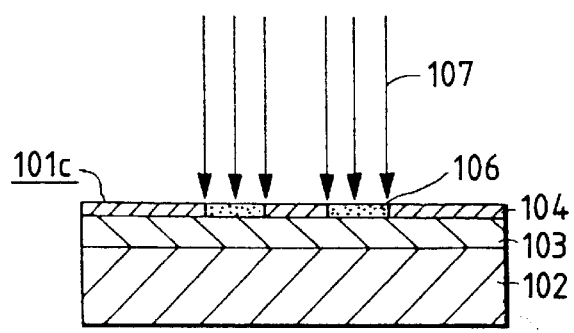
Figure 1D:
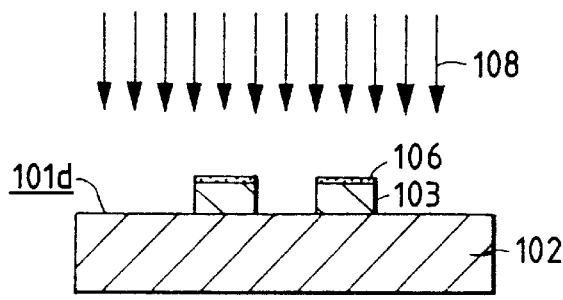

FIGS. 1A to 1D are diagrammatic cross sections to stepwise illustrate a procedure for pattern formation according to the first embodiment of the processing method of the present invention. The procedure will be described in order of the drawings that start from FIG. 1A. Reference numeral 101a denotes a sample, comprising a 3,000 Å thick amorphous silicon nitride (a-SiN) film 103 formed a quartz glass substrate 102 by plasma CVD (FIG. 1A). The sample 101a shown in FIG. 1A is irradiated thereon with beams 105 of argon ions ($Ar^+$) and thereby a surface-modified layer 104 having sustained damage due to the argon ions is formed on the surface of the a-SiN film 103 to give a sample 101b (FIG. 1B). Next, the sample 101b is irradiated with KrF excimer laser light 107, so that a latent image layer 106 is formed in the surface-modified layer 104 to give a sample 101c (FIG. 1C). Subsequently, the sample is etched with chlorine plasma streams 108 by use of the latent image layer 106 as a mask, and thus a sample 101d having the desired pattern form can be obtained (FIG. 1D).

Figure 2:
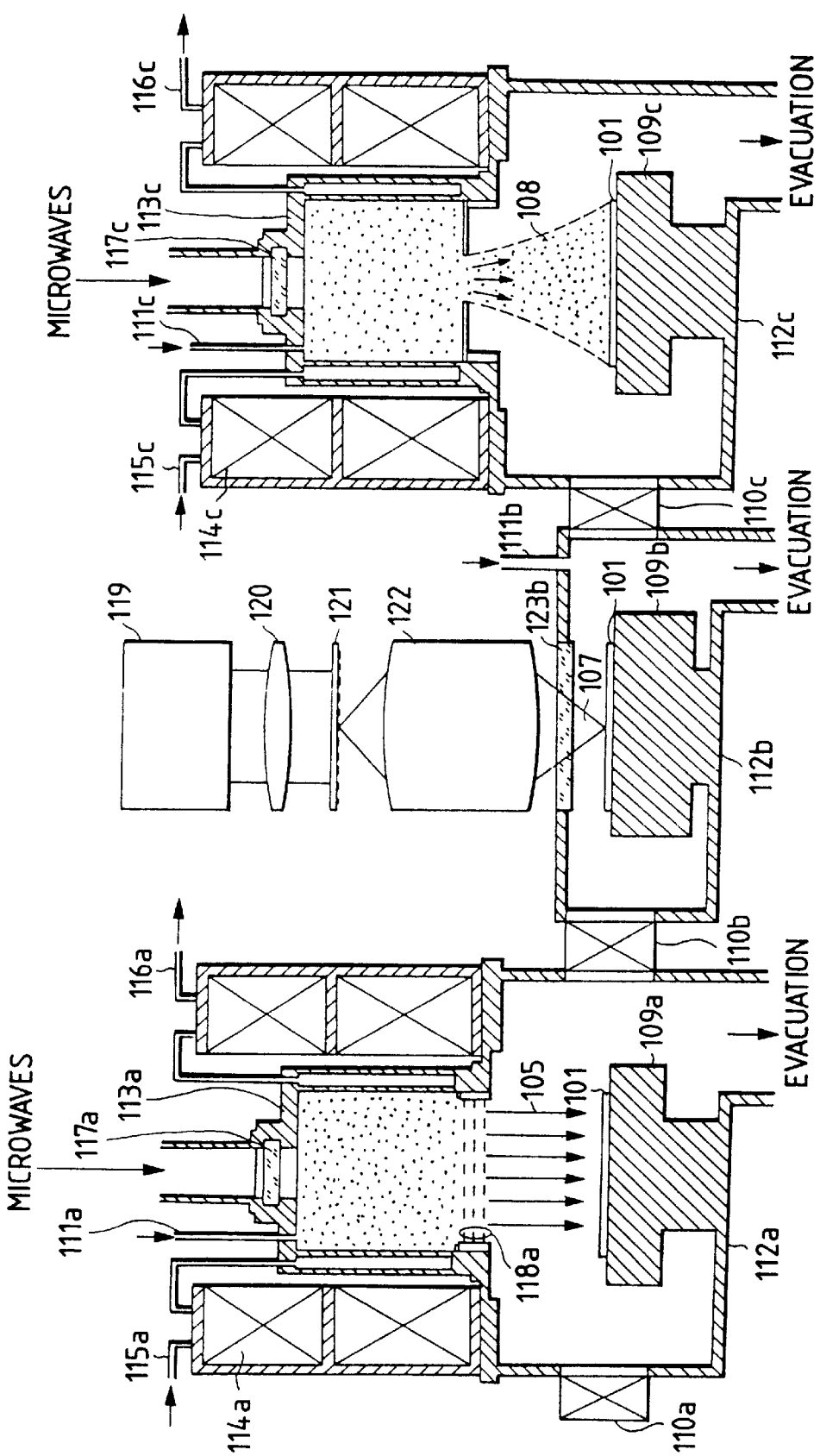
FIG. 2 cross-sectionally illustrates the constitution of an apparatus for fabricating a device according to the procedure shown in FIGS. 1A to 1D.

FIG. 2 is a diagrammatic cross section to illustrate the constitution of an apparatus for carrying out the above procedure of fabrication. This apparatus is provided with a latent image forming chamber 112b positioned at the middle as shown in the drawing, a surface-modified layer forming chamber 112a (left side in the drawing) serving as a processing chamber, and an etching chamber 112c (right side in the drawing). In the surface-modified layer forming chamber 112a, a surface-modified layer is formed on the surface of the sample. In the latent image forming chamber 112b, a latent image is formed on the surface-modified layer formed on the surface of the sample in the surface-modified layer forming chamber 112a. In the etching chamber 112c, the sample is etched. The surface-modified layer forming chamber 112a and latent image forming chamber 112b, and the latent image forming chamber 112b and etching chamber 112c, are connected with each other through a gate valve 110b and a gate valve 110c, respectively. The surface-modified layer forming chamber 112a is provided with a gate valve 110a through which the sample 101a is put in or out from the outside, and transport means (not shown) for transporting the sample 101a to 101c between adjoining chambers are provided through the respective gate valves 110a, 110b and 110c. Thus, the sample 101 can be moved through each chamber without its exposure to the atmosphere, and hence it becomes possible to prevent adhesion of dust to the sample 101 or concurrent deterioration of the device.

In the following, to describe the constitution of each chamber, the letter symbol a, as a rule, will be attached to the end of the reference numeral for the members that constitute the surface-modified layer forming chamber 112a; b, for the members that constitute the latent image forming chamber 112b; and c, for the members that constitute the etching chamber 112c. In the drawing, reference numerals 109a, 109b and 109c denote sample holders that hold the sample 101; 111a, 111b and 111c, gas inlets from which processing gases are fed to the respective processing chambers; 113a and 113c, plasma chambers in which the plasma of modifying gas or etching gas, respectively, is generated; 114a and 114c, magnetic coils for producing magnetic fields inside the plasma chambers 113a and 113c, respectively; 115a and 115c, cooling water inlets from which cooling water for cooling the magnetic coils 114a and 114c and the plasma chambers 113a and 113c, respectively; 116a and 116c, cooling water outlets; 117a and 117c, microwave transmission windows through which microwaves are supplied to the plasma chambers 113a and 113c, respectively; 118a, a group of electrodes for withdrawing ions from the plasma generated in the plasma chamber 113a to accelerate them into the desired energy; 119, a KrF excimer laser serving as a light source; 120, an illumination optical system for illuminating a mask comprised of a quartz plate (or a reticle) patterned with Cr; 122, a projection optical system for forming an image of the mask pattern on the surface of the sample 101; and 123b, a window made of quartz, through which the light having come out of the projection optical system 122 is led into the latent image forming chamber 112b.

An example of the procedure of pattern formation using the apparatus shown in FIG. 2 will be described below.

First, a method of forming the surface-modified layer 104 by irradiation with the argon beams 105 on the surface of the a-SiN film 103 as shown in FIG. 1B will be described. The sample 101a was fed into the aforesaid surface-modified layer forming chamber 112a through the gate valve 110a and placed on the sample holder 109a. Then a vacuum exhaust system (not shown) was operated to evacuate the insides of the surface-modified layer forming chamber 112a and plasma chamber 113a to $10^{-8}$ Torr or less. Subsequently, argon gas was fed from the gas inlet 111a to the plasma chamber 113a at a flow rate of 20 sccm, and the above vacuum exhaust system was so operated as for the pressure of the inside to be adjusted to $2\times10^{-4}$ Torr. Next, in order to cool the magnet coil 114a and the plasma chamber 113a, the cooling water was flowed in from the cooling water inlet 115a and flowed out from the cooling water outlet 116a. The magnetic coil 114a was electrified to produce a magnetic field in the plasma chamber 113a, and at the same time the microwaves of 2.45 GHz and 800 W produced in a microwave generator (not shown) were propagated using a waveguide to supply them to the plasma chamber 113a through the microwave transmission window 117a. As a result, in the plasma chamber 113a, the electric field of the microwaves and the magnetic field produced by the magnetic coil 114a accelerated electrons in a good efficiency to cause ionization of neutrons, so that dense argon plasma was generated. The plasma was generated in a better efficiency when the size of the magnetic field was kept to the size of a magnetic field that caused electronic cyclotron resonance (875 Gauss in the case of 2.45 GHz microwaves; magnetic coil current: 154 A). Next, controlling the voltage applied to the group of electrodes 118a, $Ar^+$ ions were withdrawn from the plasma generated in the plasma chamber 113a and were accelerated to an energy of 1 keV. Ion current density at this time was 1 mA/cm$^2$. With beams of $Ar^+$ ion beams thus withdrawn, the a-SiN film 103 of the sample 101a was irradiated on its whole surface for 2 minutes. After irradiation with the argon beams, the surface-modified layer 104 was formed in which the damage such as break of a-SiN bonds or occurrence of traps was produced in a depth of about 30 Å from the surface. The sample 101b was thus obtained. After completion of this processing, the gas supply was stopped, and the inside of the surface-modified layer forming chamber 112a was evacuated to give a pressure of $10^{-8}$ Torr or less.

Next, the latent image forming step as shown in FIG. 1C was carried out, i.e., the step of selectively irradiating the surface of the surface-modified layer 104 of the sample 101b with the laser light 107, thereby causing photochemical reaction only at the part irradiated with the laser light 107 to modify the surface to form a pattern. The latent image forming chamber 112b was previously evacuated to $10^{-8}$ Torr or less by means of a vacuum exhaust system (not shown). Then the gate valve 110b was opened, and the sample 101b was transported from the surface-modified layer forming chamber 112a to the latent image forming chamber 112b and placed on the sample holder 109b. Thereafter, the gate valve 110b was closed, and the latent image forming chamber 112b was again evacuated to $10^{-8}$ Torr or less. Subsequently, $O_2$ gas was fed from the gas inlet 111b into the latent image forming chamber 112b, and the vacuum exhaust system was operated so as for the pressure in the inside to be adjusted to 200 Torr.

Next, with the laser light 107 of 248 nm in wavelength, radiated by means of the KrF excimer laser serving as the light source 119, the mask 121 to which the desired pattern had been applied was uniformly irradiated through the illumination optical system 120, and then, with the light transmitted through the mask 121, the surface of the sample 101 was irradiated through the projection optical system 122 and the window 123b to form on the surface of the sample 101 an image of the pattern formed on the mask 121. As a material for the window 123b, a quartz plate was used so that the laser light 107 with an wavelength of 248 nm was transmitted without being absorbed. On the surface of the surface-modified layer 104 on which the mask image had been formed, the photochemical reaction of $O_2$ with a-SiN took place only at the part irradiated with the laser light 107, so that upon exposure for 5 minutes the surface-modified layer 104 was patternwise changed into the latent image layer 106, i.e., an $SiO_2$ layer. The sample 101c was thus obtained. Since in the present example the surface-modified layer 104 was previously formed, the photochemical reaction was accelerated to cause uniform photochemical reaction, and hence the latent image layer 106 with densness and a high etching inhibitory power was formed. At the part not irradiated with the laser light 107, this reaction did not proceed, and thus a negative pattern of the mask 121, comprised of the latent image layer 106, was formed on the surface of the a-SiN film 103. In other words, a latent image wherein a-SiN was modified to $SiO_2$ was formed. The depth of the latent image layer 106 was equal to the depth of the surface-modified layer 104, and the reaction did not proceed beyond that depth.

After the latent image layer 106 was formed, the supply of $O_2$ gas was stopped, and then the inside of the modifying chamber 112a was evacuated to give a pressure of $10^{-8}$ Torr or less.

Next, the etching step as shown in FIG. 1D was carried out, i.e., the step of etching away the part other than the latent image layer 106 formed in the precedent step, using this layer as a mask. The insides of the etching chamber 112c and plasma chamber 113c were previously evacuated to $10^{-8}$ Torr or less by means of a vacuum exhaust system (not shown). Then the gate valve 110c was opened, and the sample 101c was transported from the latent image forming chamber 112b to the etching chamber 112c and placed on the sample holder 109c. Thereafter, the gate valve 110c was closed, and the insides of the etching chamber 112c and plasma chamber 113c were again evacuated to $10^{-8}$ Torr or less. Subsequently, $Cl_2$ gas was fed from the gas inlet 111c into the plasma chamber 113c, and the vacuum exhaust system was operated so as for the pressure in the inside to be adjusted to $5\times10^{-4}$ Torr. In order to cool the magnet coil 114c and the plasma chamber 113c, the cooling water was flowed in from the cooling water inlet 115c and flowed out from the cooling water outlet 116c. The magnetic coil 114c was electrified at 154 A to produce a magnetic field of 875 Gauss in the plasma chamber 113c, and also the microwaves of 2.45 GHz and 400 W generated in a microwave generator (not shown) were propagated using a waveguide to supply them to the plasma chamber 113c through the microwave transmission window 117c. As a result, in the plasma chamber 113c, chlorine plasma was generated in the same way as the argon plasma previously described. The chlorine plasma thus generated was accelerated by a scattering magnetic field in the direction of the magnetic line of force, and made into a chlorine plasma flow 108, with which the sample 101 was irradiated. The $Cl^+$ ions in the plasma were accelerated by floating potential (10 to 20 V) produced between the sample 101 and the plasma, and they collided against the surfaces of the surface-modified layer 104 and latent image layer 106, so that only the surface-modified layer 104 and the a-SiN film 103 beneath it were etched by the excited Cl or $Cl_2$. The sample 101d was thus obtained. The selectivity ratio (a-SiN/$SiO_2$) representing the ratio of etching rate for the a-SiN constituting the surface-modified layer 104 and the $SiO_2$ constituting the latent image layer 106 was about 150, and hence the etching of the a-SiN film 103 was completed before the latent image layer 106 serving as a masking member was removed. Since, in this etching, the pressure was as low as $10^{-4}$ Torr, the mean free path of the ions became ~8 cm, which was very larger than that of an ion sheath (~0.1 mm). Thus, ions with a good vertical linearity were made incident on the surface of the a-SiN film 103, and hence it was possible to effect fine processing ($\geq 0.5$ $\mu$m) in a good anisotropy.

In the example described above, the surface-modified layer 104 was formed by generating ion beams with uniform energy using the plasma chamber 113a, and irradiating the sample with such beams. It, however, was also possible to form the surface-modified layer 104 by using ions having a broad energy distribution, contained in plasma produced by high-frequency discharging making use of parallel tabular electrodes.

Figure 3:
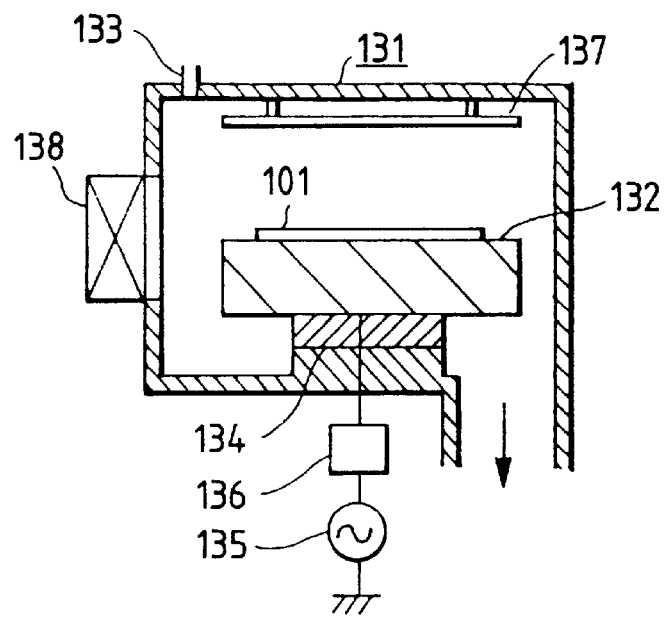
FIGS. 3 and 4 cross-sectionally illustrate the constitution of other examples of a surface-modified layer forming chamber 112a and an etching chamber 112c, respectively, shown in FIG. 2.

FIG. 3 is a cross section to schematically illustrate an example of the constitution of the surface-modified layer forming chamber 131 wherein the surface-modified layer 104 is formed by such ions having a broad energy distribution. The gate valve that connects this chamber with the latent image forming chamber is not shown in this drawing. In FIG. 3, reference numeral 132 denotes a sample holder; 133, a gas inlet; 134, an insulator for insulating the sample holder 132 and the surface-modified layer forming chamber 131 in the direction of direct currents; 135, a high-frequency power source of 13.56 MHz and 800 W; 136, a matching box for securing impedance matching on the side of the sample holder 132 and the side of the high-frequency power source 135; 137, an opposing electrode that opposes the sample holder 132; and 138, a gate valve.

How to operate the formation of the surface-modified layer 104 will be described. The aforesaid sample 101 was placed on the sample holder 132 through the gate valve 138, and the inside of the surface-modified layer forming chamber 131 was evacuated to a pressure of $10^{-8}$ or less by means of a vacuum exhaust system (not shown). Next, Ar was fed at a flow rate of 50 sccm into the surface-modified layer forming chamber 131 from the gas inlet 133, and the vacuum exhaust system was operated so as for the pressure inside the surface-modified layer forming chamber 131 to be adjusted to 0.08 Torr. Next, a high frequency of 13.56 MHz and 800 W was applied to the sample holder 132 while making adjustment of the matching box 136, to generate plasma in the space between the sample holder 132 and the opposing electrode 137. Since the sample holder 132 was insulated from the surface-modified layer forming chamber 131 in the direction of direct currents, a negative DC bias voltage of about −1 kV was generated between the sample holder 132 and the opposing electrode 137 because of the difference in mobility between electrons and ions. Because of this voltage, Ar ions were accelerated and they collided against the surface of the a-SiN film 103, so that the damage was produced on the surface of the a-SiN film 103, where the surface-modified layer 104 was formed. The energy of the ions was about 1 keV at maximum, and was distributed over a wide range lower than that. Hence, although it was not a single energy, the same effect as stated in regard to the surface-modified layer forming chamber 112a shown in FIG. 2 was obtained. In this instance, the processing was carried out for 5 minutes. After completion of the processing, the gas supply was stopped, and the inside of the surface-modified layer forming chamber 131 was evacuated to a pressure of $10^{-8}$ Torr. Thereafter it was possible to carry out the latent image formation and the etching in the same way.

In this example, the KrF excimer laser light with a wavelength of 248 nm was used as the irradiation light for the formation of the latent image layer 106. The wavelength of the irradiation light herein used, however, may have a shorter wavelength than the wavelength at which the absorption begins on the film surface on which the latent image is formed. Since the absorption on the a-SiN became lager at 300 nm or less, it was possible to used a mercury lamp, a heavy hydrogen lamp, an ArF excimer laser, a KrCl excimer laser, an $F_2$ laser, etc.

Figure 4:
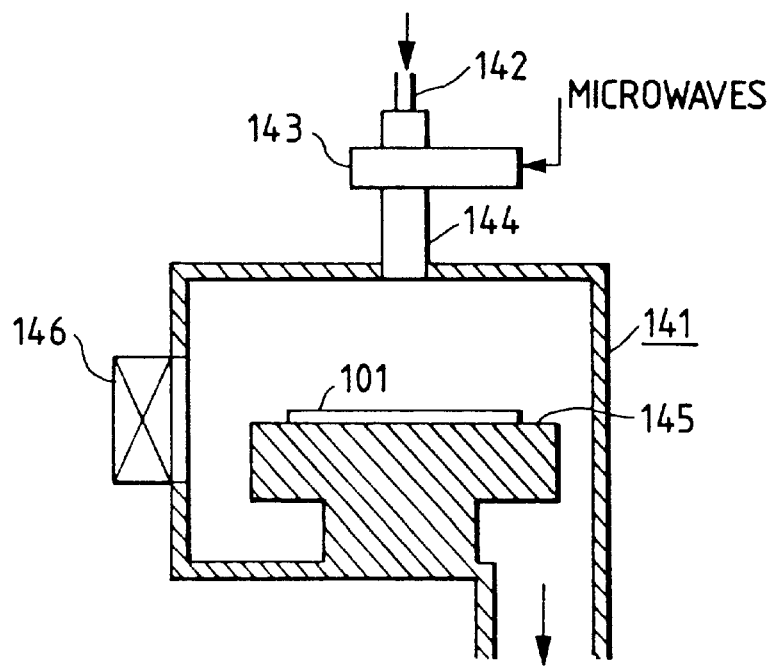

The etching in the present example was so designed as to be carried out using the chlorine plasma flow generated by accelerating chlorine plasma, in order to effect fine processing. When, however, the fine processing is not particularly required, the etching may be carried out using an excited gas in the etching chamber 141 as shown in FIG. 4. In FIG. 4, reference numeral 142 denotes a gas inlet from which the etching gas is fed in; 143, a microwave gas exciting device for generating plasma by producing a microwave electric field to form excited species; 144, a transport pipe made of quartz, through which the excited gas generated in the microwave gas exciting device 143 is transported to the etching chamber 141; 145, a sample holder; and 146, a gate valve.

Operation of the etching in the etching chamber 141 will be described. First, the etching chamber 141 was previously evacuated to a pressure of $10^{-8}$ Torr or less by means of a vacuum exhaust system (not shown). The gate valve 146 was opened, and the sample 101 was transported from the latent image forming chamber 112b in the same way as in the process previously described, and placed on the sample holder 145. Then the gate valve 146 was closed, and the etching chamber 141 was again evacuated to a pressure of $10^{-8}$ Torr or less. Next, $Cl_2$ gas, the etching gas, was fed at a flow rate of 500 sccm into the microwave gas exciting device 143 from the gas inlet 142, and then the vacuum exhaust system was operated so as for the pressure in the etching chamber 141 to be adjusted to 0.25 Torr. Subsequently, microwaves of 2.45 GHz and 400 W generated in a microwave generator (not shown) were supplied to the microwave gas exciting device 143, where $Cl_2$ gas was made into plasma, and the excited molecules $Cl_2^+$, $Cl^+$, excited by making the gas into plasma were supplied to the etching chamber 141 through the transport pipe 144. Upon reach of the excited molecules $Cl_2^+$, $Cl^+$ to the surface of the sample 101, the a-SiN film 103 was etched using the latent image layer 106 as a mask. It was thus possible to obtain the sample 101d. Since the etching carried out here was attributable to pure chemical reaction making use of the above excited species, no damage was produced, but the etching isotropically proceeded and hence a fine-processing performance was sacrificed.

In the present example, the respective processing chambers were connected through the gate valve. The present invention can also be worked even with use of respectively independent apparatus.

Example 2

In the present example, an $n^+$ semiconductor layer is formed on poly-Si to give the surface-modified layer. The present example will be described below. In the present example, the a-SiN film 103 as shown in FIG. 1A is replaced with a poly-Si film formed by low pressure CVD method in a thickness of 3,000Å, and also $P^+$ ion beams are used in place of the $Ar^+$ ion beams 105. The apparatus is constructed in the same way as the apparatus shown in FIG. 2. Thus the procedure of fabrication will be described below with reference to FIG. 2.

Formation of the $n^+$ layer on the surface of the poly-Si film in the present example is carried out in the same way as the step of forming the surface-modified layer 104 using the $Ar^+$ ion beams 105 in Example 1. A sample used in the present example was placed on the sample holder 109a through the gate valve 110a, and the insides of the surface-modified layer forming chamber 112a and plasma chamber 113a were evacuated to a pressure of $10^{-8}$ Torr or less by means of a vacuum exhaust system (not shown). Next, $PH_3$ gas was fed at a flow rate of 20 sccm from the gas inlet 111a into the plasma chamber 113a, and the vacuum exhaust system was so operated as for the pressure in the chamber to be adjusted to $2\times10^{-4}$ Torr. Subsequently, the magnetic coil 114a was electrified at 154 A to produce a magnetic field of 875 Gauss in the plasma chamber. Next, the microwaves of 2.45 GHz and 800 W generated in a microwave generator (not shown) were propagated using a waveguide to supply them to the plasma chamber 113a through the microwave transmission window 117a. As a result, in the plasma chamber 113a, $PH_3$ plasma was generated. Ion species present in the plasma were $PH_3^+$, $PH_2^+$, $PH^+$, $P^+$, $H_2^+$ and $H^+$. Next, controlling the voltage applied to the group of electrodes 118a, these ions were withdrawn from the plasma generated in the plasma chamber 113a and accelerated to an energy of 1 keV. Ion current density at this time was 0.6 mA/cm$^2$. With beams of $Ar^+$ ion beams thus withdrawn, the poly-Si film of the sample was irradiated on its whole surface for 3 minutes 30 seconds. This irradiation caused phosphorus atoms to invade as impurities in a depth of about 30 Å from the surface, which served as a doner to form an $n^+$ semiconductor layer. Since the $n^+$ semiconductor commonly tended to be oxidized, the subsequent step of forming a latent image was more accelerated. After completion of this processing, the gas supply was stopped, and the inside of the surface-modified layer forming chamber 112a was evacuated to give a pressure of $10^{-8}$ Torr or less.

As subsequent steps, the step of forming a latent image as shown in FIG. 1C and the step of etching as shown in FIG. 1D were carried out in the same manner as in Example 1, so that it was possible to form the desired pattern.

Example 3

Example 3 of the present invention will be described below.

FIGS. 5A to 5D are diagrammatic cross sections to stepwise illustrate a procedure for fabricating an amorphous silicon photosensor.

Figure 5A:
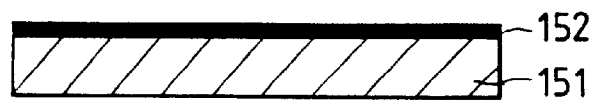
FIGS. 5A to 5D stepwise illustrate cross-sectionally a procedure for fabricating a device according to Example 3 of the present invention.
Figure 5B:

First, as shown in FIG. 5A, on the top surface of a substrate 151 comprised of quartz glass, a Cr film 152 with a thickness of 1,000 Å was deposited. Subsequently, the Cr film 152 was etched into the desired pattern to form a lower electrode 153 as shown in FIG. 5B. In the formation of the lower electrode 153, like the manner as described in Example 1, a surface-modified layer was formed using $Ar^+$ ion beams with an energy of 2 keV, and thereafter the layer was selectively irradiated with KrF excimer laser light to partially form a latent image layer comprised of $CrO_x$, followed by etching with $Cl_2$ gas used as etching gas, using the latent image layer as a mask.

Figure 5C:
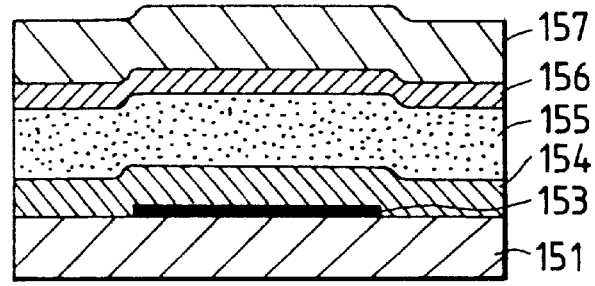

Next, as shown in FIG. 5C, films up to an Al film 157 were successively deposited. The films were deposited in the procedure as follows: The substrate as shown in FIG. 5B was heated to 350° C., and an a-SiN film 154 with a thickness of 3,000 Å was formed on the surface of the substrate by plasma CVD making use of a mixed gas of $SiH_4$, $NH_3$ and $H_2$. Subsequently, using a mixed gas of $SiH_4$ and $H_2$, an a-Si film 155 with a thickness of 1.5 μm was formed by plasma CVD. Next, on the top surface thereof, an $n^+$a-Si film 156 with a thickness of 2,000 Å was formed using a mixed gas of $SiH_4$, $PH_3$ and $H_2$, and the Al film 157 with a thickness of 6,000 Å was further formed thereon.

Figure 5D:
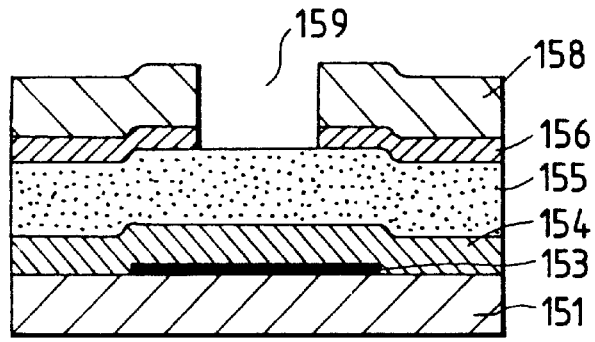

Next, as shown in FIG. 5D, a light incidence opening 159 was provided at the middle of the Al film 57, and the film was processed so that the circumference of the opening served as an upper electrode 158. Procedure therefor was as follows: In the same manner as in Example 1, the surface-modified layer was formed using $Ar^+$ ion beams with an energy of 2 keV, and thereafter the layer was selectively irradiated with KrF excimer laser light to partially form a latent image layer comprised of $AlO_x$, followed by etching with $Cl_2$ gas used as etching gas, using the latent image layer as a mask, to a depth reaching the $n^+$a-Si film 156. As a result, the light incidence opening 159 and the upper electrode 158 were formed.

Thus, in the present example, it was possible to fabricate the device without use of the resist having been hitherto used. Hence the fabrication steps was greatly simplified, and it was possible to fabricate the amorphous silicon photosensor without causing a decrease in yield due to dust.

In all the examples described above, examples have been described on those making use of the Ar+ ion beams or ions having a broad energy distribution, contained in the plasma. They may also be beams having a suitable energy, as exemplified by charged beams and electron beams, and be by no means limited to those exemplified in the above.

Example 4

Example 4 of the present invention will be described below with reference to the drawings.

FIGS. 6 to 10 are cross sections to diagrammatically illustrate the constitution of a cleaning chamber 201, a sputtering film forming chamber 202, a plasma film forming chamber 203, an etching chamber 204 and a latent image forming chamber 205, respectively, that are used in carrying out the present invention.

Figure 6:
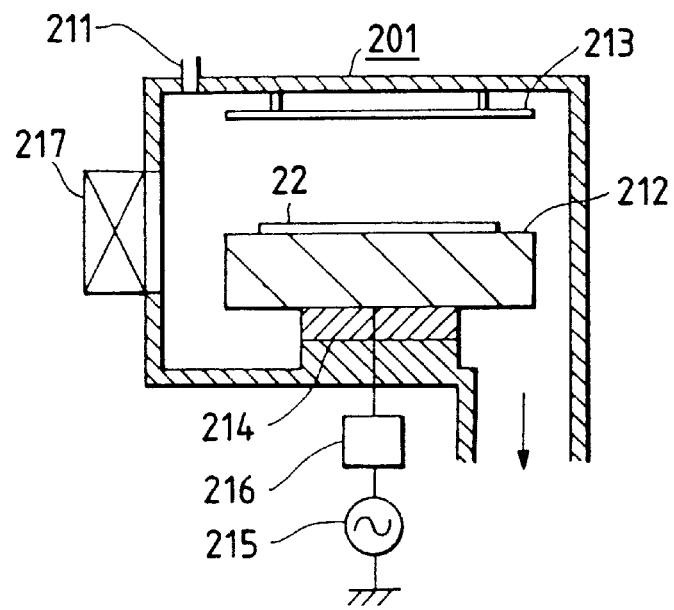
FIGS. 6 to 10 cross-sectionally illustrate the constitution of a cleaning chamber 201, a sputtering film forming chamber 202, a plasma film forming chamber 203, an etching chamber 204 and a latent image forming chamber 205, respectively, that are used in carrying out the present invention.
Figure 7:
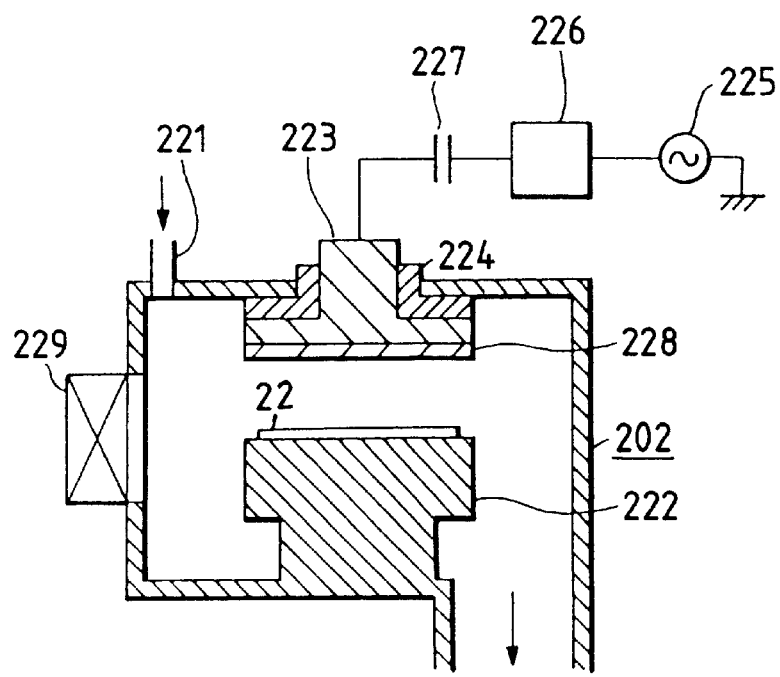
Figure 8:
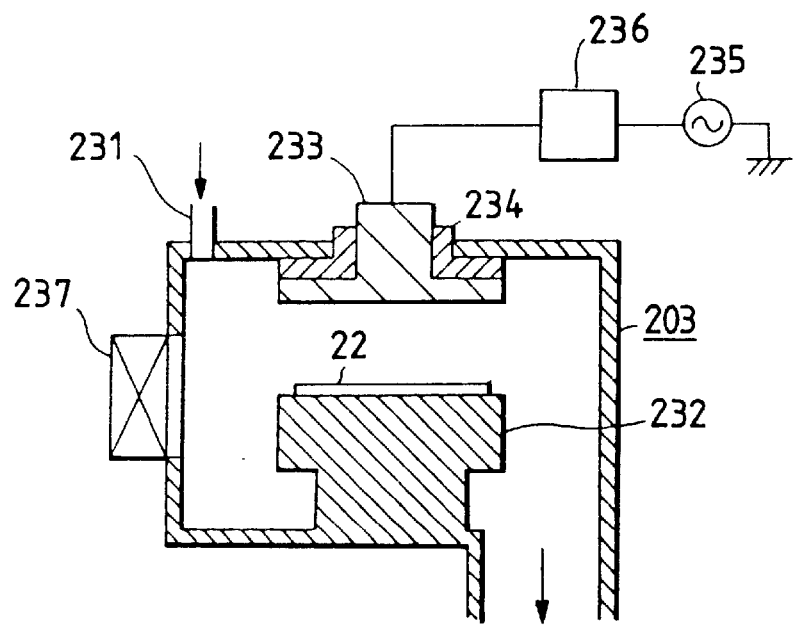
Figure 9:
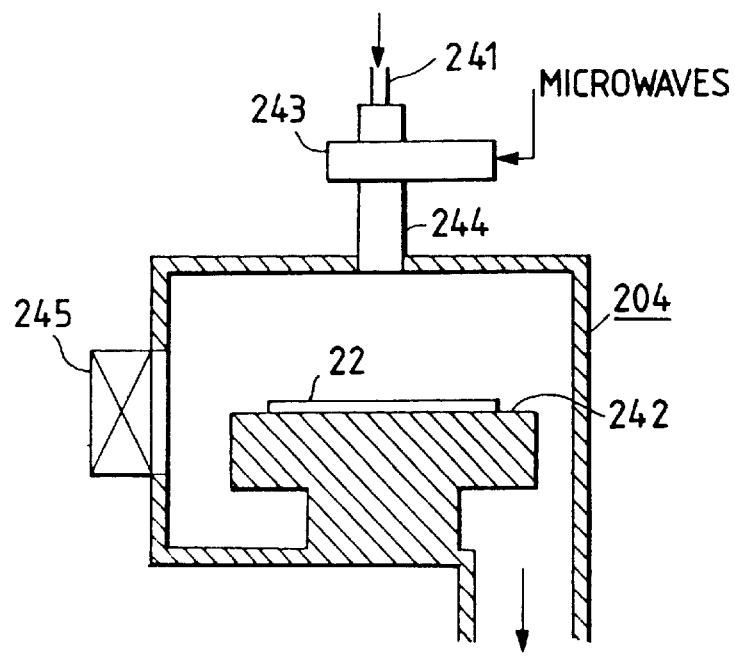

In FIG. 6 illustrating the cleaning chamber 201, reference numeral 211 denotes a gas inlet provided above the cleaning chamber 201 so that a cleaning gas is fed into the cleaning chamber 201; 212, a sample holder that holds a sample 22 placed in the cleaning chamber 201; 213, an opposing electrode that opposes the sample holder 212; 214, an insulator for insulating the sample holder 212 from a vacuum chamber that constitutes the cleaning chamber 201; and 215, a high-frequency power source of 13.56 MHz and 200 W, which is electrically connected to the sample holder 212. Reference numeral 216 denotes a matching box for matching the both sides of the sample holder 212 and the high-frequency power source 215; and 217, a gate valve. In FIG. 7 illustrating the sputtering film forming chamber 202, reference numeral 221 denotes a gas inlet from which the sputtering gas is fed into the sputtering film forming chamber 202; 222, a sample holder that holds the sample 22 placed in the sputtering film forming chamber 202; 223, an opposing electrode provided opposingly to the sample holder 222 and to which a high-frequency electric power is applied; 224, an insulator for insulating the opposing electrode 223 from a vacuum chamber that constitutes the sputtering film forming chamber 202; 225, a high-frequency power source of 13.56 MHz and 500 W; 226, a matching box for matching the both sides of the sample holder 222 and the high-frequency power source 225; 227, a capacitor for insulating the opposing electrode 224 in the direction of direct currents; 228, a sputtering target; and 229, a gate valve. In FIG. 8 illustrating the plasma film forming chamber 203, reference numeral 231 denotes a gas inlet from which a deposition gas is fed into the plasma film forming chamber 203; 232, a sample holder that holds the sample 22 placed in the plasma film forming chamber 203; 223, an opposing electrode provided opposingly to the sample holder 232 and to which a high-frequency electric power is applied; 234, an insulator for insulating the opposing electrode 233 from a vacuum chamber that constitutes the plasma film forming chamber 203; 235, a high-frequency power source of 13.56 MHz and 350 W; 236, a matching box for matching the both sides of the sample holder 232 and the high-frequency power source 235; and 237, a gate valve. In FIG. 9 illustrating the etching chamber 204, reference numeral 242 denotes a sample holder that holds the sample 22 placed in the etching chamber 204; 234, a microwave plasma gas exciting device for generating excited gas supplied to the etching chamber 204; 241, a gas inlet from which an etching gas is fed into the microwave plasma gas exciting device 243; 244, a transport pipe through which the excited gas generated in the microwave plasma gas exciting device 243 is transported to the etching chamber 204; and 245, a gate valve.

Figure 10:
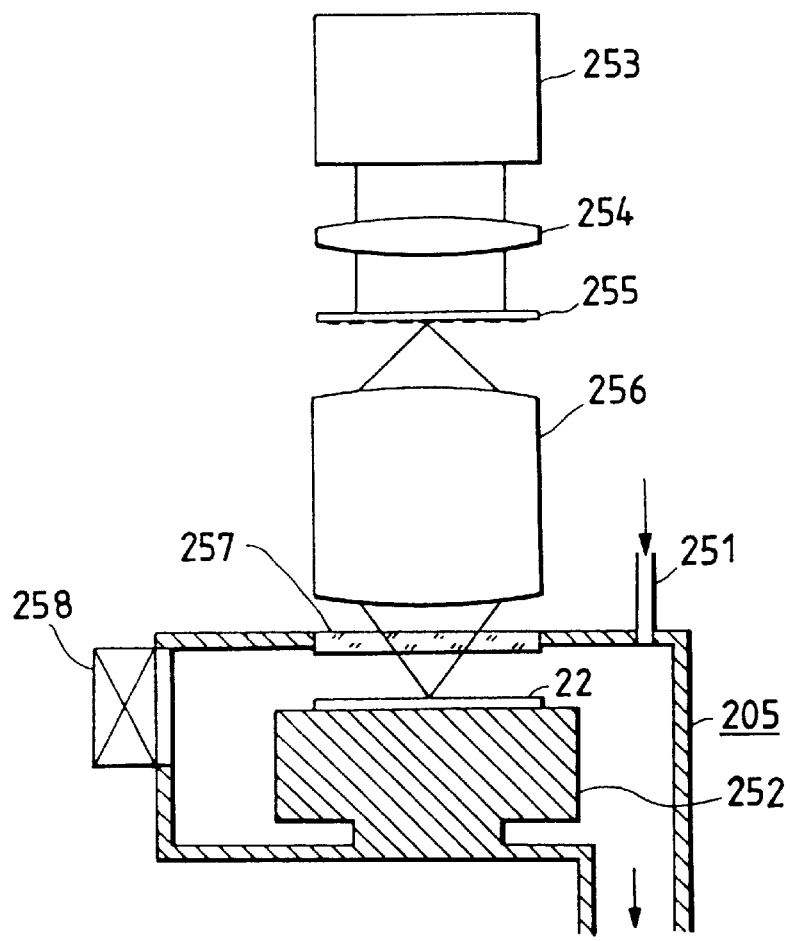

In FIG. 10 illustrating the latent image forming chamber 205 in which surface modification is carried out, reference numeral 251 denotes a gas inlet from which a modifying gas is fed into the latent image forming chamber 205; 252, a sample holder that holds the sample 22 placed in the latent image forming chamber 205; 253, a KrF excimer laser serving as a light source; 254, an illumination optical system for illuminating a mask 255 comprised of a quartz substrate (or a reticle) patterned with Cr; 256, a projection optical system for forming an image of the mask pattern on the surface of the sample 22; 257, a window through which the light having come out of the projection optical system 256 is led into the latent image forming chamber 205; and 258, a gate valve. Of the above apparatus, the light source 253, the illumination optical system 254, the mask 255, the projection optical system 256 are provided above the latent image forming chamber 205.

Figure 11A:
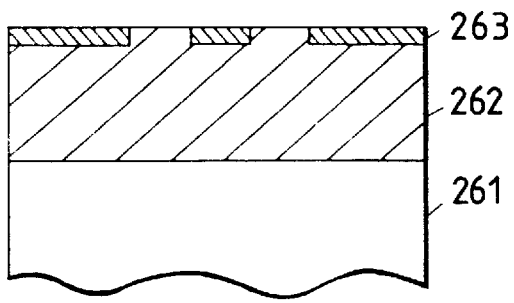
FIGS. 11A to 11D stepwise illustrate cross-sectionally a procedure for fabricating a device according to Example 4 of the present invention.
Figure 11B:
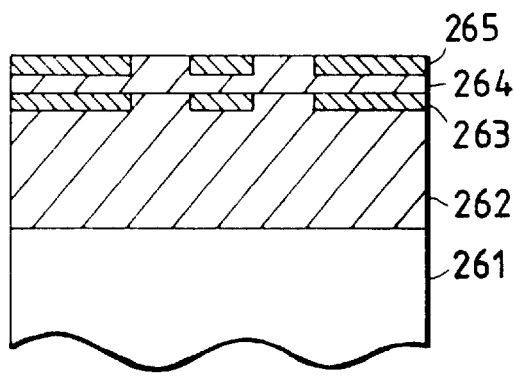
Figure 11C:
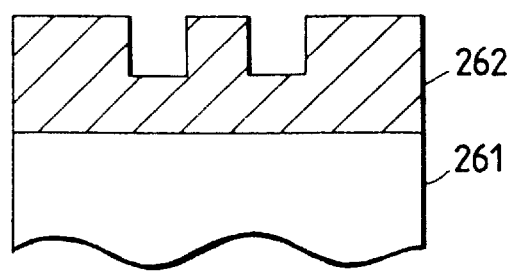
Figure 11D:
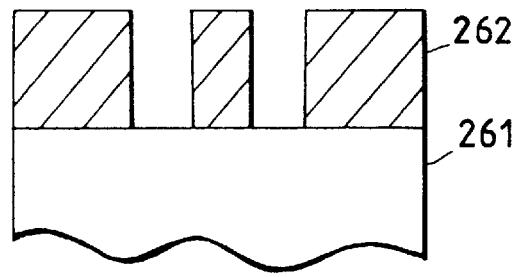

FIGS. 11A and 11B are diagrammatic cross sections to stepwise illustrate a procedure for forming an Al electrode pattern on a quartz substrate 261 according to the present example. FIGS. 11C and 11D are cross sections to respectively show states in which the films shown in FIGS. 11A and 11B have been etched.

The present example will be described with reference to FIGS. 6 to 10 and FIGS. 11A to 11D.

The quartz substrate 261, shown as the sample 22 in FIGS. 6 to 10, was placed on the sample holder 222 of the sputtering film forming chamber 202 shown in FIG. 7. Subsequently, the inside of the sputtering film forming chamber 202 was evacuated to a pressure of $10^{-7}$ Torr or less by means of a vacuum exhaust system (not shown). Ar gas was fed into the sputtering film forming chamber 202 from the gas inlet 221, and the vacuum exhaust system (not shown) was operated so as for the pressure in the sputtering film forming chamber 202 to be adjusted to 0.5 Torr. A current with a high-frequency of 13.56 MHz and 500 W was applied to the opposing electrode 223 while controlling the matching box 226, to generate plasma in the space between the sample holder 222 and the opposing electrode 223, to effect plasma decomposition of the gas fed therein, and to sputter an aluminum target attached to the opposing electrode 223 as a sputtering target, and thus, as shown in FIG. 11A, a film 262 to be etched, comprised of an Al film with a thickness of 3,000 Å, was formed on the quartz substrate 261.

Subsequently, this quartz substrate 261 was subjected to surface cleaning in the following way, in the cleaning chamber 201 shown in FIG. 6. The sample was placed on the sample holder 212, and the inside of the chamber was evacuated to a pressure of $10^{-7}$ Torr or less by means of a vacuum exhaust system (not shown). From the gas inlet 211, a gas for cleaning the surface of the sample, i.e., Ar gas in this instance, was fed at a flow rate of 50 sccm into the cleaning chamber 201, and the vacuum exhaust system (not shown) was operated so as for the pressure in the cleaning chamber 201 to be adjusted to 0.08 Torr. Next, a current with a high-frequency of 13.56 MHz and 100 W was applied to the sample holder 212 while making adjustment of the matching box 216, to generate plasma in the space between the sample holder 212 and the opposing electrode 213. Since the sample holder 212 was insulated by a capacitor (not shown) in the direction of direct currents, a negative DC bias voltage of about −60 V was generated between the sample holder 212 and the opposing electrode 213 because of the difference in mobility between electrons and ions. Because of this voltage, Ar ions were accelerated and they collided against the surface of the film 262 to be etched, so that the stain present on the surface was physically removed by sputtering and thus a cleaned surface was obtained. The processing time was about 60 seconds.

Next, in order to partially form the surface-modified layer on the surface of the film 262 to be etched, selective irradiation with light in a modifying gas atmosphere was carried out in the latent image forming chamber 205 shown in FIG. 10. In this instance, an AlO$_x$ film that served as a protective film (an etching mask) in the etching carried out later was formed in the following way: The quartz substrate 261 was placed on the sample holder 252, and the inside of the latent image forming chamber 205 was evacuated to a pressure of $10^{-7}$ Torr or less by means of a vacuum exhaust system (not shown). NO$_2$ gas was fed from the gas inlet 251 into the latent image forming chamber 205, and the vacuum exhaust system was operated so as for the inside pressure to be adjusted to 1 Torr. Next, with the laser light of 248 nm in wavelength, radiated by means of the KrF excimer laser serving as the light source 253, the mask 255 was uniformly irradiated through the illumination optical system 254, and then an image of the pattern formed on the mask 255 was formed on the surface of the Al film through the window 257 by means of the projection optical system 256. As a material for the window 257, quartz was used so that the laser light with an wavelength of 248 nm was transmitted without being absorbed. On the surface of the film 262 to be etched on which the mask image had been formed, the photochemical reaction of NO$_2$ with Al took place only at the part irradiated with the light, so that upon exposure for 10 minutes a first protective film 263 comprised of AlO$_x$ with a thickness of 10 Å was partially (patternwise) formed on the surface of the film 262 to be etched, as shown in FIG. 11A. At the part not irradiated with the light, this reaction did not proceed, and finally a negative pattern of the mask was formed on the surface of the film 262 to be etched. In other words, Al was modified to AlO$_x$ and the latent image was formed. The KrF excimer laser was used here as the light source 253. The same effect was also obtained when lamp light sources such as a xenon lamp and a high-pressure mercury lamp or ultraviolet lasers such as an ArF excimer laser, an XeCl excimer laser and an Ar laser were used.

Since the first protective film 263 formed in this way did not have a sufficient layer thickness, the quartz substrate 261 was again processed in the sputtering film forming chamber 202 shown in FIG. 7 under the same conditions to form on its surface an aluminum film with a thickness of 50 Å as a film 264 to be etched. Then the surface thus processed was cleaned in the cleaning chamber 201 shown in FIG. 6 under the same conditions previously described. Thereafter, in the latent image forming chamber 205 shown in FIG. 10, as a second protective film 265 an AlO$_x$ film with a thickness of 10 Å was formed under the same conditions previously described, at the same position as the first protective film 263 as shown in FIG. 11B. As a result, the first protective film 263 and the second protective film 264 were 20 Å in total thickness. Subsequently, the resulting sample was subjected to chemical dry etching in the following way in the etching chamber 204 shown in FIG. 9. The quartz substrate 261 was placed on the sample holder 242, and the inside of the etching chamber 204 was evacuated to a pressure of $10^{-7}$ Torr or less by means of a vacuum exhaust system (not shown). A gas, Cl$_2$ in this instance, for etching the films 262 and 264 to be etched on which the latent image was applied twice, was fed at a flow rate of 500 sccm into the microwave plasma gas exciting device 243, and the vacuum exhaust system (not shown) was operated so as for the pressure in the etching chamber 204 to be adjusted to 0.2 Torr. Microwaves of 2.45 GHz and 700 W generated using a microwave generator (not shown) were supplied to the microwave plasma gas exciting device 243 to make the etching gas into plasma. Excited molecules Cl$_2$ and Cl, thus excited by the plasma, were supplied for 120 seconds to the surface of the quartz substrate 261 through the transport pipe 244 made of quartz, of 20 cm in whole length and 40 mm in inner diameter.

The overall etching selection ratio in this instance, of the films 262 and 264 to be etched to the first and second protective films 263 and 265 was 150, and hence it was possible to form, after completion of etching, an Al electrode pattern with a sufficent height, comprised of the film 262 having been etched, as shown in FIG. 11D. It was possible to obtain a sufficient etching depth compared with the depth shown in FIG. 11C which was obtained by etching the film shown in FIG. 11A.

Example 5

Figure 12A:
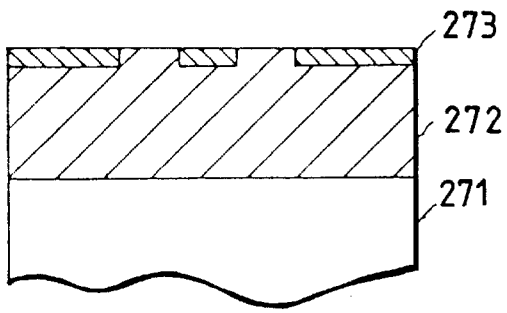
FIGS. 12A to 12F stepwise illustrate cross-sectionally a procedure for fabricating a device according to Example 5 of the present invention.
Figure 12D:
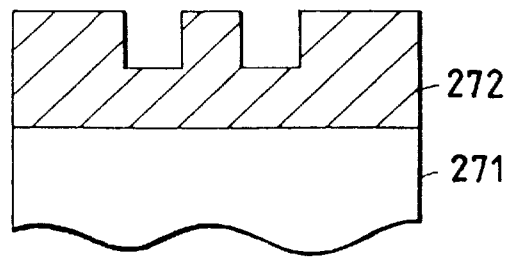
Figure 12B:
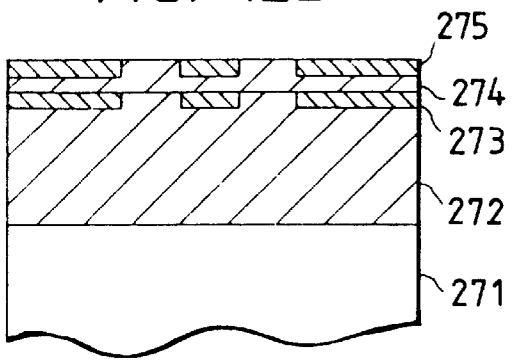
Figure 12E:
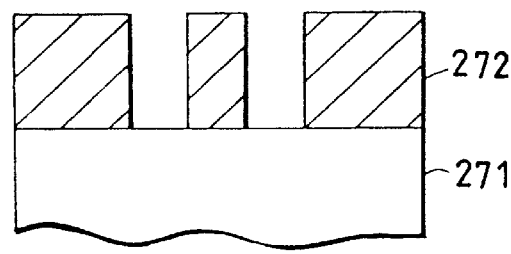
Figure 12C:
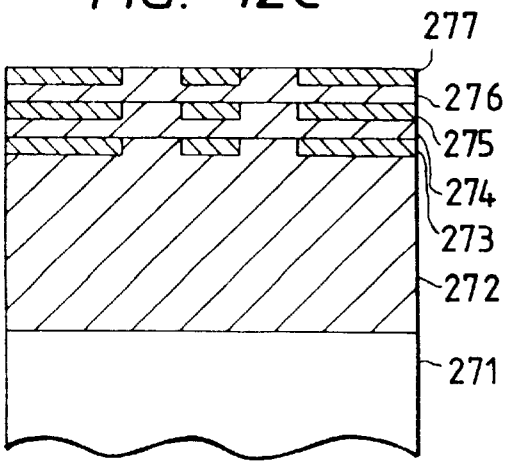
Figure 12F:
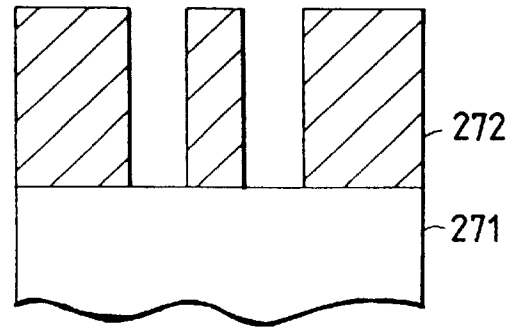

FIGS. 12A to 12C are diagrammatic cross sections to stepwise illustrate a fabrication procedure used when a pattern of an a-Si film, a semiconductor layer, is formed on an ITO-deposited quartz substrate 271 according to Example 5 of the present invention. FIGS. 12D to 12F are diagrammatic cross sections to illustrate states wherein those shown in FIGS. 12A to 12C have been etched, respectively.

This example will be described with reference to FIGS. 6, 8, 10 and 12.

The quartz substrate 271 was placed on the sample holder 232 previously heated to 250° C. with a heater (not shown) in the plasma film forming chamber 203 shown in FIG. 8. The inside of the plasma film forming chamber 203 was evacuated to a pressure of $10^{-7}$ Torr or less by means of a vacuum exhaust system (not shown), and the substrate was heated to a temperature of 250° C. From the gas inlet 231, $SiH_4$ and $H_2$ were fed at flow rates of 50 sccm and 500 sccm, respectively, into the plasma film forming chamber 203, and the vacuum exhaust system (not shown) was operated so as for the pressure in the plasma film forming chamber 203 to be adjusted to 0.5 Torr. A current with a high-frequency of 13.56 MHz and 50 W was applied to the opposing electrode 233 while controlling the matching box 236, to generate plasma in the space between the sample holder 232 and the opposing electrode 233, to effect plasma decomposition of the gas fed therein. Thus an a-Si film with a thickness of 9,000 Å was deposited as a film 272 to be etched, as shown in FIG. 12A.

Subsequently, this quartz substrate 271 was subjected to surface cleaning in the same manner as in Example 4, in the cleaning chamber 201 shown in FIG. 6.

Next, an $SiO_2$ film that serves as a first protective film in the etching carried out later was formed in the same way as in Example 4, in the latent image forming chamber 205 shown in FIG. 10. As a result, the photochemical reaction of $NO_2$ with Si took place only at the part irradiated with the light, so that upon exposure for 10 minutes a first protective film 273 comprised of $SiO_2$ with a thickness of 10 Å was patternwise formed on the surface of the film 272 to be etched, as shown in FIG. 12A. At the part not irradiated with the light, this reaction did not proceed, and finally a negative pattern of the mask was formed on the surface of the film 272 to be etched. In other words, a-Si was modified to $SiO_2$ to form a latent image.

Since the first protective film 273 formed in this way did not have a sufficient layer thickness compared with the thickness of the film 272 to be etched, the substrate was again processed in the plasma film forming chamber 203 shown in FIG. 8 under the same conditions as previous ones to form on its surface an a-Si film with a thickness of 50 Å. Then the surface of the sample was cleaned in the cleaning chamber 201 shown in FIG. 6 under the same conditions as those previously used. Thereafter, in the latent image forming chamber 205 shown in FIG. 10, another layer $SiO_2$ film was formed under the same conditions as those previously described was formed at the same position as the first protective film 273 shown in FIG. 12A. A series of these steps were carried out twice to form films 274 and 276 to be etched and second and third protective films 275 and 277, respectively, as shown in FIGS. 12B and 12C. As a result, all the protective films were 30 Å in total thickness.

Subsequently, the quartz substrate 271 was subjected to chemical dry etching for 150 seconds under the same conditions as those used in Example 4, in the etching chamber 204 shown in FIG. 9. The overall etching selection ratio in this instance, of the films 272, 274 and 276 to be etched to the first to third protective films 273, 275 and 277 was 300, and hence it was possible to form, after completion of etching, an etched pattern with the desired height as shown in FIG. 12F.

Example 6

As Example 6, a process of forming an a-Si film pattern like that in Example 5 will be shown below.

The films up to the second protective film 275 (see FIG. 12B) was formed in the same manner as in Example 5. Thereafter, in the plasma film forming chamber 203 as shown in FIG. 8, a 50 Å thick $n^+$-Si film was formed under the same conditions as in Example 5 except that $H_2$-diluted 100 ppm $PH_3$, $SiH_4$ and $H_2$ were fed from the gas inlet 231 at flow rates of 150 sccm, 5 sccm and 30 sccm, respectively. Thereafter, the surface of the film was cleaned under the same conditions as in Example 5 to form a surface-modified layer (thickness of protective film: 30 Å), followed by etching. As a result, it was possible to obtain an a-Si film with the desired pattern as shown in FIG. 12F.

Thus, a plurality of the films to be etched, deposited on the substrate may be formed of different materials so long as they can be etched using the same etchant.

Other embodiments of the processing method of the present invention will be described below.

Figure 13A:
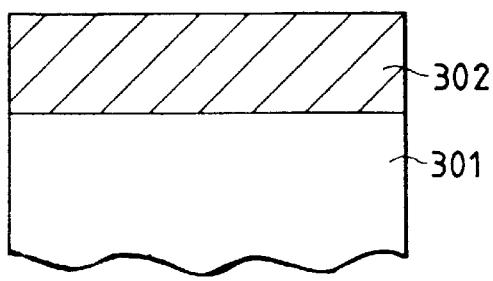

FIG. 13A shows a state wherein a layer 302 comprising a conductive material such as Al is formed on a substrate 301 made of quartz or the like. In the following, a fine-processing method of the present invention by which this layer 302 is etched in the desired pattern form will be described in detail.

Figure 13B:
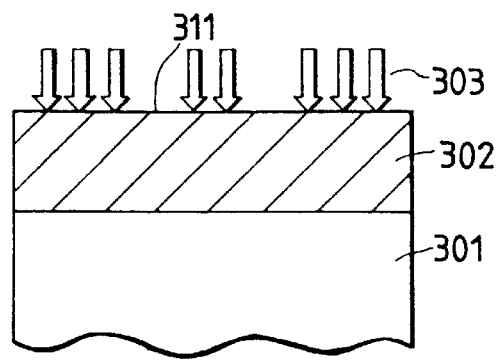

An article to be processed, as shown in FIG. 13A, is placed in the desired gas atmosphere, and the processing surface 311 of the article to be processed is irradiated with laser light 303 corresponding with the desired pattern form. (FIG. 13B).

Figure 13C:
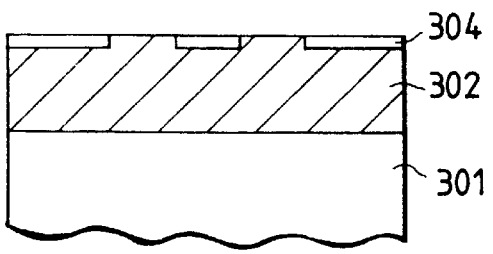

The irradiation with the laser light 303 brings the processing surface 311 and the desired gas to photochemical reaction corresponding with the desired pattern to form a surface-modified layer 304 (FIG. 13C).

Next, the processing surface 311 on which the surface-modified layer 304 has been formed is irradiated with laser light 305. As a result, the laser light is absorbed in the region in which the surface-modified layer 304 has been formed. In contrast thereto, the region in which no surface-modified layer 304 has been formed reflects the laser light. This brings about a temperature rise at the part of the surface-modified layer 304, and, being in the state of the solid phase, an increase in particle size or a progress of crystallization, so that a region (a protective film) 306 with a better etching resistance can be formed.

Using as a mask the protective film 306 thus formed, the surface is dry-etched with $Cl_2$ gas etc. As a result, the part provided with no protective film 306 is etched because of a difference in etching rate between the protective film 306 and the part provided with no protective film 306.

Dry etching carried out until the protective film 306 disappear brings about the state as shown in FIG. 13F. Thus, it is possible to process the layer 302 into the desired pattern form.

In the present invention, the difference in etching rate is utilized in this way, and hence the present invention is advantageous for the fine processing.

Figure 13D:
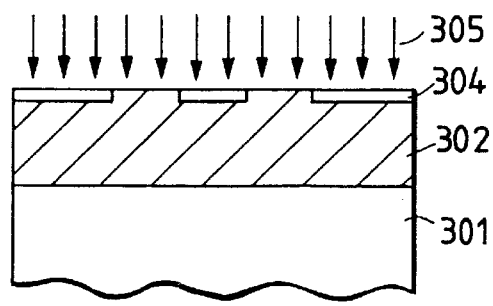

The state shown in FIG. 13D, described above, is a state wherein annealing is applied. This annealing can also be effected even without use of electromagnetic waves.

That is, the increase in particle size or crystallization of the surface-modified layer 304 can be achieved also when the article to be processed is heated (307) using a heater or a technique such as electromagnetic induction (FIG. 13G).

Example 7

FIGS. 13A to 13F are diagrammatic cross sections to illustrate another preferred embodiment of the present invention. As Example 7, a process of forming an Al electrode pattern on a quartz substrate will be described.

As shown in FIG. 13A, an Al film 302 was formed on a quartz substrate 301 by sputtering in a thickness of 1 μm.

Next, in order to form the surface-modified layer, in a modifying gas $NO_2$ atmosphere the surface of the Al film was selectively irradiated with KrF laser light using a mask (not shown) (FIG. 13B). Only at the part irradiated with the light, the photochemical reaction of $NO_2$ with Al took place, and upon exposure for 10 minutes an $AlO_x$ film 304 with a thickness of 10 Å was formed on the surface of the Al film (FIG. 13C).

In order to improve the resistance to the etching carried out later, the $AlO_x$ film thus formed was subjected to the following annealing so that the film was made stabler and stronger. As described with reference to FIG. 13D, the sample was irradiated with YAG laser light 305 over the whole surface. Almost all of the laser light reflected from the Al film corresponding to the surface-unmodified layer. On the other hand, the laser light was absorbed at the $AlO_x$ film corresponding to the surface-modified layer, where the temperature of the $AlO_x$ film rose, and, in the solid phase, the particle size increased or crystalization progressed, so that as shown in FIG. 13E an $AlO_x$ film 306 made stabler and stronger was obtained. Using as a mask the $AlO_x$ film 306 thus obtained, dry etching making use of $Cl_2$ gas was carried out until the mask disappeared. As a result, it was possible to obtain as shown in FIG. 13F the Al film with the desired pattern.

Example 8

An instance in which a semiconductor layer a-Si:H film pattern is formed on a transparent electrode ITO-deposited quartz substrate will be described as Example 8. The basic formation process is the same as that of Example 7.

On the above substrate, an a-Si:H film was formed by plasma CVD in a thickness of 6,000 Å.

Subsequently, the surface modification was carried out by selective irradiation with light 303 under the same conditions as those in Example 7. As a result, upon exposure for 10 minutes an $SiO_x$:H film with a thickness of 10 Å was formed on the a-Si:H film.

In order to more improve the resistance to the etching carried out later, the $SiO_x$:H film thus formed was subjected to annealing so that the film was made stabler and stronger. The annealing was carried out by selectively irradiating the surface of the $SiO_x$:H film with $F_2$ laser beam, using a mask (not shown) or two-dimensional scanning. The laser light was absorbed at the $SiO_x$:H film, where the temperature of the film rose, and the particle size increased or crystalization progressed in the solid phase, as in Example 7, and besides H was detached from the SiH bond or unbonded arms Si- and O combined to become approximate to stoichiometric ratio $SiO_2$, so that the protective film made stabler and stronger. Using as a mask the protective film 306 thus formed, chemical dry etching making use of $CF_4+O_2$ gas was carried out. As a result, it was possible to obtain the a-Si:H film with the desired pattern.

Example 9

An instance in which a pattern is formed on a monocrystalline Si substrate will be described as Example 9.

Figure 14A:
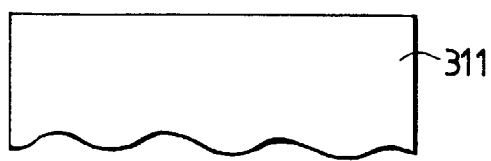
FIGS. 14A to 14F are diagrammatic cross sections to illustrate a fine-processing method of the present invention.
Figure 14B:
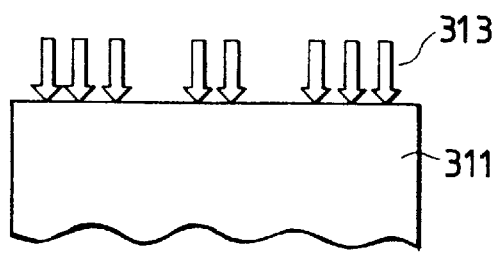
Figure 14C:
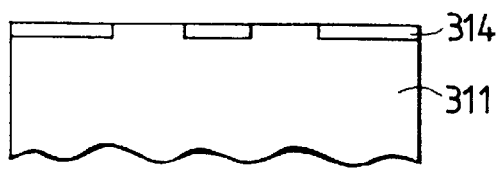

The surface modification was carried out on an Si substrate 311 as shown in FIG. 14A, by selective irradiation with light 313 under the same conditions as those in Example 7 (FIG. 14B). Upon exposure for 20 minutes an $SiO_x$ film 314 with a thickness of 10 Å was formed (FIG. 14C).

Figure 14D:
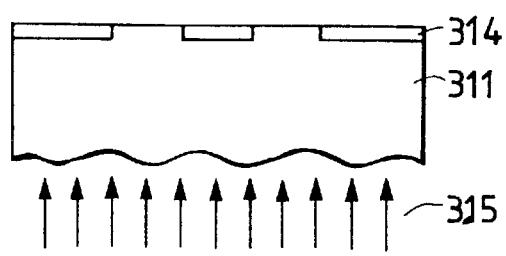
Figure 14E:
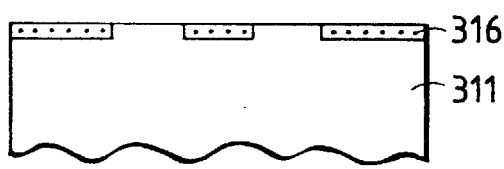
Figure 14F:
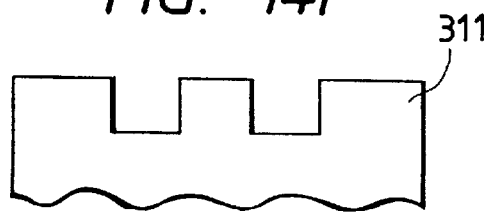

In order to improve the resistance to the etching carried out later, the $SiO_x$ film 314 thus formed was subjected to annealing so that the film was made stabler and stronger. More specifically, the annealing of the $SiO_x$ film was carried out by heating a substrate holder (not shown) as shown in FIG. 14D. As a result, in the $SiO_x$ film 314, the particle size increased or crystalization progressed in the solid phase, so that as shown in FIG. 14E an $SiO_x$ film 316 made stabler and stronger was obtained. Using as a mask the $SiO_x$ film 316 thus formed, chemical dry etching making use of $CF_4+O_2$ gas was carried out. As a result, it was possible to obtain the c-Si substrate with the desired pattern as shown in FIG. 14F.

Still another embodiment of the present invention will be subsequently described. Examples 10 to 12 described below will be described with reference to FIGS. 15A to 15D.

Figure 15A:
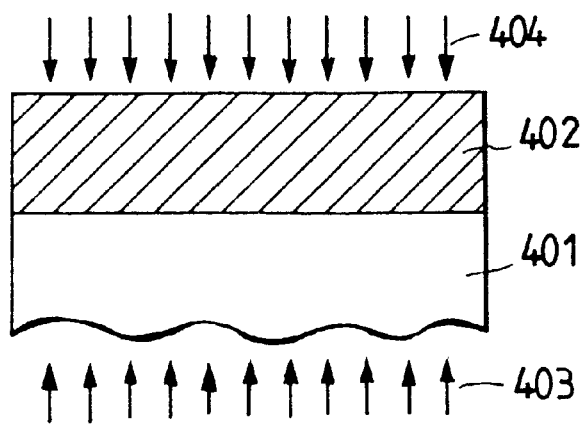
FIGS. 15A to 15D and 16A to 16H each diagrammatically illustrate surface photo-processing steps.

FIG. 15A shows a step of heating a film 402 on a substrate 401 to apply surface modification. Reference numeral 403 diagrammatically denotes the heating of the film 402 by substrate-heating making use of a heater or the like; and 404, the heating of the film 402 by irradiation making use of a laser lamp or the like. The heating 404 may also be selectively applied only to surface-modifying regions.

Figure 15B:
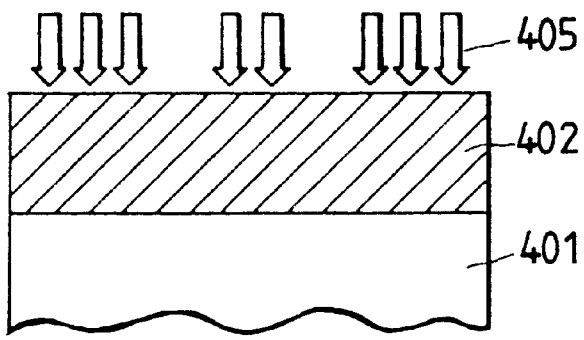
Figure 15C:
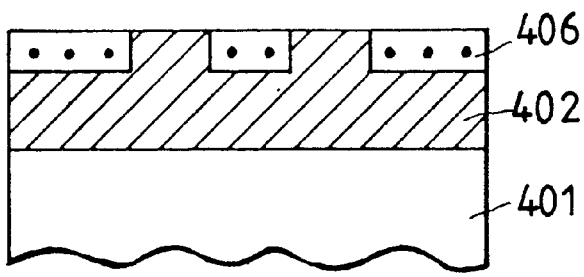
Figure 16A:
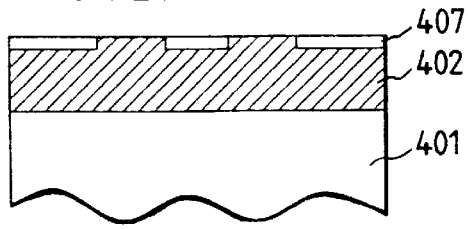

As an embodiment of the photo-processing method of the present invention, a patterning process carried out by etching will be shown below. FIG. 15B shows a state wherein a film 402 to be processed, having been heated as shown in FIG. 15A, is selectively irradiated with light 405 in a modifying gas atmosphere. FIG. 15C shows that as a result of the steps shown in FIGS. 15A and 15B a surface-modified layer 406 was formed by photochemical reaction accelerated by the heating. This surface-modified layer 406 has a stronger chemical bond and a larger thickness than a surface-modified layer 407 shown in FIG. 16A, which is formed only by photochemical reaction without the heating. Hence, a greater amount (or depth) of etching can be attained in the case when the film 402 to be processed is etched using this surface-modified layer 406 is used as a protective film (a mask) than the case when the surface-modified layer 407 shown in FIG. 16A to which no heating is applied is used as a protective film.

Figure 15D:
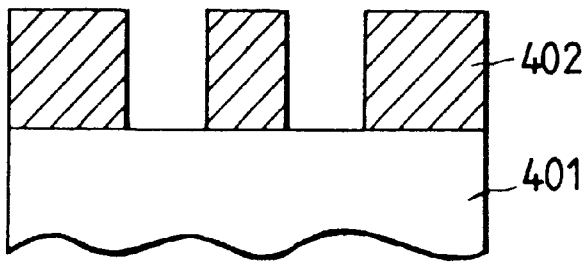
Figure 16E:
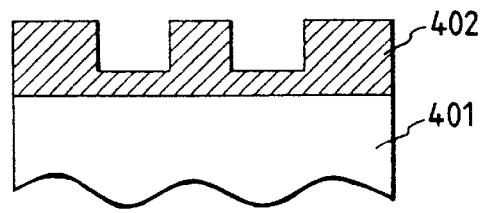

FIG. 15D shows a state wherein the etching is carried out until the protective film 406 shown in FIG. 15C has disappeared. FIG. 16E also shows a state wherein the etching is carried until the protective film 407 shown in FIG. 16A has disappeared. As is seen from comparison of FIG. 15D with FIG. 16E, the heating of the film to be processed can bring about a so much greater amount of etching.

This embodiment of the present invention will be described below in greater detail by giving examples.

Example 10

On a transparent electrode ITO-deposited substrate, a pattern of an insulating layer a-$SiN_x$:H film was formed by etching.

The process therefor will be described with reference to FIGS. 17A to 17C and 18.

Figure 17A:
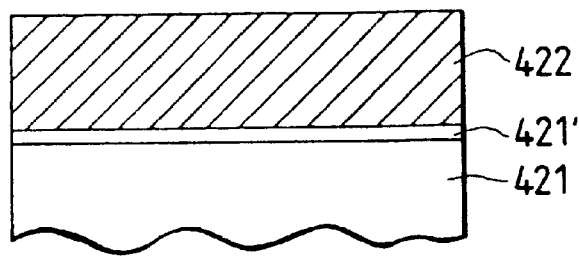
FIGS. 17A to 17C, 21A to 21C and 23A to 23C each diagrammatically illustrate a typical example of a surface photo-processing method of the present invention.
Figure 17B:
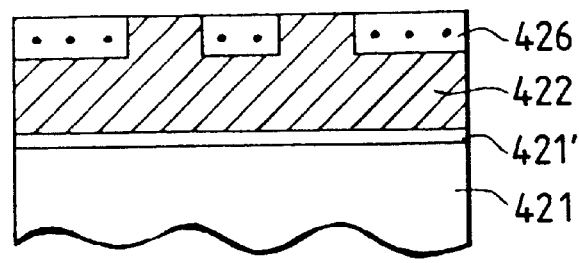

First, as shown in FIG. 17A, an a-$SiN_x$:H film 422 was formed on an ITO 421'-deposited substrate 421 by plasma CVD in a layer thickness of 5,000 Å. Using this substrate as a sample, this sample, designated as 431, was placed on a sample holder 432 in a surface-modifying device shown in FIG. 18, and heated to 400° C. by substrate-heating making use of a heater 433. In this state, $O_2$ gas was fed into it from a gas inlet 434, and a vacuum exhaust system 430 was operated so as for the inside pressure to be adjusted to 1 Torr. A mask 438 was irradiated with UV light from a low-pressure mercury lamp 436 by means of an illumination optical system 437, and then a pattern image of the mask 438 was formed on the surface of the a-SiN$_x$:H film by means of a projection optical system 439.

On the surface irradiated with the UV light, $O_2$ and a-SiN$_x$:H caused photochemical reaction accelerated by heat, and upon exposure for 20 minutes an S:O$_y$ film (426 in FIG. 17B) with a thickness of 20 Å was formed.

Figure 16B:
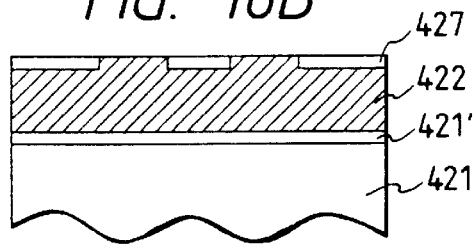
Figure 16F:
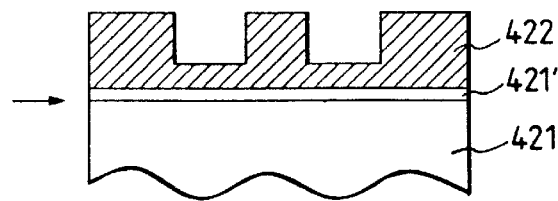
Figure 17C:
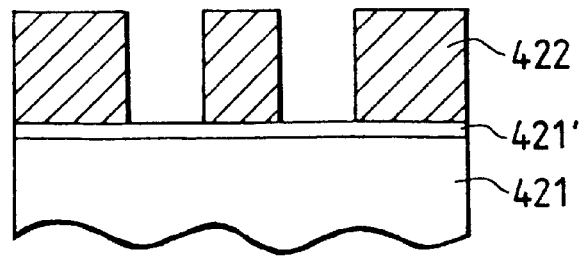
Figure 18:
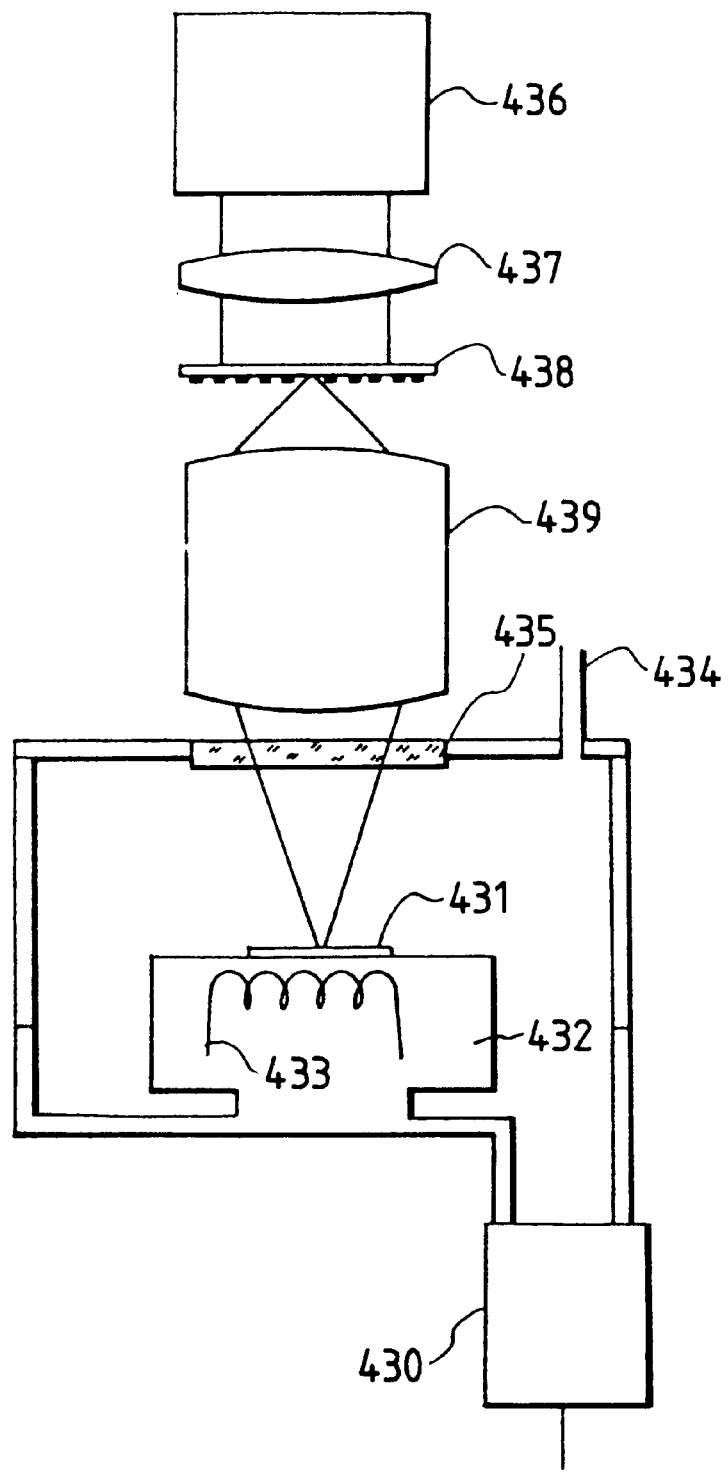
FIGS. 18, 22 and 24 each diagrammatically illustrate a typical example of a surface photo-processing apparatus of the present invention.

Using as a mask the S:O$_y$ film 426 thus formed, chemical dry etching making use of $CF_4+O_2$ gas was carried out until the mask disappeared. As a result, as shown in FIG. 17C, the desired pattern was obtained. For comparison, an instance in which the processing was carried out without heating the film to be processed is shown in FIGS. 16B and 16F. As is seen from FIGS. 16B and 16F, the pattern as shown in FIG. 16F was obtained from the formation of the protective film 427 with an insufficient degree of oxidation and an insufficient thickness, and it was impossible to obtain the pattern as shown in FIG. 17C.

Figure 19:
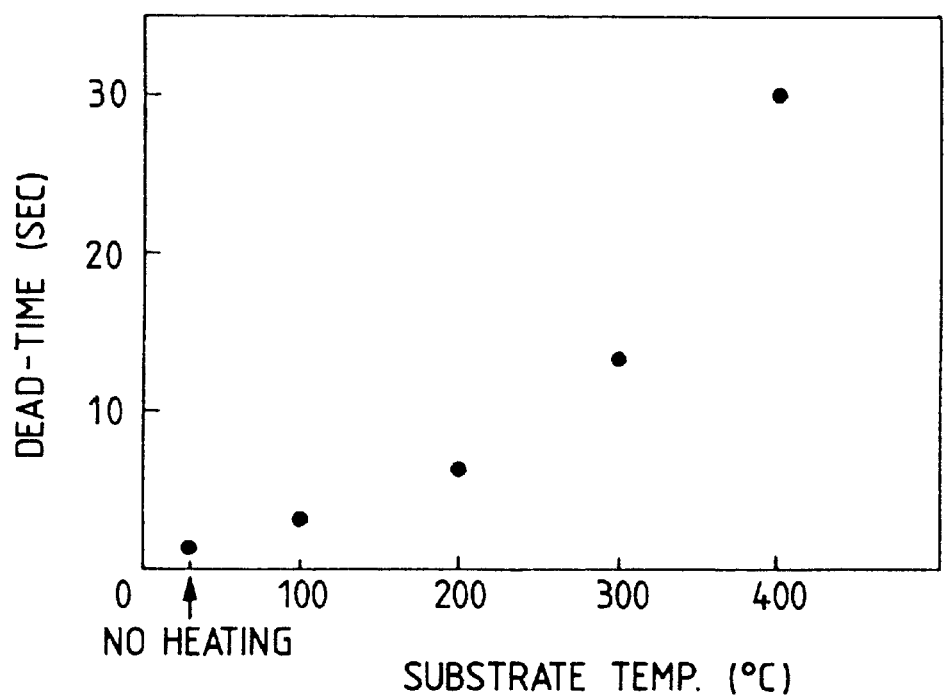
FIG. 19 is a graphic representation to show the relationship between substrate temperature and dead-time at the time of the formation of a surface-modified layer.

In this example, the heating temperature was set to 400° C. Needless to say, other temperatures can also bring about the effect of accelerating the photochemical reaction, corresponding with the temperatures. As data for establishing such effect, FIG. 19 shows dead time in chemical dry etching (the time from the initiation of etching to the disappearance of a-SiO$_y$ films, which serves as values indicating the etching resistance of SiO$_y$ films obtained by surface modification of a-SiN$_x$:H films, carried out under the same conditions except for changes of heating temperature.

Figure 20:
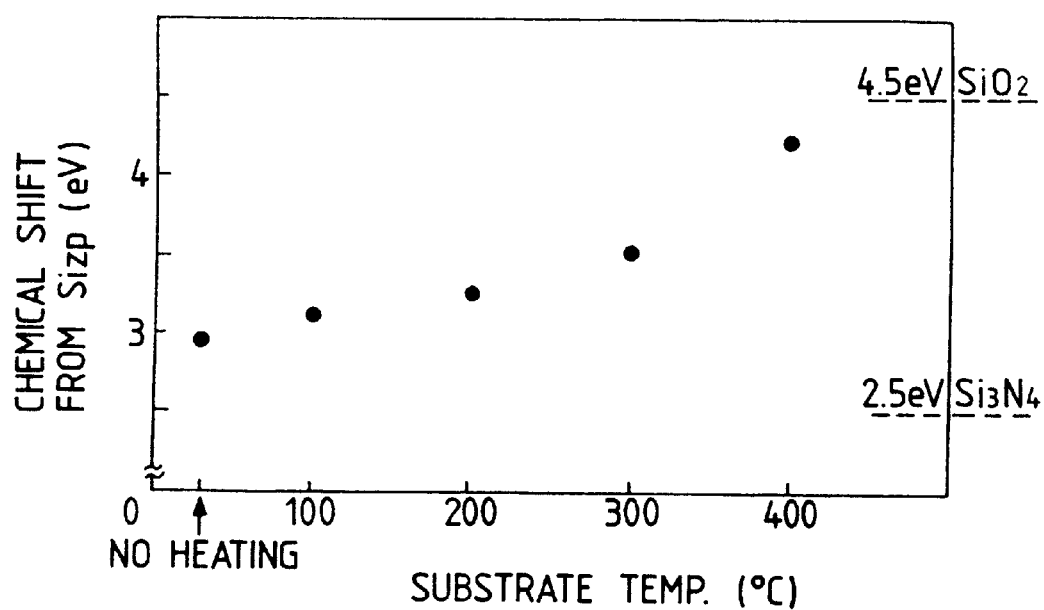
FIG. 20 is a graphic representation to show the relationship between substrate temperature and chemical shift at the time of the formation of a surface-modified layer.

As other data for indicating the etching resistance of the SiO$_x$ films, FIG. 20 shows chemical shifts from Si$_{2p}$, obtained from surface analysis by XPS (X-ray photoelectron spectroscopy). As is seen from the drawings, the more the values of chemical shifts approach to SiO$_2$ (4.5 eV), the more the oxidation proceeds and the higher the etching resistance becomes.

Example 11

On a quartz substrate, an Al electrode pattern was formed by etching. The process therefor will be described with reference to FIGS. 21A to 21C and 22.

Figure 21A:
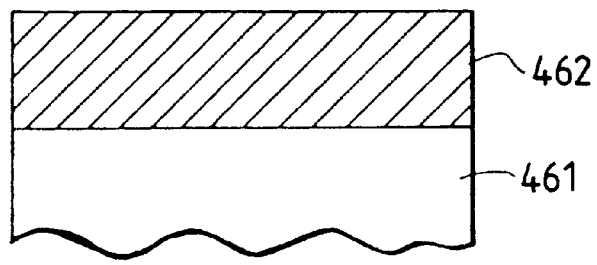
Figure 21B:
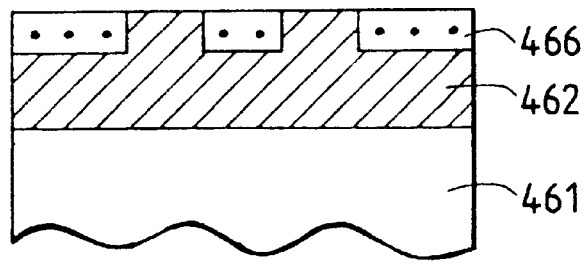

As shown in FIG. 21A, an Al film 462 was formed on a quartz substrate 461 by sputtering in a thickness of 1 μm. Using this substrate as a sample, this sample, designated as 471, was placed on a substrate holder 472 in a surface-modifying device shown in FIG. 22, and the sample 471 was heated to 500° C. by lamp-heating making use of a halogen lamp 473a and a reflecting plate 473b. In this state, NO$_2$ gas was fed into it from a gas inlet 474, and a vacuum exhaust system 470 was operated so as for the inside pressure to be adjusted to 1 Torr. A mask 478 was irradiated with light (248 nm) from a KrF laser 476 by means of an illumination optical system 477, and then a pattern image of the mask 478 was formed on the Al film surface by means of a projection optical system 479 through a window 475.

On the surface irradiated with the light, NO$_2$ and Al caused photochemical reaction accelerated by heat, and upon exposure for 10 minutes an AlO$_x$ film (466 in FIG. 21B) with a thickness of 30 Å was formed on the surface of the Al film.

Figure 21C:
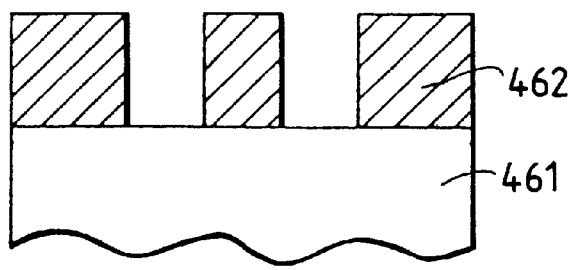
Figure 22:
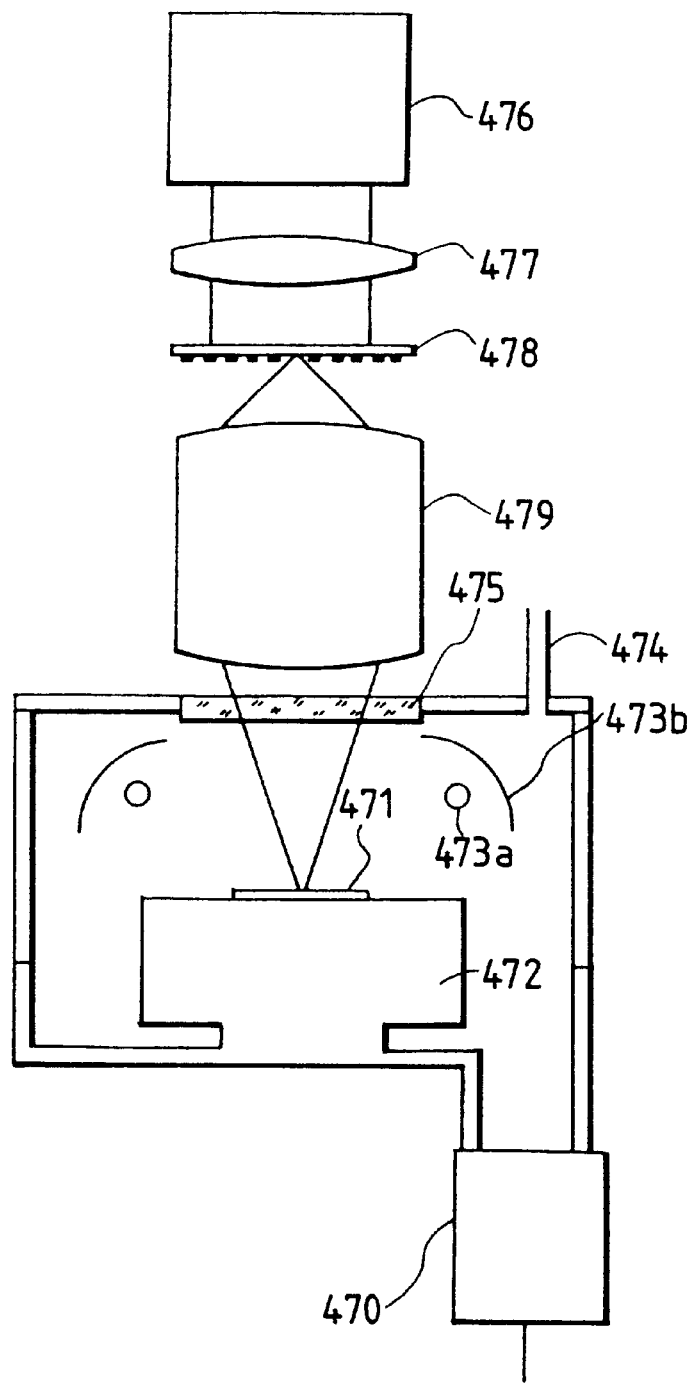

Using as a mask the AlO$_x$ film 466 thus formed, etching making use of Cl$_2$ gas was carried out until the mask disappeared. As a result, as shown in FIG. 21C, the desired pattern was obtained.

Figure 16C:
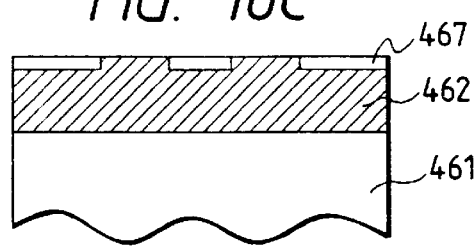
Figure 16G:
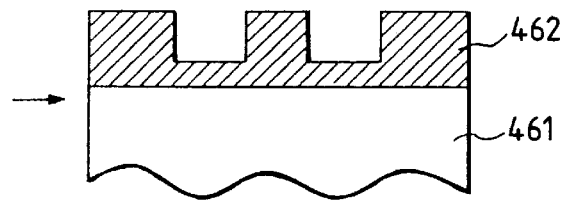

For comparison, an instance in which the processing was carried out without heating the film to be processed is shown in FIGS. 16C and 16G. As is seen from FIGS. 16C and 16G, the pattern as shown in FIG. 16G was obtained from the formation of the protective film 467 with an insufficient degree of oxidation and an insufficient thickness, and it was impossible to obtain the pattern as shown in FIG. 21C.

Example 12

On a transparent electrode ITO-deposited quartz substrate, an a-Si semiconductor layer was formed and thereafter an Al pattern was formed. In this example, the heating was selectively carried out. The process therefor will be described with reference to FIGS. 23A to 23C, 24 and 25.

Figure 23A:
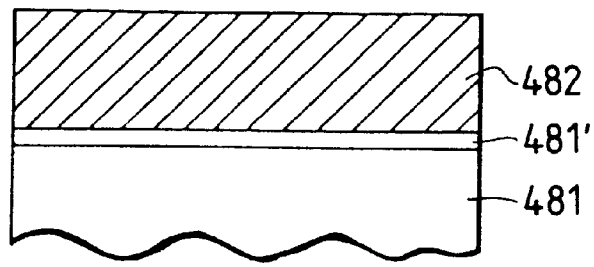
Figure 23B:
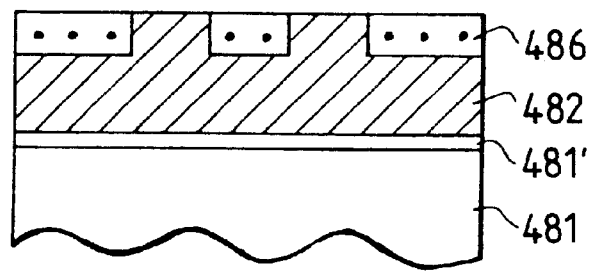
Figure 24:
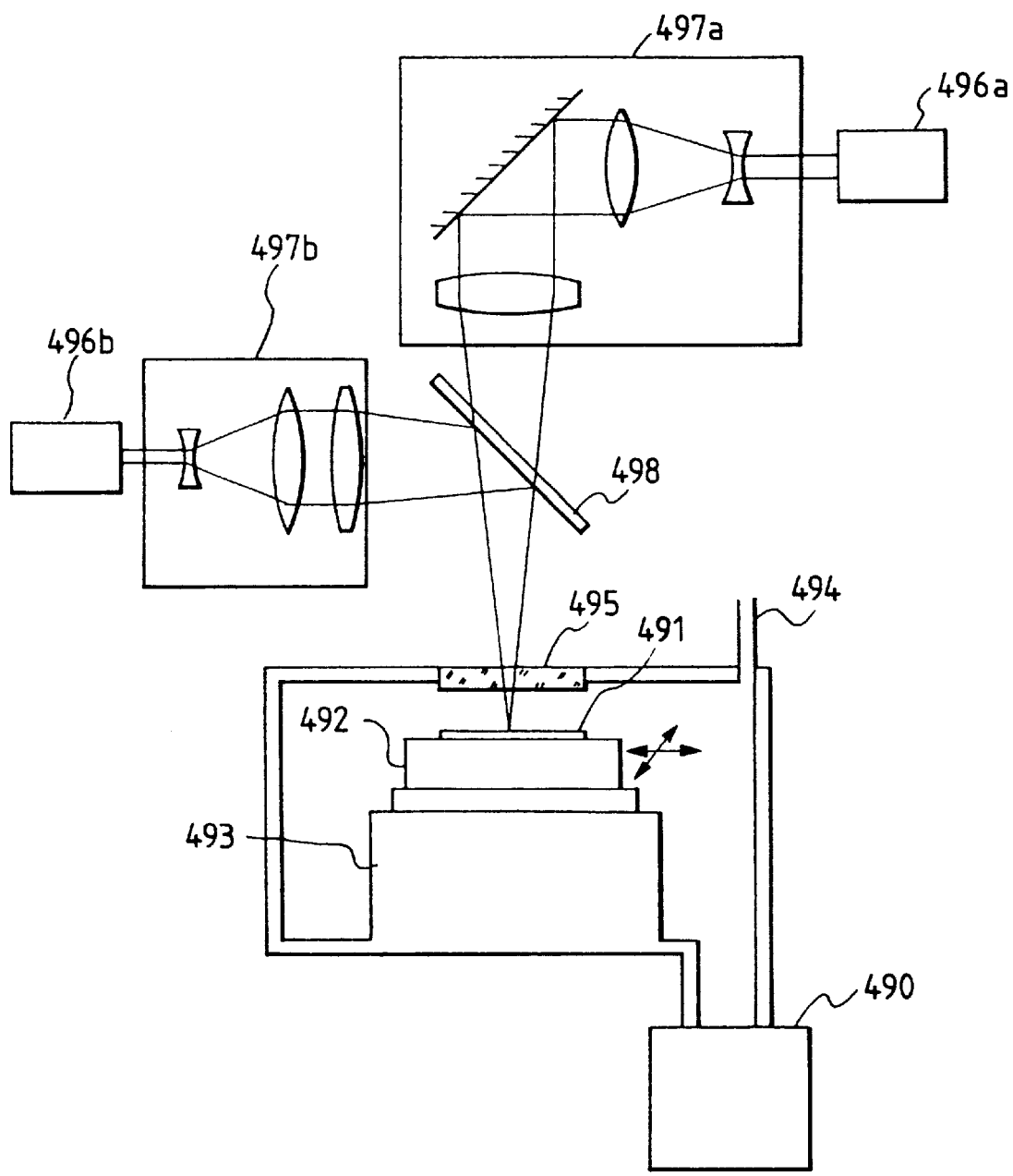

As shown in FIG. 23A, an a-Si film 482 was formed on an ITO 481'-deposited substrate 481 by plasma CVD in a thickness of 6,000 Å. Using this substrate as a sample 491, this sample was subsequently placed on a substrate holder 492 in a surface-modifying device shown in FIG. 24. In FIG. 24, the substrate holder 492 is set on an XY stage 493 that is two-dimensionally movable under control by a computer (not shown). NO$_2$ gas was fed from a gas inlet 494, and a vacuum exhaust system 490 was operated so as for the inside pressure to be adjusted to 10 Torr.

A CO$_2$ laser 496b (a first light source) for heating and a KrF excimer laser (a second light source) for causing photochemical reaction were controlled by a laser control system (not shown) to effect radiation so synchronized that the both lasers reached a peak power at the same time. Infrared light radiated by means of the CO$_2$ laser 496b was so adjusted by the projection optical system 497b to give the desired spot size (3 μm in the present example) on the sample 491. The infrared light came out from the projection optical system was reflected by a transmission reflecting plate 498, and then shed on the sample 491 through the window 495. Here, the transmission reflecting plate is made of a synthetic quartz plate with a thickness of 2 mm. Its transmission reflecting surface is also coated with a high-reflecting film capable of reflecting light with a wavelength of 11.7 to 12.5 μm and transmitting light (248 nm) radiated from the KrF excimer laser 415.

As for the light (248 nm) radiated from the second light source, the KrF excimer laser 496a, the light was shed on the sample 491 through the transmission reflecting plate 498 and the window 495 to give the desired spot size (3 μm in the present example) like the infrared light radiated from the first light source.

The surface irradiated with the light was heated by the above infrared light to cause a rise of temperature to 350° C., so that the infrared light accelerated the photochemical reaction. Two-dimensionally moving the substrate holder 492 set on the XY stage 493, a pattern of a surface-modified layer SiO$_x$ (70 Å) was formed as shown by reference numeral 486 in FIG. 23B.

This surface-modified layer, SiO$_x$ film 486 had undergone sufficient oxidation, also having a layer thickness of 70 Å, and thus served as a non-electron-donor.

Figure 25:
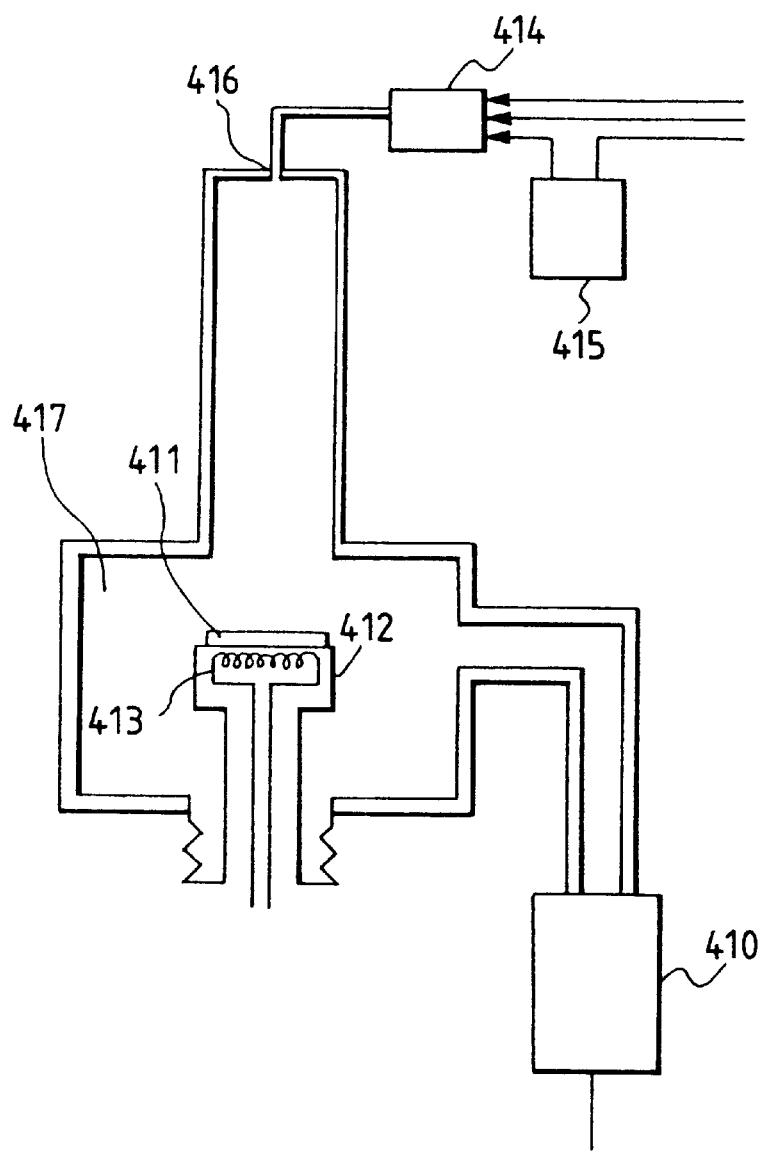
FIG. 25 diagrammatically illustrates a CVD apparatus used for selectively depositing aluminum.

Subsequently this sample 491 was placed on a substrate holder 412 of a CVD apparatus for the selective deposition of Al, shown in FIG. 25, said sample being denoted therein as a sample 411. By the following method, Al was deposited only on the surface of an electron donor and no Al was deposited on the non-electron-donor, thus enabling selective deposition of Al.

First, the inside of a deposition chamber 417 was evacuated to a pressure of $10^{-7}$ Torr or less by means of a vacuum exhaust system 410. Thereafter, the sample 411 was heated with a heater 413d to 300° C. DMAH $(CH_3)_2AlH$, obtained through a material vaporizing system 415 was supplied from a first gas line of a gas mixer 414, using $H_2$ as a carrier gas, and $H_2$ was supplied from a second gas line.

DMAH and $H_2$ were fed from a gas inlet 416 into the deposition chamber 417, and the gas mixer 414 and the vacuum exhaust system 410 were operated so as for the total pressure in the deposition chamber 417 to be adjusted to 1.5 Torr and the partial pressure of DHAM to $1.5 \times 10^{-4}$ Torr, where the deposition was carried out for 10 minutes.

Figure 23C:
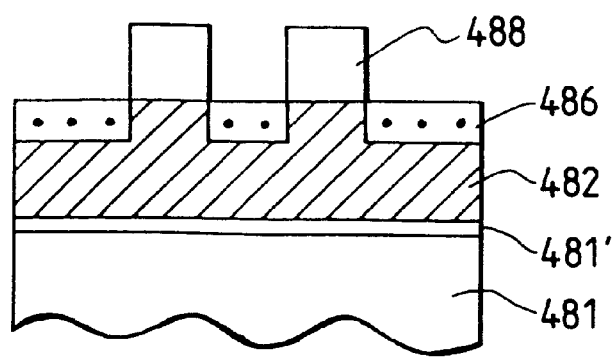

As a result, as shown in FIG. 23C, Al was not deposited at all on the surface of the non-electron-donor $SiO_x$ film 486 to which the surface modification had been applied. Surface analysis made on the surface by Auger electron spectroscopy resulted in no detection of Al. On the other hand, on the surface of the electron donor a-Si film, an Al film with a good quality, containing no carbon at all (below the limit of detection), having a resistivity of 2.7 $\mu\Omega \cdot cm$, an average wiring lifetime of $1 \times 10^3$ to $10^4$ hours and a hillock density of 0 to 10 in number/$cm^2$, and also having caused no spikes, was selectively deposited. Thus it was possible to form an electrode with a good quality (488 in FIG. 23C).

Figure 16D:
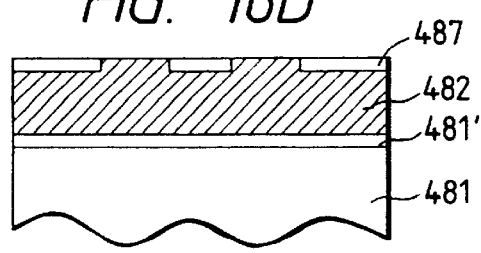
Figure 16H:
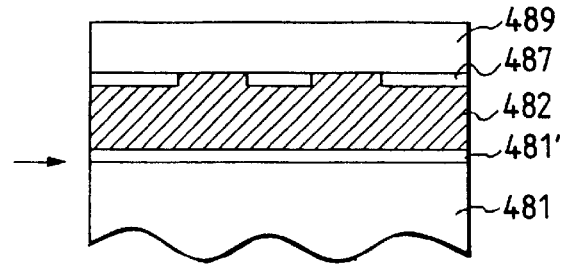

For comparison, an instance in which the surface modification and Al deposition were carried out under the same conditions except that no heating with the $CO_2$ laser was applied is shown in FIGS. 16D and 16H. The surface-modified layer 487 shown in FIG. 16D was so poor in both the degree of oxidation and the thickness that it could not serve as the non-electron-donor, and hence, Al was deposited over the whole surface as shown by reference numeral 489 in FIG. 16H, and it was impossible to obtain the desired pattern.

An example of the processing apparatus to which a further embodiment of the photo-processing method of the present invention can be applied will be described below with reference to FIG. 26.

In the drawing, reference numeral 501 denotes a sample to be processed (a substrate); 502, a sample holder set on a two-dimensionally movable XY stage 503 controlled by a computer (not shown); and 504, a processing chamber that can be vacuum-sealed. Reference numeral 505 denotes a gate valve through which the sample 501 can be carried in, or out of, the processing chamber 504 and that can be vacuum-sealed; 506, a gas inlet from which a reactive gas is fed into the processing chamber 504; 507, a vacuum exhaust system provided with functions of evacuating the inside of the processing chamber 504 and of keeping constant the pressure of the reactive gas fed into the processing chamber 504; and 508, a transmission window through which processing light is transmitted. Reference numeral 509 denotes a $CO_2$ laser for carrying out photo-excitation of a first light source, $NH_3$ laser 510; 511a and 511b, shutters; 512a and 512b, beam correctors for eliminating time and spatial coherency of laser light to make up uniform laser light; and 513a and 513b, projection optical systems. Reference numeral 514 a transmission reflecting plate for mixing two light rays having different wavelengths; 515, a KrF excimer laser, a second light source. Reference numeral 516 denotes a laser control system for controlling the $CO_2$ laser 509 and the KrF excimer laser 515; 517, a shutter control system for controlling the shutters 511a and 511b.

An example of a photo-processing procedure making use of this apparatus will be described. First, the gate valve 505 is opened to place the substrate 501 on the sample holder 502, and the gate valve 505 is closed. Here, the substrate may be a single body, or may be comprised of a base member and a deposited film or the like formed thereon.

The vacuum exhaust system 507 is operated to evacuate the inside of the processing chamber 504 to have the desired pressure. Next, the reactive gas is fed from the gas inlet 506 into the processing chamber 504, and the vacuum exhaust system 507 is operated so as for the inside pressure to be adjusted to the desired pressure. The laser control system 516 is operated to control the $CO_2$ laser 509 and the KrF excimer laser to effect radiation so synchronized that the both lasers reached a peak power at the same time. The light radiated from the $CO_2$ laser 509 is made incident on an $NH_3$ cell provided in the $NH_3$ laser 510 to cause excitation of $NH_3$ gas so that light with a wavelength peculiar to $NH_3$ gas is radiated. The light with this wavelength must be capable of exciting the vibration of molecules that constitute the surface of the substrate. Since the mode of vibration corresponds with that of the molecules constituting the surface of the substrate, the light can be resonantly absorbed, so that the reaction of the substrate with the reactive gas can be accelerated. The light radiated from the first light source $NH_3$ laser 510 enters the shutter 511a, and is modulated according to the opening or closing of the shutter, so that the irradiation on the surface of the substrate 501 can be controlled. The shutters 511a and 511b are controlled by the shutter control system 517, for example, so controlled that they are opened or shut on the same phase. Here, the light is modulated by controlling the shutters 511a and 511b. The light can be modulated also when, without use of the shutters, the radiation from the $CO_2$ laser 509 and the KrF excimer laser 515 is controlled by the laser control system 516. The modulated light is made to have no coherency by means of the beam corrector 512a so as to be spatially uniform, and then is so adjusted by means of the projection optical system 513a as to give the desired spot size on the substrate 501. The light having come out of the projection optical system 513a is reflected on the transmission reflecting plate 514, passed through the the window 508 and shed on the substrate 501. Here, the transmission reflecting plate 514 is made of, for example, a quartz plate with a thickness of 2 mm, and its reflecting surface is coated with a high-reflecting film capable of reflecting the light with a specific wavelength and transmitting the light radiated from the KrF excimer laser 515. The high-reflecting film may preferably be comprised of a reflecting film with a multi-layer structure comprising an inorganic material. The window 508 is constituted of, for example, an NaCl crystal plate. Besides, KCl crystals, $SrF_2$ crystals or the like may also be used as the materials for the window.

In the present invention, the light source for the light that excites the vibration of the surface molecules constituting the substrate may specifically include lasers, lamps, discharge tubes, and synchrotron orbital radiation light (SOR light) generators. The light source is by no means limited to these so long as it can excite the vibration of the surface molecules constituting the the substrate. As for the light radiated from the second light source KrF excimer laser 515, it is set on or off with the shutter 511b on, e.g., the same phase with the light radiated from the first light source, and is made to have no coherency by means of the beam corrector 512b so as to be spatially uniform. Next, the light is led to the projection optical system 513b, passed through the transmission reflecting plate 514 and the window 508, and then shed on the substrate 501 to give the desired spot size in the same way as the light radiated from the first light source. In the present invention, the light source for the light that causes photochemical reaction of the reactive gas with the substrate may specifically include lasers, lamps, discharge tubes, and synchrotron orbital radiation light (SOR light) generators. The light source is by no means limited to these so long as it can cause the photochemical reaction of the reactive gas with the substrate.

Example 13

Figure 26:
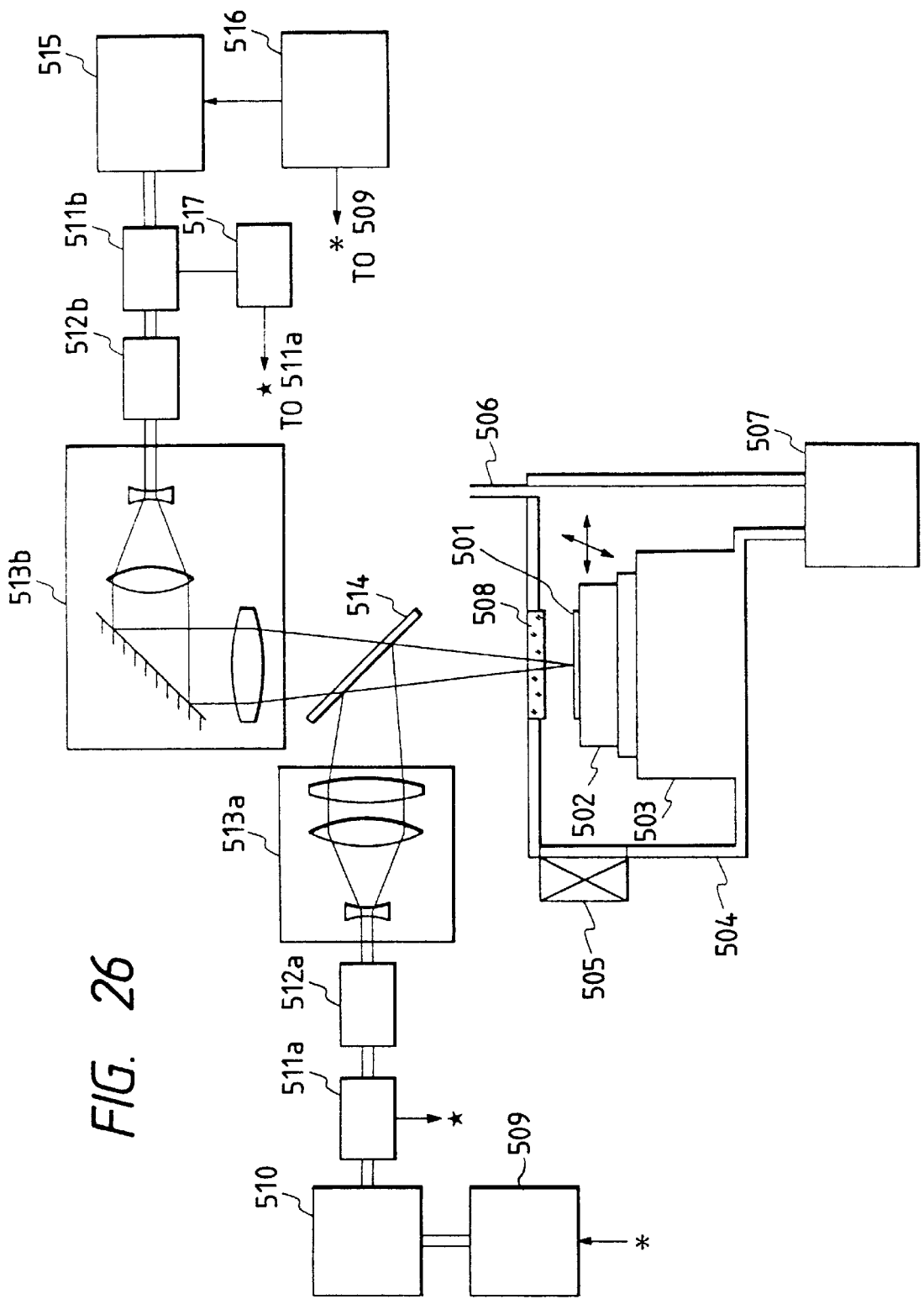
FIG. 26 diagrammatically illustrate an example of a photo-processing apparatus that can preferably carry out the photo-processing according to the present invention.

Using the apparatus shown in FIG. 26, a silicon nitride (SiN) film formed on a silicon substrate was etched.

Here, as the pulse oscillation type $CO_2$ laser 509 for exciting the light from the first light source $NH_3$ laser 510, a laser of 50 W with a frequency of several thousands Hz was used. As the second light source, a KrF excimer laser of 20 W with a frequency of several thousands Hz was used.

First, the gate valve 505 was opened and the sample Si substrate on which the SiN film had been formed was placed on the sample holder 502, and thereafter the gate valve 505 was closed. Next, the vacuum exhaust system 507 was operated to evacuate the inside of the processing chamber 504 to a pressure of $10^{-7}$ Torr or less. Then $Cl_2$ gas was fed from the gas inlet 506 into the processing chamber 504, and the vacuum exhaust system 507 was operated so as for the inside pressure to be adjusted to 50 Torr.

The laser control system 516 was operated to control the $CO_2$ laser 509 and the KrF excimer laser 515 to effect radiation so synchronized that the both lasers reached a peak power at the same time. Infrared light with a wavelength of 10.6 μm, radiated from the $CO_2$ laser 509 was made incident on an $NH_3$ cell provided in the $NH_3$ laser 510 to cause excitation of $NH_3$ gas so that infrared light with a wavelength of 11.7 to 12.5 μm (wave number: 850–800 $cm^{-1}$) was radiated.

The light with this wavelength corresponded with the mode of vibration (~850 $cm^{-1}$) of Si—N bonds, and hence was resonantly absorbed.

The infrared light radiated from the $NH_3$ laser 510 entered the shutter 511a, was made to have no coherency by means of the beam corrector 512a, and then was so adjusted by means of the projection optical system 513a as to give the desired spot size (3 μm in the present example) on the Si substrate 501. The light having come out of the projection optical system 513a was reflected on the transmission reflecting plate 514 comprised of a synthetic quartz plate, was passed through the the window 508 comprised of an NaCl crystal plate and was shed on the Si substrate 501. Here, the reflecting surface of the transmission reflecting plate 514 was coated with a high-reflecting film capable of reflecting the infrared light with a wavelength of 11.7 to 12.5 μm and transmitting the light (248 nm) radiated from the KrF excimer laser 515.

As for the light (248 nm) radiated from the second light source KrF excimer laser 515, it was set on or off with the shutter 511b on the same phase with the infrared light radiated from the first light source, and was passed through the beam corrector 512b. Thereafter, the light was led to the projection optical system 513b, passed through the transmission reflecting plate 514 and the window 508, and then shed on the Si substrate 501 to give the desired spot size (3 μm in the present example) in the same way as the infrared light radiated from the first light source. On the substrate surface irradiated with the infrared light with a wavelength of 11.7 to 12.5 μm and the far ultraviolet light with a wavelength of 248 nm, the electrons excited by the ultraviolet light were exchanged with chlorine atoms, which were incorporated into the SiN film. On the other hand the Si—N bonds in the substrate surface were vibrated and excited by the infrared light, so that the rate of the reaction:

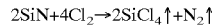

was increased, and it became possible to effect high-rate etching. For comparison with a conventional method, the etching was carried out without irradiation with the infrared light to confirm that an etching rate higher about 20 times than the conventional photo-etching process was obtained in the present example.

During the irradiation, the sample holder 502 set on the XY stage 503 was two-dimensionally moved to effect modulation by operating the shutters, whereby it was possible to form an etching pattern on the SiN film. It was confirmed that the etching was effected only at the region irradiated with light, causing no blur of the image, and in a superior selectivity.

Example 14

As Example 14, an example in which the whole surface of a sample was irradiated with first light for exciting surface vibration and then selectively irradiated through a mask (or a reticle) with second light for causing photochemical reaction will be shown here.

Figure 27:
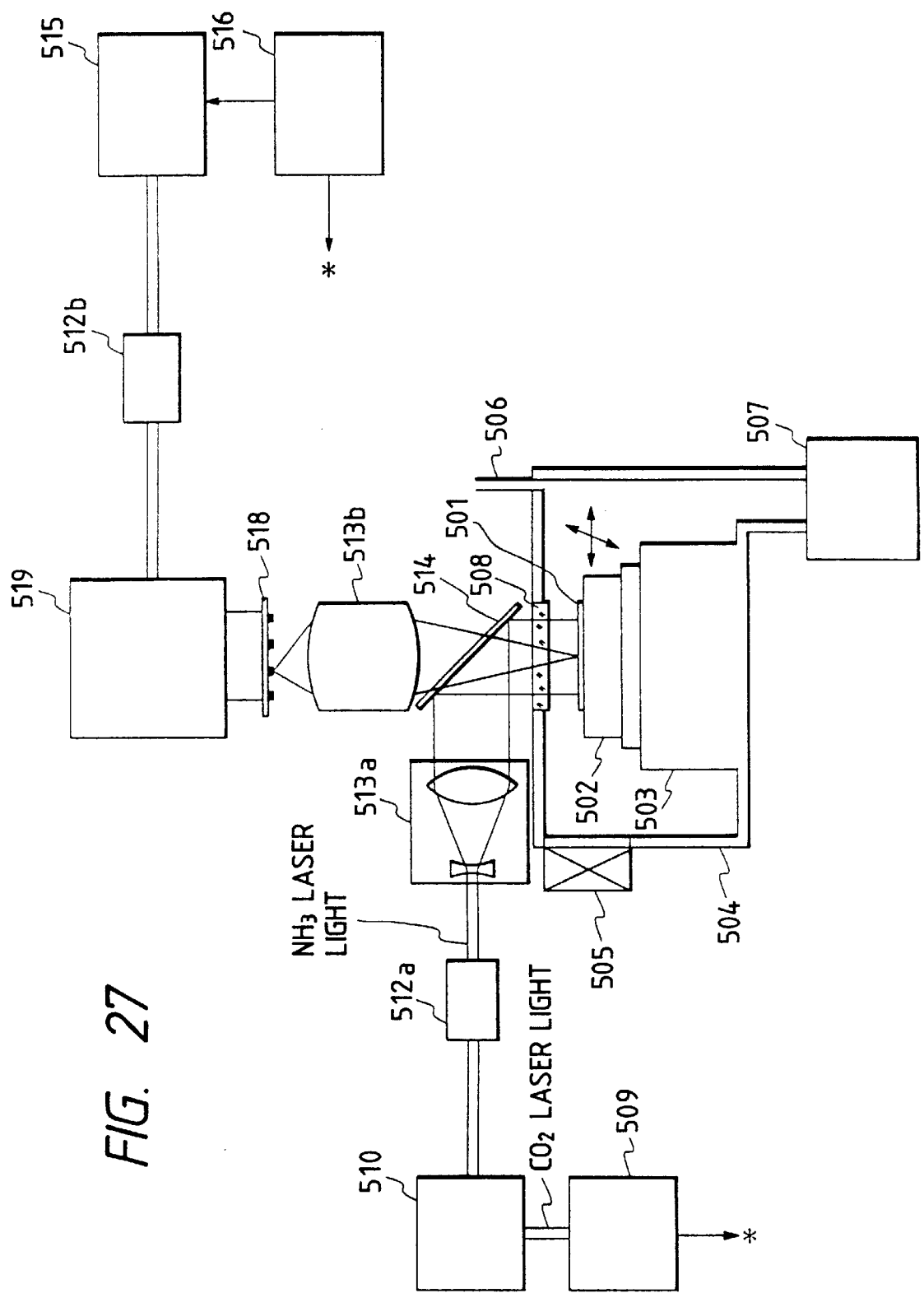
FIG. 27 diagrammatically illustrates another example of the apparatus shown in FIG. 26.

FIG. 27 schematically illustrates the apparatus used. In the drawing, reference numeral 518 denotes a mask (or a reticle) through which the surface of a sample 1 is selectively irradiated with the second light for causing photochemical reaction; 519, an illumination optical system for illuminating the mask. Other components indicated by the same reference numerals as those in FIG. 26 denote the same components.

Using this apparatus, an SiN film formed on an Si substrate was etched.

First, the gate value 505 was opened and the sample Si substrate 501 on which the SiN film had been formed was placed on the sample holder 502. Then the gate valve 505 was closed. The vacuum exhaust system 507 was operated to evacuate the inside of the processing chamber 504 to have a pressure of $10^{-7}$ Torr or less. Thereafter, $Cl_2$ gas was fed from the gas inlet 506 into the processing chamber 504, and the vacuum exhaust system 507 was operated so as for the inside pressure to be adjusted to 50 Torr.

The laser control system 516 was operated to control the $CO_2$ laser 509 and the KrF excimer laser 515 to effect radiation so synchronized that the both lasers reached a peak power at the same time. In the same way as in Example 13, the $NH_3$ laser was operated to take out radiation of infrared light with a wavelength of 11.7 to 12.5 μm (wave number: 850 to 800 $cm^-$), with which the whole surface of the Si substrate was uniformly irradiated through the beam corrector 512a, the projection optical system 513a and the transmission reflecting plate 514.

As for the light (248 nm) radiated from the second light source KrF excimer laser 515, it was passed through the beam corrector 512b and the illumination optical system 519, and then the mask or leticle 518 was uniformly irradiated with the light. The light was further passed through the projection optical system 513b, the transmission reflecting plate 514 and the window 508, so that an image corresponding with the pattern of the mask or leticle 518 was formed on the Si substrate.

The whole surface of the substrate was irradiated with the infrared light with a wavelength of 11.7 to 12.5 µm, where the Si—N bonds on the surface of the SiN film were vibrated and excited, and in addition thereto, the surface irradiated with the light with a wavelength of 11.7 to 12.5 µm was etched under the same reaction as in Example 13.

Example 15

Using the same apparatus as used in Example 14, a latent image comprising an oxide film was selectively formed on a $Si_3N_4$ film formed on the Si substrate.

In the same way as in Example 14, the gate valve 505 was opened and the Si substrate 501 on which the SiN film had been formed was placed on the sample holder 502. Then the gate valve 505 was closed. The vacuum exhaust system 507 was operated to evacuate the inside of the processing chamber 504 to have a pressure of $10^{-7}$ Torr or less. Thereafter, $NO_2$ gas was fed from the gas inlet 506 into the processing chamber 504, and the vacuum exhaust system 507 was operated so as for the inside pressure to be adjusted to 100 Torr.

Next, in the same way as in Example 14, the whole surface of the substrate was irradiated with the infrared light with a wavelength of 11.7 to 12.5 µm, and the surface of the $Si_3N_4$ film formed on the Si substrate was irradiated with the far-ultraviolet light with a wavelength of 248 nm. On the whole surface irradiated with the infrared light, the Si—N bonds on the $Si_3N_4$ film surface were vibrated and excited. On the surface irradiated with the far-ultraviolet light with a wavelength of 248 nm, the photochemical reaction proceeded, so that the oxide film was formed only on the surface irradiated with the far-ultraviolet light. The oxide film formed had a thickness of about 50 Å upon irradiation for about 3 minutes. Thereafter the etching was carried out using as a mask the oxide film thus formed, so that it was possible to carry out mask-less fine processing.

Example 16

Figure 28:
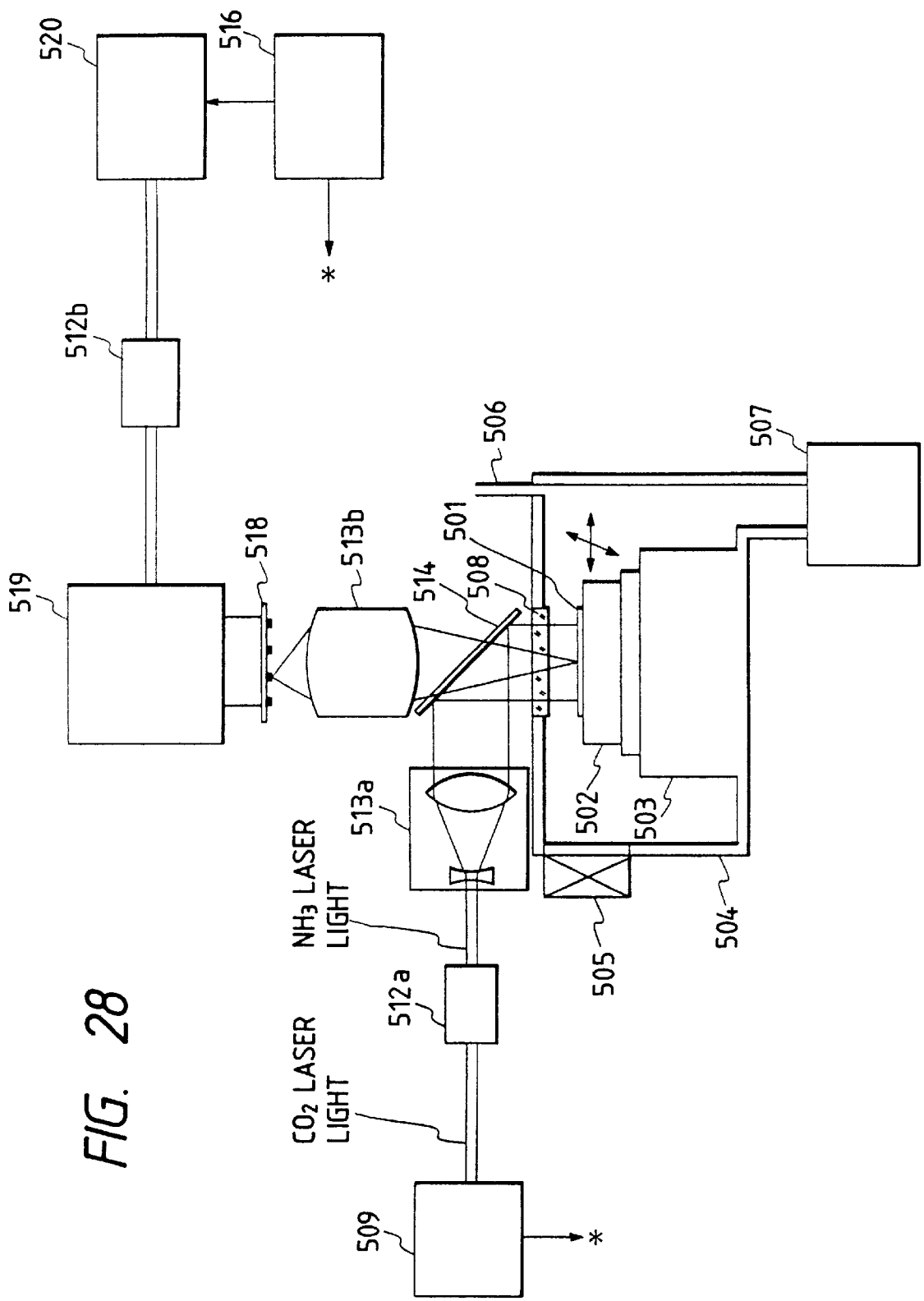
FIG. 28 diagrammatically illustrates still another example of the apparatus shown in FIG. 26.

Using an apparatus shown in FIG. 28, an $SiO_2$ film was etched. In the drawing, a $CO_2$ laser 509 for exciting surface molecules is provided with a Fabry-Pérot etalon to have the structure that the radiation wavelength is variable to a certain extent. In the present example, this was used in such a state that its radiation wavelength is in agreement with a wavelength 9.5 at which the vibration of SiO bonds is absorbed. Reference numeral 520 denotes an ArK excimer laser. Other components indicated by the same reference numerals as those in FIG. 27 denote the same components.

In the same way as in Example 14, the gate valve 505 was opened and the sample Si substrate 501 on which the $SiO_2$ film had been formed was placed on the sample holder 502. Then the gate valve 505 was closed. Thereafter the vacuum exhaust system 507 was operated to evacuate the inside of the processing chamber 504 to have a pressure of $10^{-7}$ Torr or less. Next, $NF_3$ gas and $H_2$ were fed at flow rates of 400 sccm and 50 sccm, respectively, from the gas inlet 506 into the processing chamber 504, and the vacuum exhaust system 507 was operated so as for the inside pressure to be adjusted to 2 Torr.

The laser control system 516 was operated to control the $CO_2$ laser 509 and the ArK excimer laser 520 to effect radiation so synchronized that the both lasers reached a peak power at the same time. The $CO_2$ laser was operated to take out radiation of infrared light with a wavelength of 9.5 µm (wave number: 1,054 $cm^{-1}$), with which the whole surface of the Si substrate was uniformly irradiated through the beam corrector 512a, the projection optical system 513a and the transmission reflecting plate 514.

As for the light (193 nm) radiated from the second light source ArK excimer laser 520, it was passed through the beam corrector 512b and the illumination optical system 519, and then the mask or leticle 518 was uniformly irradiated with the light. The light was further passed through the projection optical system 513b, the transmission reflecting plate 514 and the window 508, so that an image corresponding with the pattern of the mask or leticle 518 was formed on the Si substrate.

The whole surface of the substrate was irradiated with the infrared light with a wavelength of 9.5 µm to vibrate and excite the SiO bonds on the film surface. Meanwhile, on the surface irradiated with the far-ultraviolet light with a wavelength of 193 nm, etching proceeded in a good efficiency.

The etching rate became larger about 8 times than that of conventional photo-etching, and thus it became possible to carry out processing at a high speed.

Besides the example described above, it is possible according to the present invention to carry out processing such as CVD, cleaning, etc. at a high speed.

Figure 29:
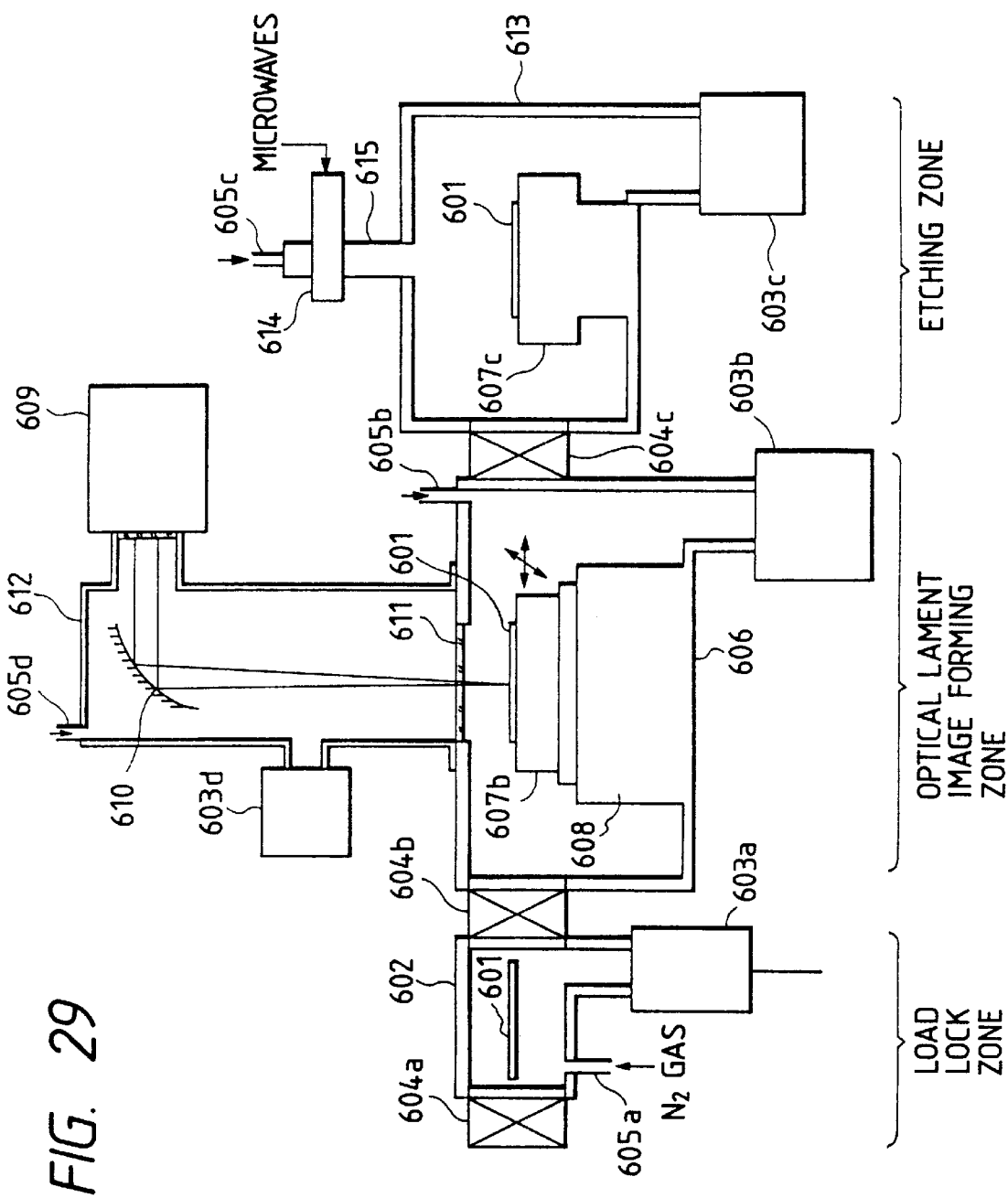
FIG. 29 diagrammatically illustrates a preferred example of a fine-processing apparatus according to the present invention.

A still further embodiment of the processing method according to the present invention will be described below with reference to the drawings. FIG. 29 diagrammatically illustrates another preferred embodiment of the fine-processing apparatus of the present invention. The apparatus shown in FIG. 29 is, roughly stated, comprised of a load lock zone, a latent image forming zone serving as a surface photo-processing zone, and an etching zone.

Here, the load lock zone is not necessarily essential. In the drawing, reference numeral 601 denotes a sample to be processed; 602, a load lock chamber in which the sample 601 is brought to a vacuum environment or returned to the atmospheric environment; 603a, 603b, 603c and 603d, vacuum exhaust systems. Reference numerals 604a, 604b and 604c denote gate valves through which the sample 601 can be taken in and out and that can be vacuum-sealed; 605a, 605b, 605c and 605d, gas inlets from which gas is fed in; and 606, a latent image forming chamber. Reference numerals 607b and 607c denote sample holders; and 608, an XY movement device that can two-dimensionally move the sample holder 607b. Reference numeral 609 denotes a rare gas excimer serving as a light source; 610, a concave mirror serving as an image-forming optical system; 611, a window made of a monocrystalline plate with a thickness of 1 mm; and 612, an optical system vacuum container for preventing absorption of laser light. Reference numeral 613 denotes an etching chamber in which the sample is etched; 614, a microwave gas exciting device; 615, a transport pipe through which excited gas generated in the microwave gas exciting device 614 is transported to the etching chamber 613. Specific examples will be described below.

Example 17

An $SiO_2$ film with a thickness of 1,000 Å was formed on the Si substrate by thermal oxidation, and fine processing was applied to the $SiO_2$ film. The processing was carried out using the apparatus shown in FIG. 29. First, the gate valve 604a was opened, and the sample Si substrate 601 was put in the load lock chamber 602. Thereafter the vacuum exhaust system 603a was operated so as for the inside of the load lock chamber 602 to be adjusted to $10^{-8}$ Torr or less. The latent image forming chamber 606 was previously evacuated to have a pressure of $10^{-8}$ Torr or less by means of the vacuum exhaust system 603b. Subsequently, the gate valve 604b was opened, and the Si substrate 601 was placed on the sample holder 607b. After the gate valve 604b was closed, the vacuum exhaust system 603b was evacuated so as for the inside of the latent image forming chamber 606 to be adjusted to $10^{-8}$ Torr or less. The inside of the optical system vacuum container 612 was evacuated to $10^{-2}$ Torr or less by means of the vacuum exhaust system 603d, and also the vacuum exhaust system 603d was operated so as for a difference in pressure between the optical system vacuum container 612 and the latent image forming chamber 606 to be adjusted to 10 Torr or less. Next, an Ar excimer laser 609, the rare gas excimer laser, was actuated to take out laser light of 50 mJ in energy per pulse, which was converged with the concave mirror 610. With the light thus converged, the Si substrate surface was irradiated on its region of 5 μm in spot size. The radiated light had a wavelength of 126 nm and an energy of 9.8 eV, and hence the Si—O bond energy of the $SiO_2$ film on the sample surface was larger than 8.3 eV, where this bond was cut off to cause deposition of Si. In this example, an Si layer with a thickness of 50 Å was formed. An Si layer with the desired pattern was formed by tow-dimensionally moving the sample holder 607 by means of the XY movement device 608.

After the Si layer with the desired pattern was formed, the gate valve 604c was opened. The sample 601 was put in the etching chamber 613 the inside of which had been evacuated to $10^{-8}$ Torr or less by means of the vacuum exhaust system 603c, and placed on the sample holder 607c. The gate valve 604c was closed, and again the etching chamber 613 was evacuated to $10^{-8}$ Torr or less by means of the vacuum exhaust system 603c. From the gas inlet 605c, etching gas $NH_3$ and $NF_3$ were fed at flow rates of 500 sccm and 100 sccm, respectively, into the microwave gas exciting device 614, and the vacuum exhaust system 603c was operated so as for the inside pressure of the etching chamber 613 to be adjusted to 0.25 Torr. Microwaves of 2.45 GHz and 700 W, generated by means of a microwave generator (not shown) were supplied to the microwave gas exciting device 614 so that the etching gas was made to plasma. The gas excited by plasma was supplied through the transport pipe 615 into the etching chamber 613. As a result, it was possible to selectively etch only $SiO_2$ using the Si layer as a mask to form the desired pattern. It was possible to carry out this processing at a higher speed than the conventional photoetching and also to obtain a nice etched surface. Since the photo-processing was carried out in a high vacuum, the window was not contaminated and it became unnecessary to clean the window.

Example 18

Figure 30:
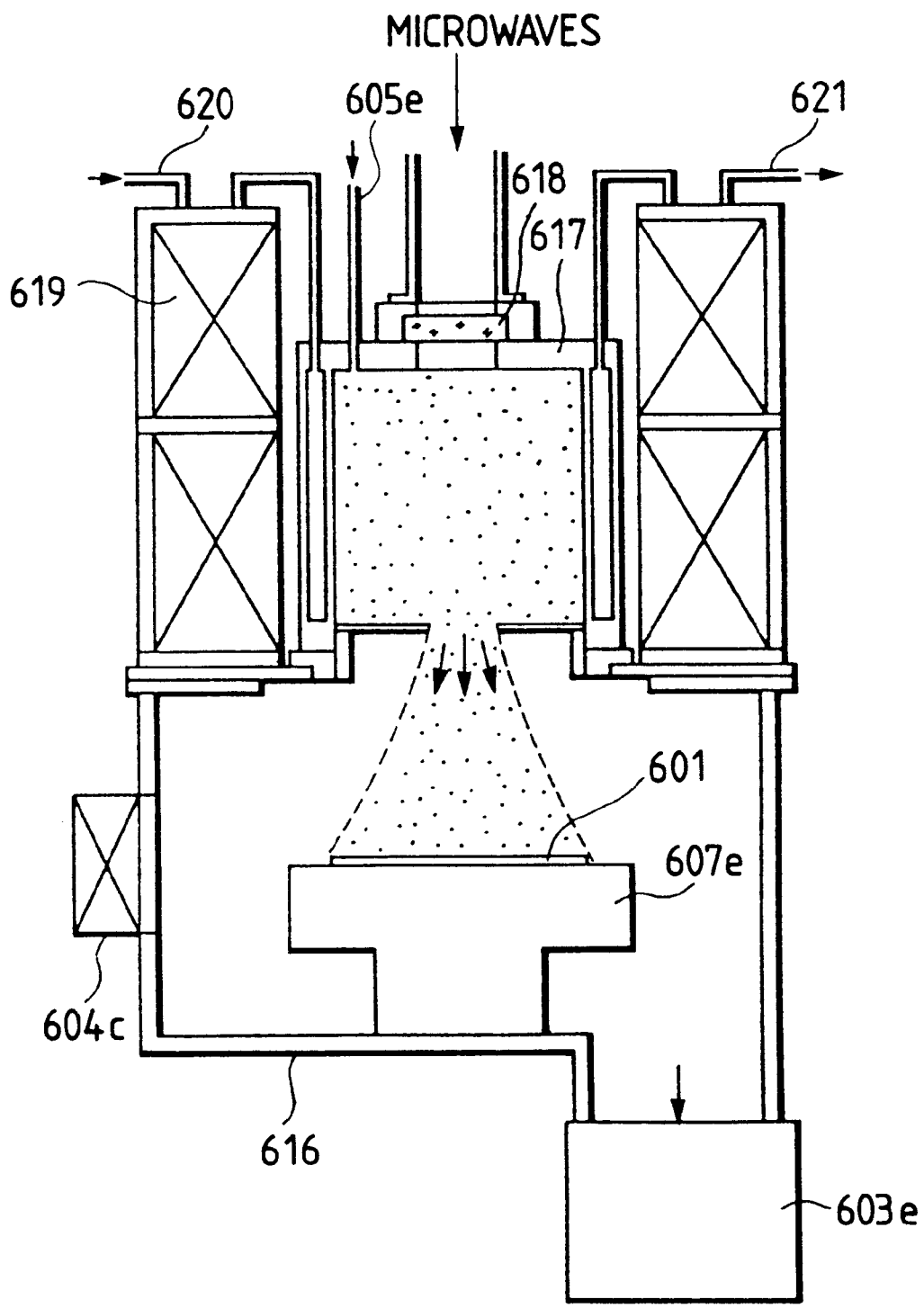
FIG. 30 diagrammatically illustrates an example of a microwave plasma etching apparatus.

Fine processing was applied to an $Si_3N_4$ film deposited on an Si substrate. First, the $Si_3N_4$ film was formed by heat CVD in a thickness of 1,000 Å. Subsequently, in the same way as in Example 17, the sample Si substrate 601 was placed on the sample holder 607b in the latent image forming chamber 606. Thereafter, in the same way as in Example 17, the surface of the Si substrate 601 was irradiated with Ar excimer laser light to cause deposition of Si in the desired pattern. The same effect was also obtained when the Ar excimer laser was replaced with Kr laser light. The reason therefor is that the Si—N bonds can be readily cut off because the Kr laser light has a larger energy (8.5 eV) than the bond energy (4.6 eV) of the Si—N bonds of the $Si_3N_4$ film. Next, etching was carried out using an apparatus in which the etching system serving as the etching zone of the apparatus shown in FIG. 29 was replaced with a microwave plasma etching system as shown in Fig, 30. In FIG. 30, reference numeral 603e denotes a vacuum exhaust system; 650e, a gas inlet; 706e, sample holder; 616, an etching chamber; 617, a plasma chamber in which plasma for etching is generated; and 618, a microwave transmission window through which microwaves are supplied to the plasma chamber. Reference numeral 619 denotes a magnetic coil for producing a magnetic field in the inside of the plasma chamber 617; 620 and 621, a cooling water inlet and a cooling water outlet, respectively, from which cooling water for cooling the magnetic coil 619 and the plasma chamber 617 is fed in and discharged out. Next, in the same way as in Example 17, the Si substrate 601 was placed on the sample holder 607e in the etching chamber 616. Subsequently the gate valve 604c was closed, and the inside of the etching chamber 616 was evacuated to a pressure of $10^{-8}$ Torr or less. From the gas inlet 605e, etching gas, $CF_6$ and $C_2H_4$ were fed at flow rates of 30 sccm and 30 sccm, respectively, into the plasma chamber 617, and the vacuum exhaust system 603e was operated so as for the inside pressure of the etching chamber 616 to be adjusted to $4 \times 10^{-4}$ Torr. In order to cool the magnetic coil 619 and the plasma chamber 617, the cooling water was flowed in from the cooling water inlet 620 and flowed out from the outlet 621. At the same time, the magnetic coil 619 was electrified to produce a magnetic field in the plasma chamber 617. Microwaves of 2.45 GHz and 500 W generated in a microwave generator (not shown) were propagated using a wave guide to supply them to the plasma chamber 617 through the microwave transmission window 618. In the plasma chamber 616, the electric field of the microwaves and the magnetic accelerated electrons in a good efficiency to cause ionization of neutrons, so that dense plasma was generated. The plasma was generated in a better efficiency when the size of the magnetic field was kept to the size of a magnetic field that caused electronic cyclotron resonance (875 Gauss in the case of 2.45 GHz microwaves). The plasma generated in the plasma chamber 617 was spread from the plasma chamber 617 into the etching chamber 616 along the magnetic line of force, and it reached the surface of the $Si_3N_4$ film on the Si substrate 601. Thus, only the $Si_3N_4$ film was selectively etched, and, using the Si layer as a mask, it was possible to effect fine processing with the desired pattern. It was possible to carry out this processing at a higher speed than the conventional photoetching and also to obtain a nice etched surface. Since the gas pressure was as low as $4 \times 10^{-4}$ Torr, ions reached the $Si_3N_4$ film surface without their bombardment with other particles, so that it was possible to carry out etching in a good anisotropy. Since also the ion energy was 10 or so eV, it was possible to carry out etching with less damage.

A still further embodiment of the present invention will be described below in detail with reference to the drawings.

Figure 31:
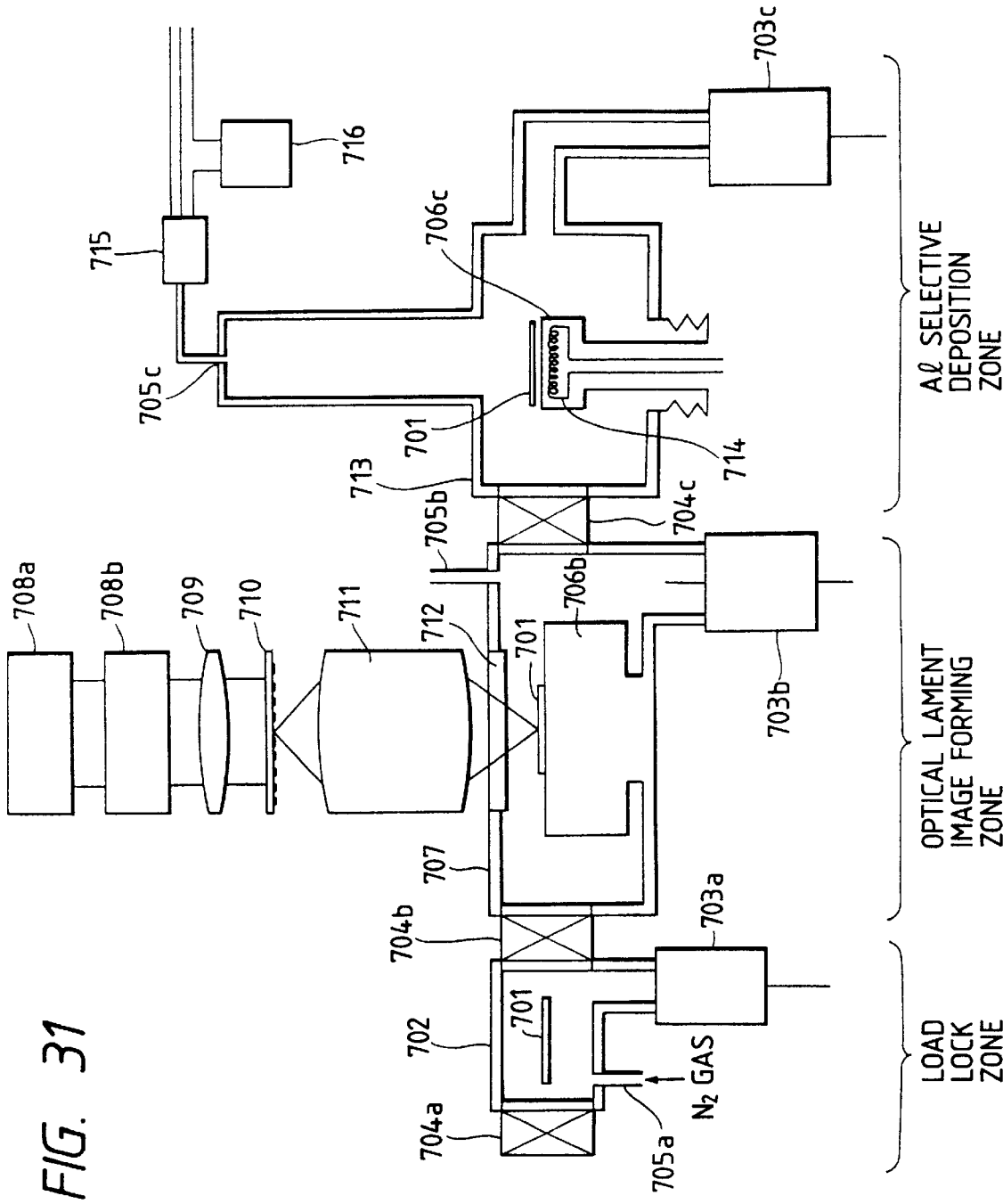
FIG. 31 diagrammatically illustrates the constitution of an apparatus for fabricating a semiconductor device according to the present invention.

FIG. 31 is a schematic cross section of the apparatus according to the present invention, which, roughly stated, comprises a load lock zone, an optical latent image forming zone and an Al selective deposition zone, which are connected with a gate valve adjoiningly each other. In FIG. 31, reference numeral 701 denotes a substrate which is a sample; 702, a load lock chamber in which the substrate 701 is brought to a vacuum environment or returned to the atmospheric environment; 703a, 703b and 703c, vacuum exhaust systems each comprised of a turbo pump, a rotary pump or the like; 704a, 704b and 704c, gate valves through which the substrate 701 can be put in and out and that can be vacuum-sealed; 705a, 705b and 705c, gas inlets from which gas is fed in; 706b and 706c, substrate holders on which the substrate 701 is placed; 707, a latent image forming chamber in which a latent image layer is formed; 708a, an electron synchrotron or electron storage ring that serves as a light source; 708b, a light control section from which the light with a single or plural wavelength(s) (range) that is necessary among synchrotron orbit radiation light is taken out; 709, an illumination optical system for illuminating a mask (or a leticle) 710 patterned with a light-screening material; 711, a projection optical system for forming an image after the mask pattern on the surface of the substrate 701; 712, a window through which the light coming out of the projection optical system 711 is led into the latent image forming chamber 707; 713, an Al selective deposition chamber in which Al or a metal mainly composed of Al is selectively deposited on the electron-donative part formed on the substrate surface; 714, a heater for heating the substrate 701, provided in the substrate holder 706c; 715, a gas mixer in which a starting material gas and a reactive gas are mixed and from which the mixed gas is fed into the Al selective deposition chamber 713; and 716, a starting material gas generator for vaporizing an organic metal into the starting material gas.

In the apparatus shown in FIG. 31, the substrate 701 whose surface has been cleaned is put in the load lock chamber 702 so that the substrate 701 can be fed in a vacuum environment, and the vacuum exhaust system 703a is operated to evacuated the inside of the load lock chamber 702. Then the gate valve 704b is opened, and the substrate 701 is placed on the substrate holder 706a in the latent image forming chamber 707. With the synchrotron orbit radiation light generated in the light source 708a and controlled by the light control section 708b, the mask 710 used for forming the desired pattern is uniformly irradiated through the window 712 to form a pattern image of the mask 709 by means of the projection optical system 711. Materials for the window 712 may vary depending on the wavelength of the light source used, and a window material that does not absorb the light with that wavelength and allows it to pass is selected. The vacuum exhaust system 703b is operated to evacuate the inside of the latent image forming chamber 707, and a gas for photochemically changing the surface (e.g., $O_2$, $O_3$ or $NO_2$ gas when the surface is intended to be oxidized, or $N_2$ or $NH_3$ gas when the surface is intended to be nitrided) is fed into the chamber so that only the part irradiated with the light may selectively undergo photochemical reaction (e.g., oxidation, nitriding, reduction) to form on the surface a latent image layer with a thickness of about 50 Å to about 100 Å formed of an oxide film or a nitride film, thereby selectively changing electron donative properties. Selective oxidation or nitriding of the surface of a metal or semiconductor makes the surface of the metal or semiconductor selectively non-electron-donative. On the other hand, selective reduction of an oxide film or nitride film of a metal or semiconductor makes the corresponding part electron-donative. The wavelength of the synchrotron orbit radiation light for causing the photochemical reaction may be selected according to the materials of the substrates and types of gases.

Next, the substrate 701 is placed on the substrate holder 706c in the Al selective deposition chamber 713 having been evacuated by means of the vacuum exhaust system 703c, and the step of selectively depositing Al or a metal mainly composed of Al is carried out. In this step in the present invention, heat CVD is used so that a good-quality Al film or metal film mainly composed of Al can be selectively formed on the substrate 701 as a conductive deposited film.

Here, to explain the electron donative properties, an electron donative material is a material in which free electrons are present in the substrate or free electrons are intentionally produced therein, and is exemplified by a material having a surface on which the chemical reaction is accelerated by its exchange with molecules of the starting material gas, adsorbed to the substrate surface. For example, in general, metals or semiconductors are included to this material. It also includes those wherein a thin oxide film is present on the surface of a metal or semiconductor. It can be included therein since the chemical reaction takes place upon exchange of electrons between the substrate and adhered material molecules. Such a metal or semiconductor may specifically include semiconductors such as monocrystalline silicon, polycrystalline silicon and amorphous silicon; binary, ternary or quaternary Group III–IV compound semiconductors comprised of any combination of a Group III element Ga, In or Al and a Group IV element P, As or N; and metals, alloys or silicides thereof, such as tungsten, molybdenum, tantalum, tungsten silicide, titanium silicide, aluminum, aluminum silicon, titanium aluminum, titanium nitride, copper, aluminum silicon copper, aluminum palladium, titanium, molybdenum silicide and tantalum silicide.

On the substrate having such an electron-donative surface, Al or the metal mainly composed of Al can be deposited only upon simple thermal reaction in a reaction system comprised of the starting material gas and $H_2$. For example, the thermal reaction in a reaction system comprised of DMAH (dimethylaluminum hydride) and $H_2$ is presumed to basically proceed as follows:

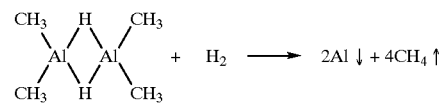

The DMAH assumes a dimer structure at room temperature. It was also confirmed that $MMAH_2$ (monomethylaluminum hydride) enabled deposition of high-quality Al by thermal reaction, as will be shown in examples described later.

The above $MMAH_2$ has a vapor pressure of as low as 0.01 to 0.1 Torr at room temperature and hence it is difficult to transport the starting material in a large quantity, and its rate of deposition is several hundred Å/min at maximum in the present invention. Accordingly, it is most preferred to use DMAH having a vapor pressure of 1 Torr at room temperature.

The temperature at which the substrate is heated with the heater 714 to deposit Al should be higher than the temperature at which a starting material gas containing Al can be decomposed, and not higher than 450° C. Stated specifically, the substrate temperature should be 160° C. to 450° C. When Al is deposited under such conditions, the rate of deposition can be very high, as much as 100 Å/min to 800 Å/min, at a DMAH partial pressure of $10^{-4}$ to $10^{-3}$ Torr, and hence it is possible to attain a sufficiently high deposition rate for an Al deposition technique used for VSLIs. More preferably, the substrate temperature should be 270° C. to 350° C. Al films deposited under such conditions can be Al films with a good quality, capable of being strongly oriented and also causing no hillocks or spikes in the Al film formed on the Si monocrystalline or Si polycrystalline substrate even when heated at 450° C. for 1 hour. Such Al films can also be excellent in electromigration resistance.

Next, in order to produce starting material gas, liquid DMAH maintained at room temperature in the gas producing chamber 716 is subjected to bubbling with $H_2$ or Ar (or other inert gas) serving as a carrier gas to produce the DMAH used for deposition on the substrate. This is transported to the gas mixer 715. The $H_2$ serving as the reactive gas is fed from ano ther route to the gas mixer 715. Flow rates of gases are so controlled that each gas has the desired value of partial pressure, and the vacuum exhaust system 703c is operated so as for the total pressure to be kept to a given pressure ($10^{-3}$ to 760 Torr).

Thus, the starting material gas and reactive gas are thermally reacted on the heated substrate surface so that the Al or metal mainly composed of Al is selectively deposited on the surface except the non-electron-donative surface formed in the precedent step, in other words, only on the electron-donative surface formed in the precedent step. The Al-deposited film thus formed has a resistivity of 2.7 $\mu\Omega$·cm to 3.0 $\mu\Omega$·cm at room temperature when its layer thickness is 400 Å, which is substantially equal to the resistivity of an Al bulk, thus giving a continuous and flat film. Here, the pressure at the time of film formation can be selected within the range of $10^{-3}$ Torr to 760 Torr. Even if the layer thickness is 1 $\mu$m, the resistivity can also be approximately 2.7 $\mu\Omega$·cm to 3.0 $\mu\Omega$·cm at room temperature, and a sufficiently dense film can be formed even with such a layer thickness. Reflectance in the visible light wavelength region is substantially 80%, and a thin film with a good surface flatness can be formed by deposition.

As described above, the film obtained by the metal forming method used in the present invention is dense, has impurities such as carbon in a very small content, has a resistivity comparable to that of a bulk, and also has characteristics with a very high surface smoothness. Thus, the film can have remarkable effect as stated below.

(i) Decrease in Hillocks:

Hillocks are projections produced on the Al surface because of partial migration of Al when the release of internal stress occurs during the film formation. A similar phenomenon may also occur when local migration takes place as a result of electrification. The Al film formed by the above method has little internal stress and also is nearly in a monocrystalline state. Hence, conventional Al films may cause hillocks of $10^4$ to $10^6$ in number/cm$^2$ as a result of heating at 450° C. for 1 hours. On the other hand, according to the method of the present invention, the hillocks can be greatly reduced to 0 to 10 in number/cm2. Thus, since there is little surface irregularities on the Al surface, resist films or interlayer insulating films can be made into thin films. This is advantageous for making films finer and flatter.

(ii) Improvement in Electromigration Resistance:

Electromigration is a phenomenon resulting from the migration of wiring atoms caused by the flowing of high-density currents. This phenomenon causes generation and growth of voids along grain boundaries, resulting in a decrease in cross sectional areas, which is accompanied with heat generation and disconnection of wiring.

The electromigration resistance is commonly evaluated on the basis of average wiring lifetime.

The wiring formed by a conventional method has an average wiring lifetime of $1\times10^2$ to $10^3$ hours (in the case of a wire cross-sectional area of 1 $\mu$m$^2$) under electrification test conditions of 250° C. and $1\times10^6$ A/cm$^2$. On the other hand, the Al film obtained by the metal film forming method used in the present invention has achieved an average wiring lifetime of $10^3$ to $10^4$ hours in wiring with a cross-sectional area of 1 $\mu$m$^2$.

Thus, according to the method of the present invention, the wiring can be well suited for practical use if it has a layer thickness of 0.3 $\mu$m in the case of a wiring width of 0.8 $\mu$m. Namely, since the wiring layer thickness can be made small, the irregularities that may be present on the surface of a semiconductor after the wiring has been provided can be prevented to a minimum and also a high reliability can be obtained when usual electric currents are flowed. In addition, a very simple process can be satisfactory for the purpose.

As described above in detail, employment of the above method in the method of forming the wiring of a semiconductor integrated circuits can bring about a great improvement in yield and a promotion of cost reduction, compared with conventional Al wiring.

Employment of this method also makes it possible to greatly simplify the fabrication process and form Al electrodes or wiring in a good quality without use of photolithography or etching making use of a resist, so that the performance and yield of devices can be greatly improved.

In the present invention, as shown in FIG. 31, the optical latent image forming zone is connected with the Al selective deposition zone through the gate valve so that the process can be continuously carried on. The same effect, can be obtained also when they are independently constructed, though accompanied with a little increase in the number of steps.

Figure 32:
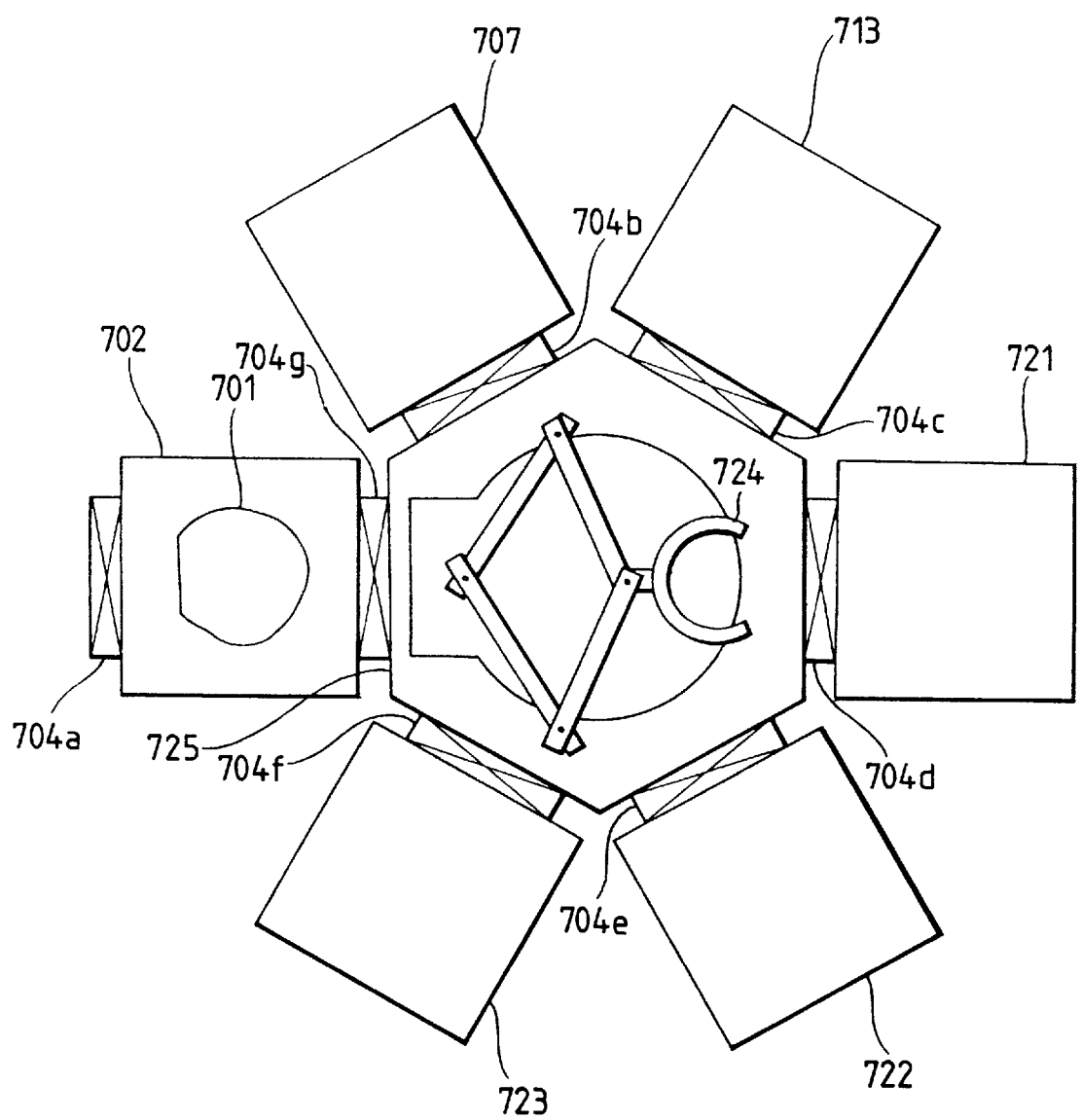
FIG. 32 diagrammatically illustrates the constitution of the main part of a fabrication apparatus wherein the present invention is applied to a vacuum through-process.

FIG. 32 schematically illustrates the whole of the present apparatus, i.e., a vacuum through-processing apparatus. Reference numeral 721 denotes a plasma film forming chamber in which an insulating film and a semiconductor film are formed by plasma deposition, that can be vacuum-sealed; 722, an etching chamber in which films are processed by chemical dry etching, that can be vacuum-sealed; 723, a cleaning chamber in which the surfaces of samples are cleaned using plasma, that can be vacuum-sealed; 724, a transport assembly for transporting the substrate 701 to each processing chamber; and 725, a transport chamber that can be vacuum-sealed, provided with the transport assembly 724. Reference numerals 704d, 704e, 704f and 704g each denote a gate valve through which the substrate 701 can be put in and out, that can vacuum-seal each chamber. Other components indicated by the same reference numerals as those in FIG. 31 denote the same components.

Since, in general, the photolithography making use of a resit can not be carried out in vacuum, it has been hitherto-fore impossible to carry out in vacuum the whole process for fabricating a device. Application of the process according to the method of the present invention makes it possible to carry out a vacuum through-processing.

This embodiment will be more specifically described below by giving examples.

Example 19

An example will be described in which, using the apparatus as shown in FIG. 31, an Al electrode pattern is formed on a Si substrate 701 on which an n$^+$a-Si film (n$^+$ amorphous silicon film) with a thickness of 2,000 Å has been deposited.

First, the gate valve 704a was opened, and the Si substrate 701 was put in the load lock chamber 702. The gate valve 704a was closed, and the vacuum exhaust system 703a was operated to evacuate the inside of the load lock chamber 702 to a pressure of $10^{-7}$ Torr or less. The vacuum exhaust system 703b was operated to previously evacuate the inside of the latent image forming chamber 707 to a pressure of $10^{-8}$ Torr or less. The gate valve 704b was opened and the Si substrate 701 was placed on the substrate holder 706b. $O_2$ gas was fed from the gas inlet 705b into the latent image forming chamber 707, and the vacuum exhaust system 703b was operated so as for the inside pressure to be adjusted to 20 Torr. Using an electron synchrotron as the light source 708a, light with a wavelength of 160 nm to 260 nm was selected in the light control section 708b, with which the mask 710 for forming the electrode pattern was uniformly irradiated by means of the illumination optical system 709. A pattern image of the mask 715 was formed on the surface of the n⁺a-Si film through the window 712 by means of the projection optical system 711. As a material for the window, quartz was used. On the surface of the n⁺a-Si film on which the mask image had been formed, $O_2$ and Si caused photochemical reaction only at the part irradiated with the light, and upon exposure for 10 minutes an $SiO_2$ layer with a thickness of about 80 Å was formed on the n⁺a-Si film surface. This reaction did not proceed at the part not irradiated with the light. Hence, the Si was consequently converted to $SiO_2$ to form a latent image only in the region irradiated with the light on the surface of the n⁺a-Si film, and thus a non-electron-donative layer was formed there. In other words, this means that a negative pattern of the mask pattern was formed on the n⁺a-Si film surface. After the formation of the latent image, the gas supply was stopped, and the inside of the latent image forming chamber 707 was evacuated to a pressure of $10^{-7}$ Torr or less. The vacuum exhaust system 703c was operated to previously evacuate the inside of the Al selective deposition chamber 713 to a pressure of $10^{-7}$ Torr or less. The gate valve 704c was opened and the Si substrate 701 was placed on the substrate holder 706c having been previously heated to 300° C. by means of the heater 714 provided inside the Al selective deposition chamber 713. The gate valve 704c was closed and the inside of the Al selective deposition chamber 713 was evacuated to a pressure of $10^{-8}$ Torr or less by means of the vacuum exhaust system 703c. Using $H_2$ as a carrier gas, DMAH was supplied from a first gas line of the gas mixer 715, and $H_2$ was supplied from a second gas line thereof. After the temperature of the Si substrate 701 reached 300° C., DMAH and $H_2$ were fed from the gas inlet 705c into the Al selective deposition chamber 713. Then the gas mixer 715 and the vacuum exhaust system 703c were operated so as for the total pressure in the Al selective deposition chamber 713 and the partial pressure of DMAH to be adjusted to 1.5 Torr and $1.5 \times 10^{-4}$ Torr, respectively. After deposition was carried out for 10 minutes, the supply of DMAH was stopped, and then the heating with the heater 714 was stopped to cool the Si substrate 701. The supply of $H_2$ was stopped, and the inside of the Al selective deposition chamber 713 was evacuated to a pressure of $10^{-7}$ Torr or less by operating the vacuum exhaust system 703c. The gate valves 704c and 704b were opened, and the Si substrate 701 was put in the load lock chamber 702. Then the gate valve 704b was closed, and $N_2$ gas was fed from the gas inlet 705a until the inside reached the atmospheric pressure. Then the gate valve 704a was opened to take out the Si substrate 701. As a result, No Al was deposited at all on the surface provided with the latent image, and also was not detectable by surface analysis using Auger electron spectroscopy. On the other hand, on the surface of the a-Si film, an Al film with a good quality, containing no carbon at all (below detection limit), having a resistivity of 2.7 $\mu\Omega$·cm, an average wiring life time of $1 \times 10^3$ to $10^4$ hours and a hillock density of 0 to 10 in number/cm² and being free from occurrence of spikes, was selectively deposited to form the electrode.

Example 20

An example will be described in which, using the apparatus as shown in FIG. 31, an Al electrode pattern is formed on a GaAs substrate.

First, the gate valve 704a was opened, and a GaAs substrate 701 having been previously cleaned was put in the load lock chamber 702. The gate valve 704a was closed, and the vacuum exhaust system 703a was operated to evacuate the inside of the load lock chamber 702 to a pressure of $10^{-7}$ Torr or less. The vacuum exhaust system 703b was operated to previously evacuate the inside of the latent image forming chamber 707 to a pressure of $10^{-8}$ Torr or less. The gate valve 704b was opened and the GaAs substrate 701 was placed on the substrate holder 706b. $NO_2$ gas was fed from the gas inlet 705b into the latent image forming chamber 707, and the vacuum exhaust system 703b was operated so as for the inside pressure to be adjusted to 20 Torr. Using an electron synchrotron as the light source 708a, light with a wavelength of 300 nm to 600 nm was selected in the light control section 708b, with which the mask 710 for forming the electrode pattern was uniformly irradiated by means of the illumination optical system 709. A pattern image of the mask 715 was formed on the surface of the GaAs substrate 701 through the window 712 by means of the projection optical system 711. As a material for the window, quartz was used. On the surface of the GaAs substrate 701 irradiated with the light, $NO_2$ and Si caused photochemical reaction only at the part irradiated with the light, and an oxide film with a thickness of about 100 Å was formed on the GaAs substrate 701 surface. After the formation of the latent image, the gas supply was stopped, and the inside of the latent image forming chamber 707 was evacuated to a pressure of $10^{-7}$ Torr or less. The vacuum exhaust system 703c was operated to previously evacuate the inside of the Al selective deposition chamber 713 to a pressure of $10^{-7}$ Torr or less. The gate valve 704c was opened and the GaAs substrate 701 was placed on the substrate holder 706c having been previously heated to 300° C. by means of the heater 714 provided inside the Al selective deposition chamber 713. The gate valve 704c was closed and the inside of the Al selective deposition chamber 713 was evaluated to a pressure of $10^{-8}$ Torr by means of the vacuum exhaust system 703c. Using $H_2$ as a carrier gas, DMAH was supplied from a first gas line of the gas mixer 715, and $H_2$ was supplied from a second gas line thereof. After the temperature of the GaAs substrate 701 reached 300° C., DMAH and $H_2$ were fed from the gas inlet 705c into the Al selective deposition chamber 713. Then the gas mixer 715 and the vacuum exhaust system 703c were operated so that the total pressure in the Al selective deposition chamber 713 and the partial pressure of DMAH is adjusted to 1.5 Torr and $1.5 \times 10^{-4}$ Torr, respectively. After deposition was carried out for 10 minutes, the supply of DMAH was stopped, and then the heating with the heater 714 was stopped to cool the GaAs substrate 701. The supply of $H_2$ was stopped, and the inside of the Al selective deposition chamber 713 was evacuated to a pressure of $10^{-7}$ Torr or less by operating the vacuum exhaust system 703c. The gate valves 704c and 704b were opened, and the GaAs substrate 701 was put in the load lock chamber 702. Then the gate valve 704b was closed, and $N_2$ gas was fed from the gas inlet 705a until the inside reached the atmospheric pressure. Then the gate valve 704a was opened to take out the GaAs substrate 701. As a result, it was possible to form an Al film with a good quality, like the Al film in Example 19.

Example 21

According to the method of the present invention, an amorphous silicon photosensor was fabricated using the vacuum through-processing apparatus shown in FIG. 32. Its process will be described with reference to FIGS. 33A to 33E that show a schematic process chart. The gate valve 704a was opened, and a quartz substrate 701 having been previously cleaned was put in the load lock chamber 702. The gate valve 704a was closed, and the vacuum exhaust system 703a was operated to evacuate the inside of the load lock chamber 702 to a pressure of $10^{-7}$ Torr or less. The inside of the transport chamber 725 was previously evacuated to always keep the pressure to $10^{-7}$ Torr or less by means of a vacuum exhaust system (not shown). The gate valve 704g was opened and the sample quartz substrate 701 was taken out of the load lock chamber 702 by means of the transport assembly 724. Then the gate valve 704f was opened, and the substrate 701 was moved through the transport chamber 725 to the cleaning chamber 723 previously evacuated to a pressure of $10^{-7}$ Torr or less by means of the vacuum exhaust system 703f, and placed on the substrate holder 706f. Then the gate valve 704f was closed. The vacuum exhaust system 703f was operated to evacuate the inside of the cleaning chamber 723 to a pressure of $10^{-8}$ Torr or less. A gas (in this instance, Ar at a flow rate of 50 sccm) for cleaning the surface of the quartz substrate 701 was led from the gas inlet 705f into the cleaning chamber 723, and an vacuum exhaust system (not shown) was operated so as for the pressure in the cleaning chamber 723 to be adjusted to 0.08 Torr. Next, a current with a high frequency of 13.56 MHz and 100 W generated in the high-frequency power source was applied to the substrate holder while making adjustment of the matching box, to generate plasma in the space between the substrate holder and the counter electrode. Since the substrate holder was insulated by a capacitor in a direct-current fashion, a negative DC bias voltage of about −60 kV was generated in the substrate holder 706f because of the difference in mobility between electrons and ions. Because of this voltage, Ar ions were accelerated and they collided against the surface of the the quartz substrate 701, so that the stain present on the surface was physically removed by sputtering and thus a cleaned surface was obtained. The processing time was about 3 minutes. After completion of this processing, the gas supply was stopped, and the inside of the cleaning chamber 723 was evacuated to a pressure of $10^{-7}$ Torr or less. The gate valve 704f was opened, and the quartz substrate 701 was taken out by means of the transport assembly 724. Then the gate valve 704f was closed, and the inside of the cleaning chamber 723 was kept evacuated to a pressure of $10^{-7}$ Torr or less.

Figure 33A:
FIGS. 33A to 33E are a schematic process chart to show a procedure for the fabrication of an amorphous silicon photosensor fabricated using the method of the present invention.

The vacuum exhaust system was operated to previously evacuate the inside of the plasma chamber 721 to a pressure of $10^{-7}$ Torr or less. The gate valve 704d was opened. The quartz substrate 701 was led into the plasma film forming chamber 721, and placed on the substrate holder having been previously heated to 350° C. by means of a heater. Then the gate valve 704d was closed. The inside of the plasma film forming chamber 721 was evaluated to a pressure of $10^{-7}$ Torr or less by means of the vacuum exhaust system, and the quartz substrate 701 was heated until its temperature reached 350° C. $SiH_4$, $H_2$ and $NH_3$ were fed at flow rates of 10 sccm, 100 sccm and 300 sccm, respectively, into the plasma film forming chamber 721, and the vacuum exhaust system was operated so as for the pressure in the plasma film forming chamber 721 to be adjusted to 0.2 Torr. A current with a high frequency of 13.56 MHz and 50 W generated in the high-frequency power source was applied to the counter electrode while making adjustment of the matching box, to generate plasma in the space between the substrate holder and the counter electrode. The gases fed in were decomposed with the plasma to deposit an amorphous silicon nitride (a-SiN) film 734 in a thickness of 1,000 Å (FIG. 33A). After the film was formed, the gas supply was stopped, and the vacuum exhaust system was operated to evacuate the inside of the plasma film forming chamber 721 to a pressure of $10^{-7}$ Torr or less. Then the gate valve 704d was opened, and the quartz substrate 701 was taken out by means of the transport assembly 724. The gate valve 704d was closed, and the plasma film forming chamber 721 was evacuated so as for its inside pressure to be kept at $10^{-7}$ Torr or less.

Figure 33B:
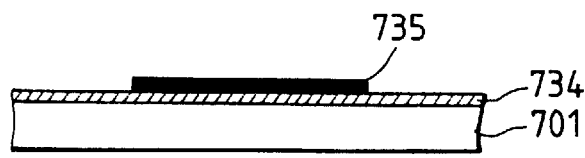

Next, the latent image forming chamber 707 was previously evacuated to a pressure of $10^{-7}$ Torr or less by means of the vacuum exhaust system 703d. The gate valve 704b was opened. The quartz substrate 701 was led into the latent image forming chamber 707 by means of the transport assembly 724, and placed on the substrate holder 706b. Then the gate valve 704b was closed. The vacuum exhaust system 703b was operated to evacuate the inside of the latent image forming chamber 707 to a pressure of $10^{-7}$ Torr or less. In the same way as in Example 19, a latent image was formed on an a-SiN film 734. The gate valve 704b was opened and the quartz substrate 701 was taken out by means of the transport assembly 724. Then the gate valve 704b was closed, and the latent image forming chamber 707 was evacuated so as for its inside pressure to be kept at $10^{-7}$ Torr or less. The vacuum exhaust system 703c was operated to previously evacuate the inside of the Al selective deposition chamber 713 to a pressure of $10^{-7}$ Torr or less. The gate valve 704c was opened. The quartz substrate 701 was led into the Al selective deposition chamber 713 by means of the transport assembly 724 and was placed on the substrate holder 706c. Then the gate valve 704c was closed. The vacuum exhaust system 703c was operated to evacuate the inside of the Al selective deposition chamber 713 to a pressure of $10^{-8}$ Torr or less. In the same way as in Example 19, an Al lower electrode 735 with a thickness of 3,000 Å was formed as shown in FIG. 33B. The gate valve 704c was opened, and the quartz substrate 701 was taken out by means of the transport assembly 724. Then the gate valve 704c was closed. The Al selective deposition chamber 713 was evacuated so as for its inside pressure to be kept at $10^{-7}$ Torr or less.

Figure 33C:
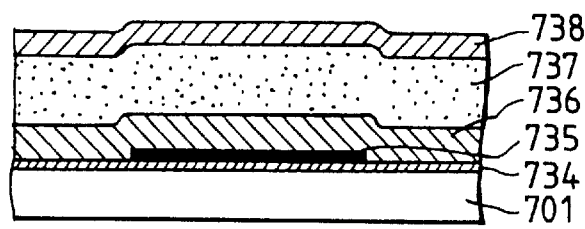

Next, the gate valve 704d was opened. The quartz substrate 701 was led into the plasma film forming chamber 721 by means of the transport assembly 724, and was placed on the substrate holder previously heated to 350° C. with a heater. Then the gate valve 704d was closed. The inside of the plasma film forming chamber 721 was evaluated to a pressure of $10^{-7}$ Torr or less by means of the vacuum exhaust system, and the quartz substrate 701 was heated until its temperature reached 350° C. $SiH_4$, $H_2$ and $NH_3$ were fed at flow rates of 10 sccm, 100 sccm and 300 sccm, respectively, from the gas inlet into the plasma film forming chamber 721, and the vacuum exhaust system was operated so as for the pressure in the plasma film forming chamber 721 to be adjusted to 0.2 Torr. A current with a high frequency of 13.56 MHz and 50 W generated in the high-frequency power source was applied to the counter electrode while making adjustment of the matching box, to generate plasma in the space between the substrate holder and the counter electrode. The gases fed in were decomposed with the plasma to deposit an amorphous silicon nitride (a-SiN) film 736 in a thickness of 3,000 Å as shown in FIG. 33C. After the film was formed, the gas supply was stopped, and the vacuum exhaust system 703d was operated to evacuate the inside of the plasma film forming chamber 721 to a pressure of $10^{-7}$ Torr or less. Then the temperature of the substrate holder 706 was dropped to 250° C. to set the temperature of the quartz substrate 701 to 200° C. $SiH_4$ and $H_2$ were fed at flow rates of 60 sccm and 600 sccm, respectively, into the plasma film forming chamber 721, and the vacuum exhaust system was operated so as for the pressure in the plasma film forming chamber 721 to be adjusted to 0.5 Torr. A current with a high frequency of 13.56 MHz and 60 W generated in the high-frequency power source was applied to the counter electrode while making adjustment of the matching box, to generate plasma in the space between the substrate holder and the counter electrode. The gases fed in were decomposed with the plasma to deposit an amorphous silicon (a-Si) film 737 in a thickness of 1.5 µm as shown in FIG. 33C. After the film was formed, the gas supply was stopped, and the inside of the plasma film forming chamber 721 was evacuated to a pressure of $10^{-7}$ Torr or less. Next, SiH$_4$, H$_2$ and H$_2$-diluted 100 ppm PH$_3$ were fed at flow rates of 3 sccm, 30 sccm and 400 sccm, respectively, into the plasma film forming chamber 721, and the vacuum exhaust system was operated so as for the pressure in the plasma film forming chamber 721 to be adjusted to 0.5 Torr. A current with a high frequency of 13.56 MHz and 300 W generated in the high-frequency power source was applied to the counter electrode while making adjustment of the matching box, to generate plasma in the space between the substrate holder and the counter electrode. The gases fed in were decomposed with the plasma to deposit an n$^+$a-Si film 738 in a thickness of 2,000 Å as shown in FIG. 33C. After the film was formed, the gas supply was stopped, and the vacuum exhaust system was operated to evacuate the inside of the plasma film forming chamber 721 to a pressure of $10^{-7}$ Torr or less.

Figure 33D:
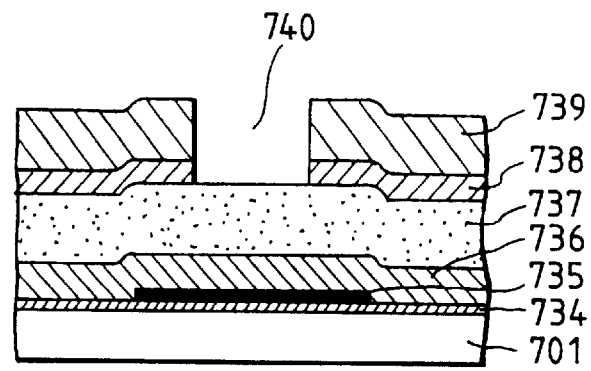

Next, the gate valve 704b was opened. The quartz substrate 701 was led into the latent image forming chamber 707 by means of the transport assembly 724, and was placed on the substrate holder 706b. Then the gate valve 704b was closed. The inside of the latent image forming chamber 707 was evacuated to a pressure of $10^{-7}$ Torr or less by means of the vacuum exhaust system 703b. In the same way as in Example 19, a latent image was formed on the n$^+$a-Si film 738. The gate valve 704b was opened and the quartz substrate 701 was taken out by means of the transport assembly 724. Then the gate valve 704b was closed, and the latent image forming chamber 707 was evacuated so as for its inside pressure to be kept at $10^{-7}$ Torr or less. The vacuum exhaust system 703c was operated to previously evacuate the inside of the Al selective deposition chamber 713 to a pressure of $10^{-7}$ Torr or less. The gate valve 704c was opened. The quartz substrate 701 was led into the Al selective deposition chamber 713 by means of the transport assembly 724 and was placed on the substrate holder 706c. Then the gate valve 704c was closed. The vacuum exhaust system 703c was operated to evacuate the inside of the Al selective deposition chamber 713 to a pressure of $10^{-8}$ Torr or less. In the same way as in Example 19, an Al upper electrode 739 with a thickness of 6,000 Å was formed as shown in FIG. 33D. The gate valve 704c was opened, and the quartz substrate 701 was taken out by means of the transport assembly 724. Then the gate valve 704c was closed. The Al selective deposition chamber 713 was evacuated so as for its inside pressure to be kept at $10^{-7}$ Torr or less.

Next, the vacuum exhaust system was operated to previously evacuate the inside of the etching chamber 722 to a pressure of $10^{-7}$ Torr or less, and the gate valve 704e was opened. The quartz substrate 701 was led into the etching chamber 722 by means of the transport assembly 724, and was placed on the substrate holder. Then the gate valve 704e was closed. The vacuum exhaust system was operated to evacuated the inside of the etching chamber 722 to a pressure of $10^{-7}$ Torr or less. As etching gases, NF$_3$, O$_2$ and H$_2$ were fed at flow rates of 700 sccm, 200 sccm and 100 sccm, respectively, from the gas inlet into the microwave plasma gas exciting device, and the vacuum exhaust system was operated so as for the inside of the etching chamber 722 to be adjusted to 0.25 Torr. Microwaves of 2.45 GHz and 700 W generated in a microwave generator were supplied to the microwave plasma gas exciting device, and the etching gas was made to plasma. Only neutral radicals excited by this plasma were transported to the etching chamber 722 through the transport pipe. Using the Al upper electrode 739 as a mask, the latent image of the oxide film formed on the n$^+$a-Si film 738 was first etched. Next, NF$_3$ and O$_2$ were flowed as etching gases at flow rates of 800 sccm and 200 sccm, respectively, and as shown in FIG. 33D the n$^+$a-Si film 738 was etched to form a light incidence opening 740. After the etching was completed, the etching gas was stopped, and the vacuum exhaust system 703e was operated to evacuate the inside of the etching chamber 722 to a pressure of $10^{-7}$ Torr or less. Then the gate valve 704e was opened, and the quartz substrate 701 was taken out by means of the transport assembly 724. The gate valve 704e was closed, and the inside of the etching chamber 722 was evacuated so as to be kept to a pressure of $10^{-7}$ Torr or less.

Figure 33E:
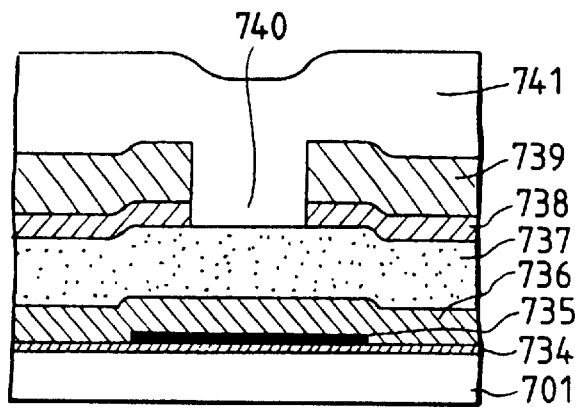

Next, the gate valve 704d was opened. The quartz substrate 701 was led into the plasma film forming chamber 721 by means of the transport assembly 724, and was placed on the substrate holder previously heated to 350° C. with a heater. Then the gate valve 704d was closed. The inside of the plasma film forming chamber 721 was evacuated to a pressure of $10^{-7}$ Torr or less by means of the vacuum exhaust system, and the quartz substrate 701 was heated until its temperature reached 350° C. SiH$_4$, H$_2$ and NH$_3$ were fed at flow rates of 10 sccm, 100 sccm and 300 sccm, respectively, from the gas inlet into the plasma film forming chamber 721, and the vacuum exhaust system was operated so as for the pressure in the plasma film forming chamber 721 to be adjusted to 0.2 Torr. A current with a high frequency of 13.56 MHz and 80 W generated in the high-frequency power source was applied to the counter electrode while making adjustment of the matching box, to generate plasma in the space between the substrate holder and the counter electrode. The gases fed in were decomposed with the plasma to deposit an amorphous silicon nitride (a-SiN) film 741 in a thickness of 2 µm (FIG. 33E). After the film was formed, the gas supply was stopped, and the vacuum exhaust system was operated to evacuate the inside of the plasma film forming chamber 721 to a pressure of $10^{-7}$ Torr or less. The gate valve 704e was opened, and the quartz substrate 701 was taken out by means of the transport assembly 724. The inside of the plasma film forming chamber 721 was evacuated so as for its inside pressure to be kept to $10^{-7}$ Torr or less.

The gate valve 704g was opened, and the quartz substrate 701 was put in the load lock chamber 702 by means of the transport assembly 724. Then the gate valve 704g was closed. N$_2$ gas was fed into the load lock chamber 702 so that the pressure in the chamber was returned to the atmospheric pressure, and then the quartz substrate 701 on which the amorphous silicon photosensor had been fabricated was taken out. Measurement of the performance of the amorphous silicon photosensor thus fabricated in the present example revealed that it had a low internal resistance, a high sensitivity and a less dark current.

The example described above shows the instance in which the selectively depositing metal is aluminum. Without limitation thereto, in the present invention, a metal compound mainly composed of aluminum as exemplified by aluminum silicon that is deposited by reacting DMAH with a silicon-containing gas and hydrogen may also be used as the selectively depositing metal.

Example 22

A still further embodiment of the present invention will be described below with reference to the drawings.

Figure 34:
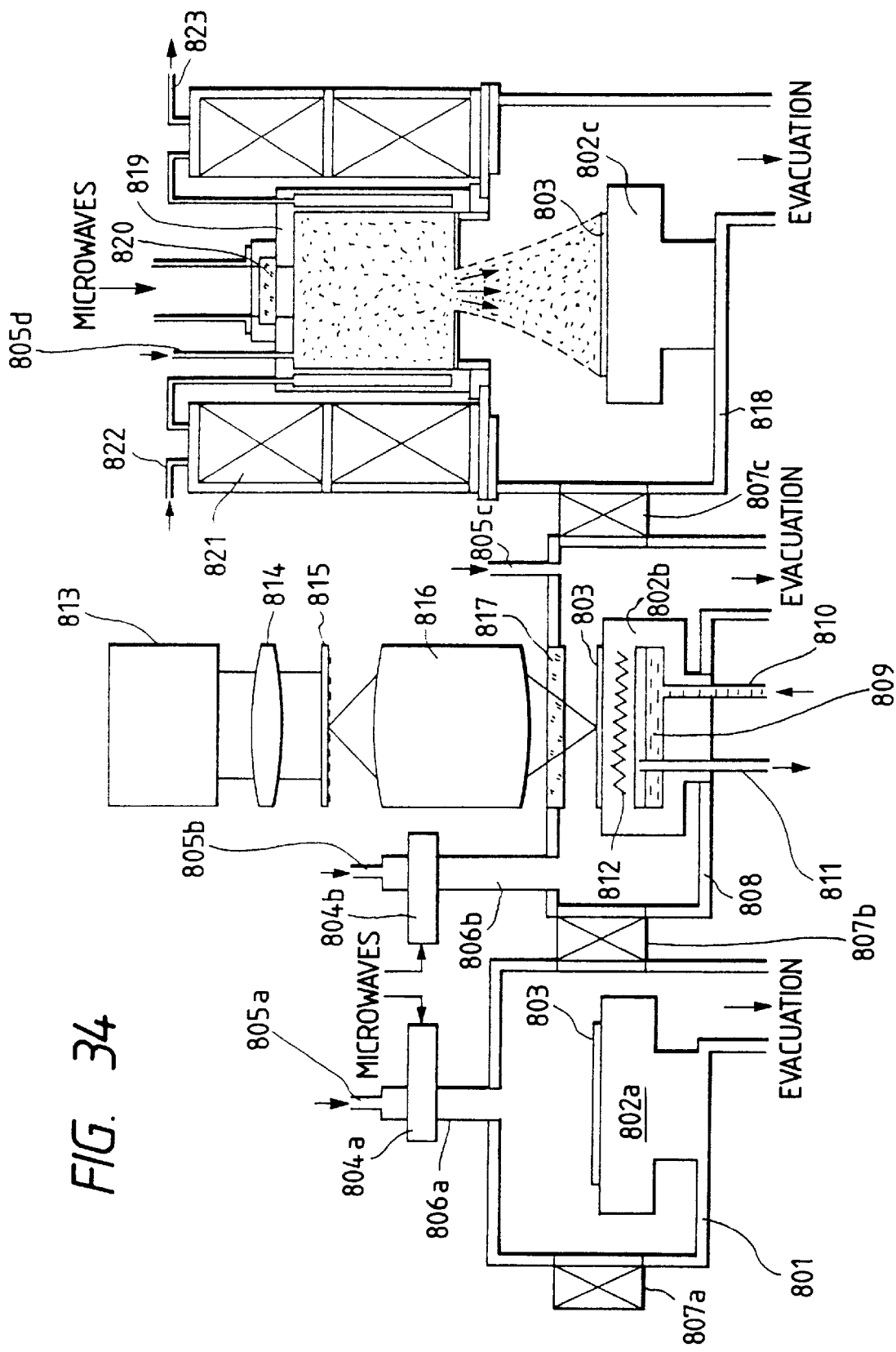
FIG. 34 cross-sectionally illustrates an example of an apparatus for the fine processing of a semiconductor device, according to the present invention.

FIG. 34 illustrates an example of an apparatus for fine-processing a semiconductor device according to the present invention.

The fine-processing apparatus of the present example comprises a vacuum-sealed cleaning chamber 801 in which a sample 803 is cleaned, a latent image forming chamber 808 in which the surface of the sample 803 is modified to form a patterned latent image, and an etching chamber 818 in which the sample 803 is etched.

The cleaning chamber 801 is provided with i) a sample holder 802a on which the sample 803 is placed through a gate valve 807a, and ii) a microwave gas exciting device 804a in which a cleaning gas fed in from a cleaning gas inlet 805 is excited using microwaves generated in a microwave generator (not shown) and from which the gas thus excited is supplied to the cleaning chamber 801 through a transport pipe 806a (total length: 20 cm; inner diameter: 40 mm) made of alumina.

The latent image forming chamber 808 is provided with i) a sample holder 802b on which the sample 803 transferred from the cleaning chamber 801 through a gate valve 807b without its exposure to the atmosphere is placed and which has a temperature control mechanism described later, ii) latent image forming gas inlets 805b and 805c from which a latent image forming gas serving as a modifying gas is fed in, and iii) a microwave gas exciting device 804b that excites the latent image forming gas fed in from the latent image forming gas inlet 805b and supplies the excited gas to the latent image forming chamber 808 through a transport pipe 806b (total length: 20 cm; inner diameter: 40 mm) made of alumina. This chamber 808 is also constituted in such a way that a mask 815 (or a reticle) comprising a quartz plate patterned with Cr is uniformly irradiated with light of a KrF excimer laser 813 serving as a light source, through an illumination optical system 814, and a patterned latent image of the mask 815 is formed on the surface of the sample 803 placed on the sample holder 802b, through a projection optical system 816 and a transmission window 817.

The temperature control mechanism provided in the above sample holder 802b is provided with a refrigerant reservoir 809 in which a refrigerant for cooling the sample 803 placed on the sample holder 802b is stored, and a heater 812 that heats the sample 803. The refrigerant reservoir 809 is constituted in such a way that the refrigerant is supplied from a refrigerant feed inlet communicating with the refrigerant reservoir 809 and the refrigerant having been evaporated in the refrigerant reservoir 809 is discharged outside through a gas vent pipe 811 similarly communicating with the refrigerant reservoir 809.

The etching chamber 818 is provided with a sample holder 802c on which the sample 803 transferred from the latent image forming chamber 808 through a gate valve 807c without its exposure to the atmosphere is placed, and is also provided above the sample holder with a plasma chamber 819 in which plasma for etching is generated, and a magnetic coil 821 for producing a magnetic field in the plasma chamber 819.

In the plasma chamber 819, the plasma for etching is generated by the microwave supplied from the microwave generator (not shown) through the microwave transmission window 820, the etching gas fed in from the etching gas inlet 805d and the magnetic field produced by the magnetic coil 821. This plasma chamber 819 and the above magnetic coil 821 are so constituted that they can be cooled with cooling water fed in from a cooling water inlet 822 and flowed out to the cooling water outlet 823.

The fine-processing apparatus used in the present example is also provided with vacuum exhaust systems (not shown) that can evacuate the respective cleaning chamber 801, latent image forming chamber 808 and etching chamber 818 to set their insides to a given pressure.

An instance will be described below in which a sample 803 comprising an Si substrate, an $SiO_2$ film formed thereon with a thickness of 200 Å and an $n^+$poly-Si film formed thereon with a thickness of 3,000 Å is fine-processed using the fine-processing apparatus as described above.

First, the sample 803, Si substrate was transported through the gate valve 807a to the inside of the cleaning chamber 801, and placed on the sample holder 802a. The vacuum exhaust system was operated to previously evacuate the inside of the cleaning chamber 801 to a pressure of $10^{-8}$ Torr or less. From the cleaning gas inlet 805a, a cleaning gas ($NF_3$; 500 sccm) for cleaning the surface of the sample 803 was fed into the microwave gas exciting device 804a, and then the vacuum exhaust system was operated for the pressure in the cleaning chamber 801 to be adjusted to 0.25 Torr. Microwaves of 2.45 GHz and 700 W generated in the microwave generator were also supplied to the microwave gas exciting device 804a to excite the cleaning gas already fed into the microwave gas exciting device 804a. Active species thereby produced, i.e., excited molecules $NF_3^+$, $NF_2^+$, $NF^+$ and $F^+$, were supplied to the cleaning chamber 801 through the transport pipe 806a. In the cleaning chamber 801, the above excited molecules having reached the sample 803, Si substrate, and natural oxide film ($SiO_2$) formed on the surface of the $n^+$poly-Si film reacted with each other to produce a silicon fluoride compound, a volatile substance, so that the natural oxide film ($SiO_2$) formed on the surface of the $n^+$poly-Si film was removed to give a clean surface. This processing was completed in about 20 seconds. After the processing was completed, the supply of the cleaning gas was stopped, and the vacuum exhaust system was operated to evacuate the inside of the cleaning chamber 801 to a pressure of $10^{-8}$ Torr or less.

Next, the latent image forming chamber 808 was previously evacuated to a pressure of $10^{-8}$ Torr or less by means of the vacuum exhaust system. The gate valve 807b was opened and the sample 803, Si substrate, was moved from the cleaning chamber 801 to 1the latent image forming chamber 808, and was placed on the sample holder 802b. After the gate valve 807b was closed, the latent image forming chamber 808 was again evacuated to a pressure of $10^{-8}$ Torr or less. Then, a latent image forming gas $NO_2$ was fed from the latent image forming gas inlet 805c into the latent image forming chamber 808, and the vacuum exhaust system was operated so as for the inside pressure to be adjusted to 1 Torr. Since the temperature at which the saturated vapor pressure of $NO_2$ gas came to be 1 Torr was −50° C., liquefied nitrogen serving as the refrigerant was supplied to the refrigerant reservoir 809, and the temperature of the sample holder 802b was controlled while adjusting the heater 812, to set the temperature of the sample 803, Si substrate, to −50° C.±10° C. Then the $NO_2$ gas was brought into contact for 80 seconds with the $n^+$poly-Si film formed on the Si substrate. In such a state, the $NO_2$ gave a balanced vaporizing and solidifying state on the surface of the $n^+$poly-Si film, and hence the $NO_2$ was absorbed to the $n^+$poly-Si film surface in a good efficiency.

Next, the mask 815 to which the desired pattern had been applied by means of the illumination optical system 814 was uniformly irradiated with laser light with a wavelength of 248 nm radiated from the KrF excimer laser 813, and also a pattern image of the mask 815 was formed on the surface of the sample 803 by means of the projection optical system 816 through the transmission window 817. As a material for the transmission window 817, a quartz plate was used so that the laser light with a wavelength of 248 nm was transmitted without being absorbed therein.

In regard to the sample 803, absorbed $NO_2$ and Si caused photochemical reaction only at the part irradiated with the light on its $n^+$poly-Si film surface on which the pattern images had been formed, and, upon exposure for 2 minutes, an $SiO_2$ film with a thickness of about 30 Å was formed on the $n^+$poly-Si film. Since this reaction did not proceed at the part not irradiated with the light, a negative pattern of this mask was consequently formed on the $n^+$poly-Si film. In other words, the $n^+$poly-Si was modified to $SiO_2$ to form the latent image. Since this reaction took place only at the part irradiated with the light, the $NO_2$ molecules adsorbed to the surface inhibit the reaction of excited molecules with the Si surface even when the excited molecules produced as a result of excitation and decomposition of $NO_2$ in the gaseous phase because of the irradiation light have reached the $n^+$poly-Si film surface. Hence the image pattern formed on the $n^+$poly-Si film surface was by no means blurred.

Subsequently, the sample 803 comprising the $n^+$poly-Si film on the surface of which the $SiO_2$ film was formed to have the desired pattern, was heated with the heater 812 to 150° C. to release the $NO_2$ molecules adsorbed to the $n^+$poly-Si film surface. Then the inside of the latent image forming chamber 808 was evacuated to a pressure of $10^{-8}$ Torr or less.

Next, the vacuum exhaust system was operated to previously evacuate the etching chamber 818 and plasma chamber 819 provided above the etching chamber 818, to a pressure of $10^{-8}$ Torr or less, and then the gate valve 807c was opened. The sample 803 was moved from the latent image forming chamber 808 to the etching chamber 818, and was placed on the sample holder 802c. After the gate valve 807c was closed, the etching chamber 818 was again evacuated to a pressure of $10^{-8}$ Torr or less. Then, from the etching gas inlet 805d, $Cl_2$ was fed as an etching gas at a flow rate of 200 sccm into the plasma chamber 819, and the vacuum exhaust system was operated so as for the inside pressure to be adjusted to $3\times10^{-4}$ Torr. Cooling water was also fed in from the cooling water inlet 822, and the magnetic coil 821 was electrified while cooling the magnetic coil 821 and the plasma chamber 819, to produce a magnetic field in the plasma chamber 819. Microwaves of 2.45 GHz and 300 W generated in the microwave generator were also guided through the wave guide and supplied to the plasma chamber 819 through the microwave transmission window 822. In the plasma chamber 819, the electric field of the microwaves and the magnetic field produced by the magnetic coil accelerated electrons in a good efficiency to cause ionization of neutrons, so that dense argon plasma was generated. Here, the plasma was generated in a better efficiency when the size of the magnetic field generated in the plasma chamber 819 was kept to the size of a magnetic field that caused electronic cyclotron resonance (875 Gauss in the case of 2.45 GHz microwaves). The plasma generated in the plasma chamber 819 was spread from the plasma chamber 819 into the etching chamber 818 along the magnetic line of force, and reached the surface of the sample 803. With this plasma, the uncovered $n^+$poly-Si film was etched for 3 minutes using as a protective film the $SiO_2$ film formed in the latent image forming chamber 808. Since the ratio in etching rate, i.e., selection ratio, of $n^+$poly-Si to $SiO_2$ resulted in about 120, it was possible to etch the $n^+$poly-Si layer without disappearance of the $SiO_2$ layer. Since the gas pressure was as low as $3\times10^{-4}$ Torr, ions reached the $n^+$poly-Si film surface without their bombardment with other particles, so that it was possible to carry out etching in a good anisotropy. Since also the ion energy was 10 or so eV, it was possible to carry out etching with less damage.

When the $SiO_2$ layer serving as the protective layer was formed without cooling the sample 803, Si substrate, in the course of the latent image formation in the latent image forming chamber 808, the $SiO_2$ layer came to have a thickness of 10 Å or less. Thus, in order to etch the $n^+$poly-Si layer without disappearance of the $SiO_2$ layer, the selectivity ratio was required to be 300 or more, and it was actually impossible to do so.

In the present example, the cleaning of the sample 803, carried out in the cleaning chamber 801, was effected by exciting microwaves using the microwave gas exciting device 804a. It was also possible to carry out it using plasma.

Figure 35:
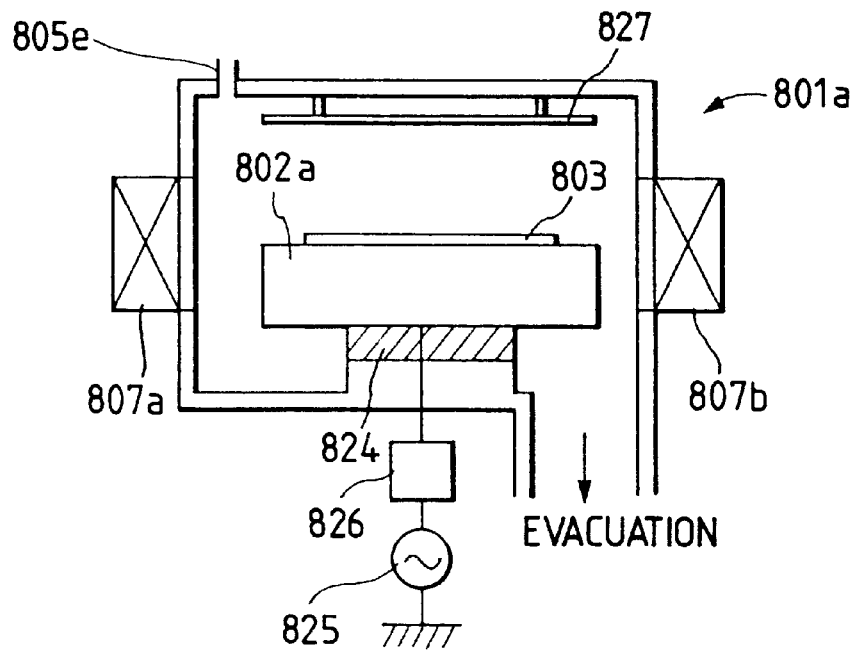
FIG. 35 cross-sectionally illustrates another example of the cleaning chamber.

FIG. 35 illustrates the constitution of a cleaning chamber 801a used when the sample 803 is cleaned using plasma.

The cleaning chamber 801a shown in FIG. 35 comprises a cleaning gas inlet 805e from which a cleaning gas is fed into the chamber. In its inside, a counter electrode 827 is provided opposingly to a sample holder 802a. A high-frequency power source 825 that applies a high-frequency current to the sample holder 802a is also equipped via a matching box. The sample holder 802a is also provided with an insulator 824 that insulates the matching box 826 and the high-frequency power source 825 in the direction of direct currents. In FIG. 35, the same components as those of the cleaning chamber 801 shown in FIG. 34 are denoted by the same reference numerals.

In this example, a vacuum exhaust system (not shown) was operated to keep the inside of the cleaning chamber 801a evacuated to a pressure of $10^{-8}$ Torr or less, and the above sample 803 was placed on the sample holder 802a through the gate valve 807a. Then the cleaning gas (Ar; 50 sccm) for cleaning the surface of the sample 803 was fed from the cleaning gas inlet 805e into the cleaning chamber 801a, and the vacuum exhaust system was operated so as for the pressure in the chamber to be adjusted to 0.08 Torr. Next, a high-frequency current of 13.56 MHz and 100 W was applied from the high-frequency power source 825 to the sample holder 802a while controlling the matching box 826, to generate plasma in the space between the sample holder 802a and the counter electrode 827. Since the sample holder 802a was insulated in the direction of direct currents, a negative DC bias voltage of about −60 kV was generated at the sample holder 802a because of the difference in mobility between electrons and ions. Because of this voltage, Ar ions were accelerated and they collided against the surface of the $n^+$poly-Si film, so that the stain and natural oxide film present on the surface were physically removed by sputtering and thus a cleaned surface was obtained. The processing time was about 60 seconds. After this processing was completed, the supply of the cleaning gas was stopped, and the inside of the cleaning chamber 801a was evacuated to a pressure of $10^{-8}$ or less. This step was followed by the same procedure as previously described, so that it was possible to form the latent image and carry out the etching.

In the latent image forming chamber 808 of the present example, $NO_2$ was used as the latent image forming gas. It was also possible to use excited ozone as the latent image forming gas.

The instance where the ozone was used as the latent image forming gas will be described below.

First, oxygen gas was fed from a latent image forming gas inlet 805*b* through the microwave gas exciting device 804*b* into the latent image forming chamber 808, and a vacuum exhaust system (not shown) was operated so as for the pressure in the latent image forming chamber 808 to be adjusted to 1 Torr. Since the temperature at which the saturated vapor pressure of ozone came to be 1 Torr was −170° C., liquefied nitrogen serving as the refrigerant was supplied to the refrigerant reservoir 809, and the temperature of the sample holder 802*b* was controlled while adjusting the heater 812, to set the temperature of the sample 803 Si substrate to −170° C. ±10° C. Next, microwaves were supplied to the microwave gas exciting device 804*b* to generate oxygen plasma, thereby exciting the ozone. The ozone thus excited was fed to the latent image forming chamber 808 through the transport pipe 806*b* and adsorbed for 80 seconds on the surface of the n⁺poly-Si film formed on the Si substrate. Since at an ultra-low temperature of about −170° C. the ozone gave a balanced vaporizing and solidifying state on the surface of the n⁺poly-Si film, the ozone was absorbed to the n⁺poly-Si film surface in a good efficiency. Since the saturated vapor pressure of oxygen at this temperature was 1,500 mmHg, the amount of adsorption was smaller than that of ozone and hence the adsorbed substance was comprised of ozone in a greater part.

Thereafter, in the same way as previously described, a pattern image of the mask 815 was formed on the surface of the sample 803 using the light from the KrF excimer laser 813, so that it was possible to form an $SiO_2$ layer after the pattern image.

In the latent image forming chamber 808 described above, a KrF excimer laser was used as the light source. It was also possible to obtain the same effect using a lamp light source such as a xenon lamp or a high-pressure mercury lamp, or an ultraviolet laser such as an ArF excimer laser, an XeCl excimer layer or an Ar⁺ laser.

In regard to the etching chamber 818 described above, an example was shown in which etching completely free from damage was carried out using microwave plasma. As another example thereof, it was also possible to use chemical dry etching although it was considered probable that its fine-processing performance was poorer than the case the microwave plasma was used.

Figure 36:
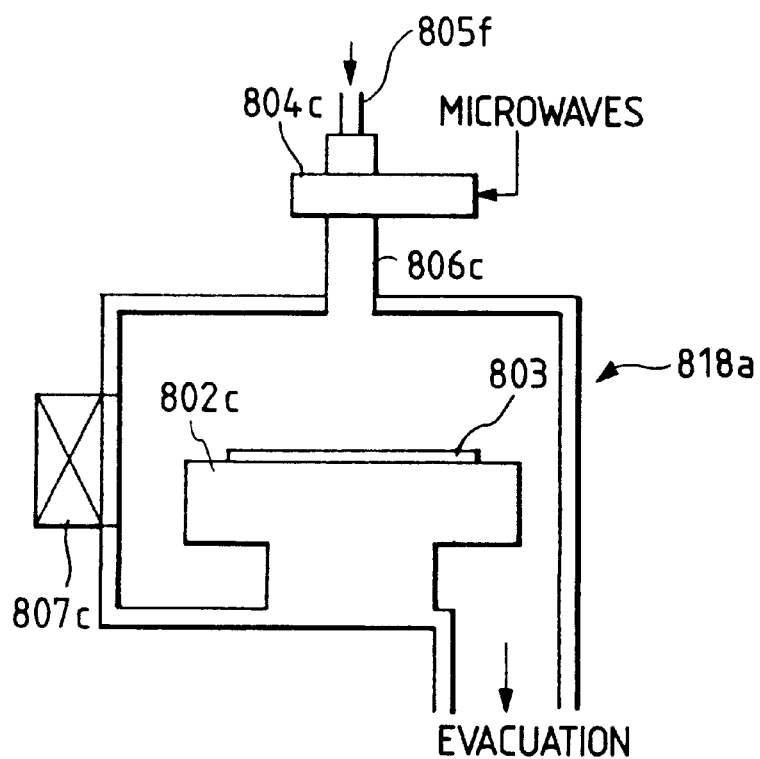
FIG. 36 cross-sectionally illustrates another example of the etching chamber.

FIG. 36 illustrates the constitution of an etching chamber 818*a* in the case when the chemical dry etching was used.

This etching chamber 818*a* is equipped with a microwave gas exciting device 804*c* that excites an etching gas fed in the chamber from an etching gas inlet 805*f*, by means of a microwave generator (not shown). The etching gas excited using the microwave gas exciting device 804*c* is supplied into the etching chamber 818*a* through a transport pipe 806*c* (total length: 20 cm; inner diameter: 40 mm) made of alumina. As to other constitution, the same components as those in FIG. 34 are denoted by the same reference numerals.

In the case when the etching is carried out using this etching chamber 818*a*, a vacuum exhaust system (not shown) was operated to previously evacuate the inside of the etching chamber 818*a* to a pressure of $10^{-8}$ Torr or less. Then the gate valve 807*c* was opened, and, in the same way as previously described, the sample 803 comprising an Si substrate having an n⁺poly-Si film on which the desired pattern had been applied (i.e., the $SiO_2$ film) was placed on a sample holder 802*c* provided in the etching chamber 818*a*. After the gate valve 807*c* was closed, the etching chamber 818*a* was again evacuated to a pressure of $10^{-8}$ Torr or less. Then an etching gas ($Cl_2$; 500 sccm) was fed from the etching gas inlet 805*f* into the microwave gas exciting device 804*c* and at the same time the vacuum exhaust system was operated so as for the pressure in the etching chamber 818*a* to be adjusted to 0.25 Torr.

In this state, microwaves of 2.45 GHz and 700 W generated in the microwave generator were supplied to the microwave gas exciting device 804*c* to excite the etching gas ($Cl_2$; 500 sccm) already fed from the etching gas inlet 805*f* into the chamber. Excited molecules $Cl_2^+$ and $Cl^+$ were supplied to the etching chamber 818*a* through the transport pipe 806*c*. At this time, the excited molecules $Cl_2^+$ and $Cl^+$ having reached the Si substrate reacted with the n⁺poly-Si masked with the latent image patterned $SiO_2$ layer formed on the surface of the n⁺poly-Si film, so that a silicon chloride compound, a volatile substance, was produced and the n⁺poly-Si layer was etched after the desired latent image pattern.

Figure 37:
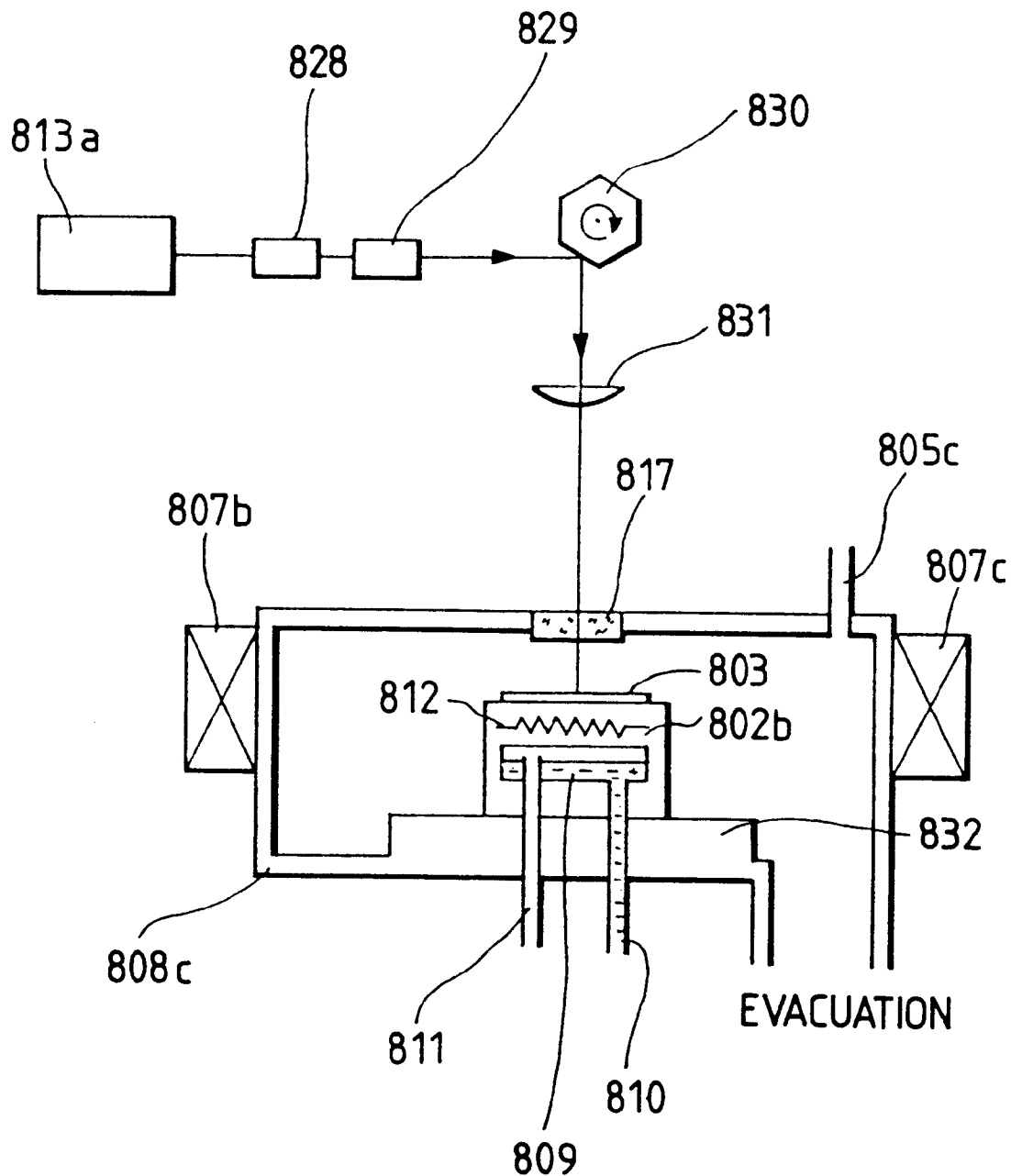
FIG. 37 cross-sectionally illustrates another example of the latent image forming chamber.

As the method for the selective irradiation with light in the latent image forming chamber, besides the method making use of the mask as in the method shown in FIG. 34, it was also possible to effect the selective irradiation by a direct drawing method making use of laser light shown in FIG. 37.

FIG. 37 illustrates a latent image forming chamber of the direct drawing type making use of laser light. In the drawing, reference numeral 808*a* denotes a latent image forming chamber; 813*a*, an Ar⁺ ion laser serving as a light source; 828, an optical modulator; and 829, a collimater lens. Reference numeral 830 denotes a rotary polyhedral mirror; 831, an f-θ lens; 832, an X stage that can move a sample holder 802*b* in the laser-light scanning direction and the vertical direction. Other components indicated by the same reference numerals as those shown in FIG. 34 denote the same components.

An example will be shown below in which a latent image is formed on the sample 803 Si substrate in the same way as in the example previously described, by the use of the direct drawing method.

Similar to the case previously described, the n⁺poly-Si surface of the sample 803 was cleaned, and the sample 803 was placed on the sample holder 802*b* in the latent image forming chamber 808 having been already evacuated to a pressure of $10^{-8}$ Torr or less. Subsequently, a latent image forming gas $NO_2$ was fed into the chamber, and the sample 803 was cooled. Next, laser light radiated from a light source Ar⁺ ion laser 813*a* was so modulated in the optical modulator 828 as to enable formation of the desired pattern, and scanned in the unidimensional direction by means of the collimater lens and the polyhedral mirror 830. Thereafter, an image was formed on the surface of the sample 803 through the f-θ lens and the transmission window 817. The sample holder 802*b* was also moved using the X stage 832 in the laser-light scanning direction and the vertical direction, whereby it was possible to irradiate the whole sample surface with the light. Any lasers can be used as the light source laser so long as they can cause photochemical reaction on the surface. The light source used in forming the latent image of the oxide film on a GaAs substrate may include, besides the lasers previously described, an Ar laser, a krypton laser and a He—Cd laser.

At the part of the $n^+$poly-Si surface irradiated with light in the above way, photochemical reaction with absorbed $NO_2$ took place to form a latent image comprised of $SiO_2$. Thereafter, it was possible to carry out etching in the same way as in the example previously described.

Example 23

Another example of the present invention will be described below giving an example in which an Al electrode pattern is formed on a quartz substrate.

First, on a quartz substrate as the sample 803, Al was deposited by sputtering in a thickness of 1,500 Å. The surface of the Al film of the sample 803 was cleaned with Ar ions using the aforesaid cleaning chamber 801a as shown in FIG. 35.

Subsequently, the sample 803 thus cleaned was moved to the latent image forming chamber 808 and was placed on the sample holder 802b in the same way as in the example previously described. Then, ammonia gas $NH_3$ was fed from the latent image forming gas inlet 805c into the latent image forming chamber 808, and the vacuum exhaust system (not shown) was operated so as for the pressure in the inside to be adjusted to 1 Torr. Here, since the temperature at which the saturated vapor pressure of $NH_3$ gas came to be 1 Torr was $-103°$ C., liquefied nitrogen serving as the refrigerant was supplied to the refrigerant reservoir 809, and the temperature of the sample holder 802b was controlled while adjusting the heater 812, to set the temperature of the sample 803 to $-103°$ C.$\pm 10°$ C. Then $NH_3$ was adsorbed for 100 seconds on the Al film surface of the sample 803. Next, the mask 815 to which the desired patterning had been applied by means of the illumination optical system 814 was uniformly irradiated with laser light with a wavelength of 248 nm radiated from the KrF excimer laser 813, and the resulting pattern image was formed on the Al film surface of the sample 803 through the transmission window 817 by means of the projection optical system 816. On the surface on which the pattern image was thus formed, adsorbed $NH_3$ and Al caused photochemical reaction only at the part irradiated with the light, and upon exposure for 2 minutes an AlN film with a thickness of about 50 $\mu$m was formed on the Al film surface. Since this reaction did not proceed at the part not irradiated with the light, a negative pattern of this mask was consequently formed on the Al film surface of the sample 803.

The sample 803 comprising the Al film on the surface of which the AlN layer was formed to have the desired pattern, was heated with the heater 812 to $150°$ C. for 3 minutes to release the molecules adsorbed to the Al film surface. Then the inside of the latent image forming chamber 808 was evacuated to a pressure of $10^{-8}$ Torr or less.

Next, the vacuum exhaust system (not shown) was operated to previously evacuate the etching chamber 818 and plasma chamber 819 as shown in FIG. 34 previously set out, to a pressure of $10^{-8}$ Torr or less, and the gate valve 807c was opened. The sample 803 was moved from the latent image forming chamber 808 to the etching chamber 818, and was placed on the sample holder 802c. After the gate valve 807c was closed, the etching chamber 818 was again evacuated to a pressure of $10^{-8}$ Torr or less. Then, from the etching gas inlet 805d, an etching gas ($Cl_2$; 20 sccm) was fed into the plasma chamber 819, and the vacuum exhaust system was operated so as for the inside pressure to be adjusted to $3 \times 10^{-4}$ Torr. In this state, a magnetic field of 875 Gauss was produced in the plasma chamber 819 by means of the magnetic coil 821 and at the same time microwaves of 2.45 GHz and 300 W were supplied from a microwave generator (not shown) to the plasma chamber 819 to produce plasma. Then the plasma thus produced was supplied onto the sample 803 put in the etching chamber 818 to carry out etching for 90 seconds. As a result, it was possible to form on the sample 803 quartz substrate, an Al electrode with a negative pattern of the mask 815.

The present invention, which is constituted as described above has the following effects.

That is, in the processing method of the present invention, the physical damage is previously given to the film before the third step of forming the mask pattern, whereby the mask pattern can be made thick and also a dense device structure can be obtained. This brings about an improvement in etching inhibitory power and hence can improve fine-processing performance in the photoetching. In addition, since the process can be simplified, devices can be fabricated rapidly.

It is also possible to prevent deterioration of devices and adhesion of dust, and hence the yield can also be improved in addition to the above effect.

Formation of a plurality of protective films can bring about a sufficiently large total layer thickness, and hence the fine processing with a sufficient etching depth can be applied.

The annealing of the surface-modified layer serving as a protective film (a mask) in etching makes it possible to form a protective film made stabler and stronger, and having a higher etching resistance. As a result, it becomes possible to obtain the desired amount (depth) of etching of the film to which the fine processing should be applied.

Needless to say, the same effect can also be obtained when the annealing is carried out using electron rays or lamps.

The heating of the film to which surface modification is applied, in the step of forming the surface-modified layer, accelerates photochemical reaction on the surface irradiated with light, and hence the surface-modified layer can have a chemically stronger bond and also have a larger thickness. This can achieve i) an improvement in etching resistance of the surface-modified layer and ii) an increase in difference in electron donative properties between the surface-modified layer and the surface-unmodified layer. This enables pattern formation with ease.

According to the present invention, the simultaneous irradiation on the substrate with the light that causes vibration of the molecules constituting the surface of the substrate and the light that causes the photochemical reaction accelerates the reaction of the surface with the reactive gas. This makes it possible to process the substrate at a high rate. Since the photochemical reaction can be made to selectively take place on the surface irradiated with the processing light, it is also possible to carry out the desired processing in a good selectivity.

In the step of forming the surface-modified layer, use of the light, as the processing light, that has an energy greater than a binding energy of the compound constituting the substrate surface and is capable of reducing the compound makes it possible to selectively reduce semiconductors or metal compounds that are usually reduced only with difficulty, to form the surface-modified layer. Carrying out the etching using the surface-modified layer as a mask makes it possible to carry out high-speed processing and yet to obtain a nice etched surface. Since the irradiation with light is effected in a high vacuum, it is possible to prevent contamination of the light irradiation window.

The optical latent image film is formed using a synchrotron orbit radiation to cause a change in the electron donative properties on the surface, so that the electrode or wiring comprising Al or a metal mainly composed of Al can be selectively formed. Since no resist is used, the process can be simplified and the dust is less produced, resulting in an improvement in yield, and metal films with a good quality can be formed. It is also possible to carry out vacuum through-processing of semiconductor devices, without exposure to the atmosphere, and hence semiconductor devices with a high performance can be obtained. Since no Al etching step is required, no after-corrosion occurs, bringing about an improvement in the reliability of devices.

The present invention can also be effective on the following:

(1) In the latent image forming chamber, the temperature of the substrate is so controlled that the pressure of the modifying gas reaches the saturated vapor pressure, whereby the modifying gas molecules can be adsorbed on the substrate surface in a good efficiency. Hence, the surface-modified layer formed on the substrate surface can be made thick to bring about a high effect of protection when etching is carried out.

(2) When surface-modified layer is formed on the substrate surface after the pattern of a circuit, the modifying gas molecules adsorbed on the substrate inhibit the substrate surface from reacting with the modifying gas molecules present in an excited state, even in the case where the modifying gas molecules in an excited state generated as a result of the gaseous phase reaction of light with the modifying gas have reached the substrate surface having been not irradiated with the light. Hence, the surface-modified layer formed after the circuit pattern is no longer blurred, and it becomes possible to carry out fine processing at a high-speed and accuracy.

(3) According to the apparatus for fine-processing semiconductor devices, the substrate can be moved from the latent image forming chamber to the etching chamber through the gate valve. Hence, no dust can be adhered to the substrate surface, and the accuracy in the pattern formation can be improved. In addition, the latent image forming chamber is connected with the cleaning chamber similarly through the gate valve, so that the substrate is cleaned before the surface-modified layer is formed on the substrate. This can bring about a great effect.

Needless to say, the respective processing methods and apparatus described giving examples can be used in combination within the purport of the present invention, and also can be modified within the purport of the present invention.

We claim:

1. A processing method comprising the steps of:
   subjecting a surface of a substrate to selective irradiation with a light in a gas atmosphere comprising oxygen or nitrogen to cause a photochemical modification of the surface of the substrate to form a surface-modified layer;
   subjecting the surface of the substrate having the surface-modified layer formed thereon to annealing to stabilize and make more etch-resistant the surface-modified layer; and
   subjecting both the stabilized surface-modified layer and a non-modified portion of the substrate to dry etching thereby utilizing the higher resistance to said dry etching of the stabilized surface-modified layer compared to the non-modified portion, to selectively etch the non-modified portion to a desired depth.

2. The processing method according to claim 1, wherein the annealing is conducted by heating by electromagnetic wave irradiation.

3. The processing method according to claim 2, wherein the heating is conducted by electromagnetic wave irradiation provided by a laser or lamp.

4. The processing method according to claim 1, further comprising a step of subjecting the surface-modified layer to selective irradiation with a second light to effect the annealing.

5. The processing method according to claim 4, wherein the irradiation with the second light is conducted using a laser or lamp.

6. The processing method according to claim 1, wherein the surface of the substrate comprises aluminum.

7. The processing method according to claim 1, wherein the surface of the substrate comprises silicon.

8. The processing method according to claim 1, wherein the annealing stabilizes the surface-modified layer by increasing grain size or crystallization in solid phase.

9. The processing method according to claim 1, wherein the surface of the substrate comprises an amorphous silicon film containing hydrogen.

10. The processing method according to claim 9 in which the selective irradiation with light forms a pattern of silicon oxide to provide the surface-modified layer and wherein the annealing removes hydrogen atoms in the silicon oxide to stabilize the surface-modified layer.

11. The processing method according to claim 1, further comprising, prior to the step of subjecting a surface of a substrate to selective irradiation, a step of:
   exposing to a low pressure atmosphere comprising a modifying gas comprising oxygen or nitrogen, a substrate having at least a surface thereof cooled to adsorb the modifying gas onto the surface.

12. The processing method according to claim 11, wherein the surface-modified layer is an oxide of the substrate and the oxide is formed by oxidation of the substrate.

13. The processing method according to claim 11, wherein the surface-modified layer is a nitride of the substrate and the nitride is formed by reaction of nitrogen with the substrate.

14. The processing method according to claim 11, wherein the etching is carried out at an etching ratio such that the surface-modified layer is not etched until a predetermined depth of etching of the non-modified surface portion is completed.

15. The processing method according to claim 11, comprising a step of cleaning the surface of the substrate prior to exposing the substrate to the modifying gas.

16. The processing method according to claim 11, wherein the surface of the substrate is maintained near the temperature at which a pressure of the modifying gas reaches a saturated vapor pressure.

17. The processing method according to claim 11, wherein the surface is cooled to a temperature between about 0° C. and about −170° C.

18. The processing method according to claim 11, wherein the atmosphere comprising oxygen comprises nitrogen oxide.

19. The processing method according to claim 11, wherein the atmosphere comprising nitrogen comprises ammonia.

20. The processing method according to claim 11, wherein the substrate comprises silicon atoms at the surface thereof.

21. The processing method according to claim 11, wherein the substrate comprises poly Si.

22. The processing method according to claim 11, wherein the substrate comprises aluminum atoms at the surface thereof.

23. The processing method according to claim 11, wherein the substrate comprises aluminum.

24. The processing method according to claim 1, wherein the annealing is conducted by heating employing a heater.

25. The processing method according to claim 2, wherein the light and the electromagnetic wave are laser lights different from each other.

26. The processing method according to claim 25, wherein the light is from a KrF laser, and wherein the electromagnetic wave is from a YAG laser or $F_2$ laser.

27. The processing method according to claim 2, wherein the electromagnetic wave is selectively absorbed by the surface-modified layer.

* * * * *

UNITED STATES PATENT AND TRADEMARK OFFICE
CERTIFICATE OF CORRECTION

PATENT NO.    : 6,025,115
DATED         : February 15, 2000
INVENTOR(S)   : TOSHIYUKI KOMATSU ET AL.

It is certified that error appears in the above-identified patent and that said Letters Patent is hereby corrected as shown below:

COLUMN 8:

Line 3, "illustrate" should read --illustrates--.

COLUMN 10:

Line 29, "well" should be deleted; and
Line 30, "well" should be deleted.

COLUMN 18:

Line 30, "very" should be deleted.

COLUMN 19:

Line 32, "lager" should read --larger--.

COLUMN 25:

Line 17, "so as" should be deleted;
Line 46, "sh" should be deleted;
Line 47, "ow n" should read --shown--; and
Line 57, "an d" should read --and--.

COLUMN 36:

Line 60, "i n" should read --in--.

UNITED STATES PATENT AND TRADEMARK OFFICE
CERTIFICATE OF CORRECTION

PATENT NO. : 6,025,115
DATED : February 15, 2000
INVENTOR(S) : TOSHIYUKI KOMATSU ET AL.

It is certified that error appears in the above-identified patent and that said Letters Patent is hereby corrected as shown below:

COLUMN 37:

Line 21, "tow-" should read --two---.

COLUMN 38:

Line 57, "adjoiningly" should read --adjoining--.

COLUMN 39:

Line 25, "evacuated" should read --evacuate--.

COLUMN 41:

Line 41, "hours." should read --hour.--

COLUMN 43:

Line 52, "No" should read --no--.

COLUMN 47:

Line 67, "evacuated" should read --evacuate--.

UNITED STATES PATENT AND TRADEMARK OFFICE
CERTIFICATE OF CORRECTION

PATENT NO.   : 6,025,115

DATED        : February 15, 2000

INVENTOR(S)  : TOSHIYUKI KOMATSU ET AL.

It is certified that error appears in the above-identified patent and that said Letters Patent is hereby corrected as shown below:

COLUMN 50:

Line 52, "1the" should read --the--.

Signed and Sealed this

Twenty-fourth Day of April, 2001

Attest:

NICHOLAS P. GODICI

Attesting Officer   Acting Director of the United States Patent and Trademark Office